(12) United States Patent  (10) Patent No.: US 6,662,438 B2
Suhara et al.  (45) Date of Patent: Dec. 16, 2003

(54) ELECTRIC-COMPONENT MOUNTING APPARATUS

(75) Inventors: Shinsuke Suhara, Kariya (JP); Takehisa Ishikawa, Toyota (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 43 days.

(21) Appl. No.: 09/863,357

(22) Filed: May 24, 2001

(65) Prior Publication Data

US 2002/0053133 A1 May 9, 2002

(30) Foreign Application Priority Data

Jun. 1, 2000 (JP) ........................................ 2000-164959

(51) Int. Cl.⁷ ............................................... B23P 19/00
(52) U.S. Cl. ............................. 29/743; 29/741; 29/740; 29/739; 29/721; 29/DIG. 44; 414/737
(58) Field of Search .................... 29/743, 740, 741, 29/742, 759, 760, 832, 33 M, DIG. 44; 294/68.2, 68.1; 414/225.01, 222.01, 737

(56) References Cited

U.S. PATENT DOCUMENTS

| 4,858,308 | A | * | 8/1989 | Komori ........................ 29/740 |
| 5,033,185 | A |   | 7/1991 | Hidese |
| 5,628,107 | A | * | 5/1997 | Nushiyama et al. .......... 29/740 |
| 5,926,950 | A | * | 7/1999 | Asai et al. ...................... 29/832 |
| 6,076,394 | A | * | 6/2000 | Tsuda et al. .................... 73/37 |
| 6,152,283 | A |   | 11/2000 | Kondo et al. |
| 6,161,277 | A | * | 12/2000 | Asai et al. ..................... 29/740 |
| 6,507,997 | B2 | * | 1/2003 | Kawai et al. ................. 29/833 |
| 2002/0053133 | A1 | * | 5/2002 | Suhara et al. ................ 29/700 |

FOREIGN PATENT DOCUMENTS

| EP | 0 617 574 A | 9/1994 |
| JP | 6-342998 A | 12/1994 |
| JP | 7-9381 A | 3/1995 |
| JP | 10-126097 A | 5/1998 |
| JP | 10-163677 A | 6/1998 |
| JP | 10-224099 A | 8/1998 |
| JP | 11-20933 A | 1/1999 |
| JP | 2001-111298 | * 4/2001 |

* cited by examiner

*Primary Examiner*—Carl J. Arbes
*Assistant Examiner*—Minh Trinh
(74) *Attorney, Agent, or Firm*—Oliff & Berridge, PLC

(57) ABSTRACT

An apparatus for mounting one or more electric components on a circuit substrate, the apparatus including a nozzle moving device which moves a suction nozzle having an end surface that applies a suction to an electric component and thereby holds the component, in a direction intersecting an axis line of the suction nozzle, and an elevating and lowering device which elevates and lowers the suction nozzle so that the suction nozzle performs at least one of sucking and holding the electric component and mounting the component on the circuit substrate, the elevating and lowering device including a movable member, and a connecting device which connects the movable member to the suction nozzle such that the suction nozzle continues moving while the movable member continues moving, the connecting device including a downward-movement control device which changes, while the apparatus performs an electric-component mounting operation, at least one of a position of an end of a downward movement of the suction nozzle caused by the elevating and lowering device and a position where a deceleration of the downward movement of the nozzle is started.

19 Claims, 24 Drawing Sheets

ELECTRIC-COMPONENT MOUNTING APPARATUS

BACKGROUND OF THE INVENTION

1. Field of the Invention

The present invention relates to an electric-component (EC) mounting apparatus, and particularly to the art of controlling the upward and downward movements of a suction nozzle which sucks and holds an EC, in particular, an electronic component.

2. Discussion of Related Art

Japanese Patent Document No. 7-9381 discloses an EC mounting apparatus which includes a plurality of suction nozzles and an elevating and lowering device which elevates and lowers each of the suction nozzles to receive an EC from an EC supplying device and mounts the EC on a printed wiring board (PWB). This EC mounting apparatus additionally includes an index table which is rotatable about a vertical axis line and a plurality of EC mounting heads which are provided on the index table such that the EC mounting heads are equiangularly spaced from each other about the axis line. The index table is intermittently rotated, by an intermittently rotating device including a servomotor as its drive source, at the same angular pitch as that at which the EC mounting heads are spaced from each other, so that the heads are sequentially moved to, and stopped at, a plurality of stop positions including an EC-receive position and an EC-mount position.

Each of the EC mounting heads includes a nozzle holder and a suction nozzle which is held by the nozzle holder such that the suction nozzle is movable in an axial direction thereof, and is not rotatable, relative to the nozzle holder. The nozzle holder is held by the index table such that the holder is movable in an axial direction thereof relative to the table. Each of the EC mounting heads is elevated and lowered by each of two EC-mounting-head elevating and lowering devices which are provided at the EC-receive position and the EC-mount position, respectively, so that the each head receives an EC from the EC supplying device and mounts the EC on the PWB. Each of the EC-mounting-head elevating and lowering devices includes an elevator member and an elevator-member driving device. The elevator-member driving device includes, as its drive source, the servomotor of the intermittently rotating device, and additionally includes a lever which is connected to the elevator member, and a cam device which includes a cam and a cam follower and which converts the rotation of the servomotor into the pivotal motion of the lever, so that the elevator member is elevated and lowered.

In a state in which the elevator member is positioned at its upper-dead or upward-movement-end position, a lower surface of the elevator member is away from an upper surface of the nozzle holder of the EC mounting head being positioned the EC-receive or EC-mount position. Midway during the downward movement of the elevator member, the elevator member contacts the upper surface of the nozzle holder, thereby lowering the nozzle holder so that the suction nozzle sucks and holds an EC. When the elevator member is elevated, the nozzle holder is elevated, owing to the biasing action of a spring, to follow the elevator member. Before the elevator member reaches its upward-movement-end position, the nozzle holder reaches its upward-movement-end position and, in a state in which the elevator member has reached its upward-movement-end position, the elevator member is away from the nozzle holder. Thus, the nozzle holder is elevated or lowered while the holder is in contact with the elevator member but, in the state in which the elevator member is away from the holder, the holder is not elevated or lowered, and accordingly the suction nozzle is not elevated or lowered, even if the elevator member is elevated or lowered.

The length of the elevator member of the EC-mounting-head elevating and lowering device provided at the EC-receive position is adjustable, and accordingly the downward-movement-end position of each suction nozzle and the position where the decreasing of speed of downward movement of the each nozzle is started are changeable. The elevator member extends downward from a portion thereof connected to the lever, and the length of extension of the elevator member from the lever is adjustable by a length adjusting device. Thus, the length of the elevator member is adjustable, and accordingly the distance between the nozzle holder and the elevator member being positioned at its upward-movement-end position is changeable. That is, although the stroke of upward and downward movements of the elevator member is not changeable, the length of a portion of the stroke that is used to elevate and lower the nozzle holder is changeable, and accordingly the stroke of upward and downward movements of the holder is changeable. The upward-movement-end position of the nozzle holder held by the index table is not changeable, but the downward-movement-end position of the holder is changeable with the changing of the stroke thereof. This EC mounting apparatus detects a height position of an upper surface of each EC supplied by the EC supplying device and, if the detected height position is higher than a correct height position, the apparatus decreases the stroke of the nozzle holder and thereby changes the downward-movement-end position of the holder to a higher position. On the other hand, if the detected height position is lower than the correct height position, the apparatus increases the stroke of the nozzle holder and thereby changes the downward-movement-end position of the holder to a lower position. When the downward-movement-end position is changed, the downward-movement-deceleration-start position is also changed. Therefore, even if the height of the EC may have an error, the distance of downward movement of the suction nozzle is never too short or long. In addition, since the suction nozzle contacts the EC at a sufficiently low speed, the nozzle can reliably suck and hold the EC, without failing to hold the same or damaging the same.

SUMMARY OF THE INVENTION

The present invention provides EC mounting apparatus which has the following features. Those features are described, like claims, in respective paragraphs which are given respective numbers. Any feature that includes another feature shall do so by referring to the number given to the latter feature. However, the following features and the appropriate combinations thereof are just examples to which the technical features, and the combinations thereof, described in the specification are by no means limited. In addition, in the case where one feature recites a plurality of items, it is not essentially required that all of those items be simultaneously employed in the one feature. That is, it is possible to select and employ only a portion (one, two, . . . , but not all) of those items.

(1) According to a first feature of the present invention, there is provided an apparatus for mounting at least one electric component supplied by an electric-component supplying device, on a circuit substrate supported by a circuit-substrate supporting device, the apparatus comprising a nozzle moving device which moves a suction nozzle having an end surface that applies a suction to the electric component and thereby holds the component, in a direction intersecting an axis line of the suction nozzle; an elevating and lowering device which elevates and lowers the suction nozzle so that the suction nozzle performs at least one of receiving the electric component from the electric-component supplying device and mounting the component on the circuit substrate on the circuit-substrate supporting device; the elevating and lowering device comprising a movable member, and a connecting device which connects the movable member to the suction nozzle such that the suction nozzle continues moving while the movable member continues moving; and the connecting device comprising a downward-movement control device which changes, while the apparatus performs an electric-component mounting operation, at least one of a position of an end of a downward movement of the suction nozzle caused by the elevating and lowering device and a position where a deceleration of the downward movement of the nozzle is started.

In many cases, the suction nozzle is held by a nozzle holder such that the nozzle can be advanced and retracted relative to the holder. For example, the suction nozzle is held by the nozzle holder such that the nozzle is movable relative to the holder in the axial direction of the nozzle, and is biased by a spring member, such as a compression coil spring, in a direction in which the nozzle is advanced relative to the holder, and the limit of advancement of the nozzle is defined by an advancement-limit defining device. Accordingly, after the nozzle contacts an electric component (EC) supplied by the EC-supplying device or after the EC held by the nozzle contacts a circuit substrate supported by the circuit-substrate supporting device, the nozzle is retracted into the holder while elastically deforming the spring member. Thus, an excessive amount of downward movement of the nozzle holder is absorbed, and the nozzle or the EC is pressed against the EC or the substrate with an appropriate force. The spring member functions as a cushion device. In the case where the cushion device is employed, if the nozzle contacts the EC or if the EC contacts the substrate, then the nozzle is stopped and is not moved downward to a prescribed downward-movement end position, so that the nozzle or the EC is pressed against the EC or the substrate with a force which is substantially proportional to the difference between the prescribed downward-movement end position and the position where the nozzle is actually stopped. Thus, the downward-movement end position recited in the first feature (1) means the above-explained prescribed downward-movement end position, in other words, the position to which the nozzle is to be moved downward unless the nozzle is stopped. On the other hand, in the case where the cushion device is not employed, the respective amounts of downward movement of the nozzle holder and the suction nozzle are equal to each other, and accordingly the nozzle is moved downward to the prescribed downward-movement end position. In the former case where the cushion device is employed, if the nozzle sucks and holds an EC without pressing the EC, the respective amounts of downward movement of the holder and the nozzle are equal to each other. For example, if, when the holder reaches its downward-movement end position, the nozzle just contacts the EC and holds the same without elastically deforming the spring member, or if, when the holder reaches its downward-movement end position, the nozzle is positioned at a small distance from the EC and holds the same without elastically deforming the spring member, then the respective amounts of downward movement of the holder and the nozzle are equal to each other, and the nozzle sucks and holds the EC without pressing the same.

The nozzle moving device may be a positioning device which moves the suction nozzle and stops the nozzle at at least one of an EC-receive position where the nozzle receives an EC from the EC supplying device and an EC-mount position where the nozzle mounts the EC on a circuit substrate supported by the circuit-substrate supporting device; a selecting device which selects, from a plurality of suction nozzles, one suction nozzle which is to be used to receive and mount an EC; or a device which has both the positioning function and the selecting function. In the case where the nozzle moving device positions the suction nozzle relative to the circuit substrate, the nozzle moving device also functions as an EC transferring device which moves the suction nozzle holding the EC and thereby transfers the EC.

While the movable member of the elevating and lowering device is moved, the suction nozzle is moved. In the case where the above-described cushion device is employed, the suction nozzle may not be moved downward to the prescribed downward-movement end position, i.e., may be stopped midway, because the downward movement is hindered by the EC or the circuit substrate. If the downward movement is not hindered, then the suction nozzle would continue moving downward. Thus, it can be said that while the movable member is moved, the suction nozzle is moved.

According to the first feature (1), each portion of the movement of the movable member is used to move the suction nozzle and, while the present EC mounting apparatus performs an EC mounting operation, at least one of the downward-movement end position of the nozzle and the position where the deceleration of the downward movement of the nozzle is started is changed. Therefore, even if there may be an error of a position of an end portion of the nozzle and/or an error of a thickness of an EC, the present apparatus can appropriately control at least one of receiving the EC or mounting the EC. For example, if the downward-movement end position of the nozzle is changed, then a shortage or an excessiveness of amount of downward movement of the nozzle can be avoided, and accordingly an EC can be sucked and held by the nozzle while a failure to hold the EC or braking the EC is avoided, or an EC can be mounted on a circuit substrate while a failure to mount the EC or damaging the EC is avoided. Even if the nozzle may have a nominal-dimension difference, a manufacturing error, and/or wearing, the present apparatus can accurately control the nozzle to suck and hold an EC while applying an appropriate pressing force to the EC, or while just contacting the EC with a pressing force substantially equal to zero, or while having a prescribed distance to the EC.

(2) According to a second feature of the present invention that includes the first feature (1), the nozzle moving device stops the suction nozzle at a prescribed position, and the elevating and lowering device is provided in a vicinity of the prescribed position and lowers, at at least the prescribed position, the suction nozzle to the position of the end of the downward movement thereof.

The elevating and lowering device may be one which elevates and lowers the suction nozzle after the nozzle reaches, and stops at, a stop position, or one which starts elevating or lowering the nozzle before the nozzle reaches a stop position.

According to the second feature (2), the suction nozzle is moved relative to the elevating and lowering device. For example, in the case where the nozzle moving device positions the nozzle at at least one of the EC-receive position and the EC-mount position, the elevating and lowering device is provided in the vicinity of the one of the EC-receive position and the EC-mount position. In the case where the nozzle moving device selects, from a plurality of suction nozzles, one suction nozzle, moves the one nozzle, and positions the one nozzle at an operative position where the one nozzle is used to receive and mount an EC, the elevating and lowering device is provided in the vicinity of the operative position. In either case, the elevating and lowering device may be commonly used for a plurality of suction nozzles, and accordingly it is often needed to change at least one of the downward-movement end position and downward-movement-deceleration-start position of each nozzle, to compensate for differences of respective nominal dimensions of the nozzles and/or errors of respective lengths of the nozzles resulting from a manufacturing error or wearing of each of the nozzles. Thus, according to the second feature (2), the present invention is very effective. In addition, since the suction nozzle is moved relative to the elevating and lowering device, it is needed to operate the elevating and lowering device and thereby elevate and lower the nozzle, in a good timed relation with the movement and stopping of the nozzle. To this end, the fourth feature (4) is very effective.

(3) According to a third feature of the present invention that includes the second feature (2), the nozzle moving device comprises a nozzle revolving device which revolves the suction nozzle about an axis line and stops the nozzle at a prescribed stop position on a locus of revolution thereof.

The axis line of revolution may be a vertical axis line or may be an axis line inclined relative to a vertical plane.

The nozzle revolving device may be one which intermittently revolves the suction nozzle at a prescribed regular angular pitch, or one which revolves the nozzle by an arbitrary angle. Otherwise, the nozzle revolving device may be one which revolves the nozzle in one direction only, or one which revolves the nozzle in each of opposite directions.

(4) According to a fourth feature of the present invention that includes any one of the first to third features (1) to (3), the apparatus further comprises a common drive source which commonly drives the nozzle moving device and the elevating and lowering device.

In the case where the elevating and lowering device includes an exclusive drive source, the downward-movement end position, or the like, of the suction nozzle can be considerably easily controlled by controlling the exclusive drive source. In contrast, in the case where the elevating and lowering device shares a drive source with the nozzle moving device, the amount of movement of the suction nozzle caused by the nozzle moving device may be changed if the operation of the drive source is modified to change the downward-movement end position, or the like, of the nozzle. Therefore, conventionally, it has not been practiced to change, while an EC mounting apparatus of this sort performs an EC mounting operation, the downward-movement end position, or the like, of a suction nozzle. However, since the connecting device which connects the suction nozzle to the movable member which is driven by the common drive source includes the downward-movement control device, the present apparatus can change, while performing an EC mounting operation, the downward-movement end position, or the like, of the nozzle.

(5) According to a fifth feature of the present invention that includes the fourth feature (4), the downward-movement control device comprises a stroke changing device which changes the movement of the movable member into an arbitrary one of a plurality of different strokes of the downward-movement of the suction nozzle.

The downward-movement control device may be one which shifts the stroke of the suction nozzle as a whole by changing both the upward-movement and downward-movement end positions of the nozzle. However, it is easier to change the downward-movement end position by changing the stroke.

Here, the plurality of different strokes do not include a stroke equal to zero.

The stroke may be stepwise changed, or continuously changed. In the latter case, it is can be said that the stroke is changed to any one of an infinite number of different lengths.

(6) According to a sixth feature of the present invention, there is provided an apparatus for mounting at least one electric component supplied by an electric-component supplying device, on a circuit substrate supported by a circuit-substrate supporting device, the apparatus comprising a nozzle revolving device which revolves, about an axis line, a suction nozzle having an end surface that applies a suction to the electric component and thereby holds the component, so that the suction nozzle transfers the component; an elevating and lowering device which elevates and lowers the suction nozzle so that the suction nozzle performs at least one of receiving the electric component from the electric-component supplying device and mounting the component on the circuit substrate on the circuit-substrate supporting device; a common drive source which commonly drives the nozzle revolving device and the elevating and lowering device; the elevating and lowering device comprising a movable member, and a connecting device which connects the movable member to the suction nozzle such that the suction nozzle continues moving while the movable member continues moving; and the connecting device comprising a downward-movement control device which changes, while the apparatus performs an electric-component mounting operation, at least one of a position of an end of a downward movement of the suction nozzle caused by the elevating and lowering device and a position where a deceleration of the downward movement of the nozzle is started.

(7) According to a seventh feature of the present invention that includes any one of the first to fourth and sixth features (1) to (4) and (6), the elevating and lowering device comprises a cam device which includes a rotary cam which is rotated by a drive source, and a cam follower which is engaged with the rotary cam.

The cam device can accurately control the downward movement of the suction nozzle. For example, the cam device can move downward the nozzle at a high speed and smoothly decrease the speed in a terminal portion of the downward movement, so that the nozzle can contact an EC, or an EC held by the nozzle can contact a circuit substrate, with a small impact. In addition, the cam device can lower the nozzle in an accurately timed relation with a movement of the nozzle to a stop position. However, usually, the motion of the cam follower of the cam device is a prescribed motion, and accordingly it is very difficult to change the downward-movement end position, or the like, of the nozzle based on an error of a position of an end portion of the nozzle or an error of a thickness of each EC. According to the present invention, the upward and downward-movement of the nozzle is controlled by the cam device, on one hand, and the downward-movement end position, or the like, of the nozzle can be changed, on the other hand.

In particular, in the case where the nozzle moving device and the elevating and lowering device share a drive source, the operation of the elevating and lowering device can be easily synchronized with the operation of the nozzle moving device, by employing the cam device. Thus, the suction nozzle can be moved at a high speed, and at least one of receiving each EC and mounting the same can be performed at a high speed and with a high accuracy.

(8) According to an eighth feature of the present invention that includes the seventh feature (7), the movable member comprises the cam follower, and the downward-movement control device comprises a stroke changing device which changes the movement of the cam follower into an arbitrary one of a plurality of different strokes of the downward-movement of the suction nozzle.

Here, the plurality of different strokes does not include a stroke equal to zero.

(9) According to a ninth feature of the present invention that includes the fifth or eighth feature (5) or (8), the stroke changing device changes the position of the end of the downward movement of the suction nozzle, while not changing a position of an end of an upward movement of the nozzle.

(10) According to a tenth feature of the present invention that includes any one of the first to seventh features (1) to (7), the apparatus further comprises an elevator member which is connected to the suction nozzle, and the downward-movement control device comprises a lever which is pivotable about an axis line and has an arm; a first movable member which is supported by the arm of the lever such that the first movable member is movable relative to the arm in a lengthwise direction of the arm, the first movable member being connected to the elevator member; and a first-movable-member moving device which moves the first movable member in the lengthwise direction of the arm.

(11) According to an eleventh feature of the present invention, there is provided an apparatus for mounting at least one electric component supplied by an electric-component supplying device, on a circuit substrate supported by a circuit-substrate supporting device, the apparatus comprising a nozzle moving device which moves a suction nozzle having an end surface that applies a suction to the electric component and thereby holds the component, in a direction intersecting an axis line of the suction nozzle; an elevating and lowering device which elevates and lowers the suction nozzle so that the suction nozzle performs at least one of receiving the electric component from the electric-component supplying device and mounting the component on the circuit substrate on the circuit-substrate supporting device; an elevator member which is connected to the suction nozzle; a downward-movement control device which changes, while the apparatus performs an electric-component mounting operation, at least one of a position of an end of a downward movement of the suction nozzle caused by the elevating and lowering device and a position where a deceleration of the downward movement of the nozzle is started; and the downward-movement control device comprising a lever which is pivotable about an axis line and has an arm; a first movable member which is supported by the arm of the lever such that the first movable member is movable relative to the arm in a lengthwise direction of the arm, the first movable member being connected to the elevator member; and a first-movable-member moving device which moves the first movable member in the lengthwise direction of the arm.

The elevator member and the suction nozzle may be connected to each other in such a manner that the nozzle moves while the elevator member moves, or a manner that the nozzle may not move while the elevator member moves, that is, the nozzle may is moved based on a portion of the movement of the elevator member. In either manner, the elevator member is connected to the arm via the first movable member and, when the arm is pivoted, the elevator member is moved. In addition, when the first movable member is moved in the lengthwise direction of the arm, the distance between the axis line of pivotal motion of the lever and the position where the elevator member is connected to the arm is changed, and accordingly a lever ratio, i.e., a ratio of the rotation angle of the lever to the distance of movement of a portion of the elevator member that is connected to the arm is changed. Thus, the stroke of movement of the elevator member is changed, and accordingly the stroke of upward and downward movement of the suction nozzle is changed.

The EC mounting apparatus according to the eleventh feature (11) may employ any one of the above-described first to ninth features (1) to (9).

(12) According to a twelfth feature of the present invention that includes the tenth or eleventh feature (10) or (11), the first-movable-member moving device comprises a second-movable-member guide which is substantially parallel to the lengthwise direction of the arm of the lever; a second movable member which is movable along the second-movable-member guide; a second-movable-member drive device which moves the second movable member along the second-movable-member guide; and an engaging device which includes a first engaging portion which is provided by at least a portion of the first movable member, and a second engaging portion which is provided by at least a portion of the second movable member, the first and second engaging portions having respective shapes which transmit a movement of the second movable member along the second-movable-member guide to the first movable member and allow a movement of the first movable member caused by a pivotal motion of the lever.

If the first movable member and an output member of the first-movable-member moving device are connected to each other by a connecting rod, such that opposite end portions of the connecting rod are pivotally connected to the first movable member and the output member, respectively, the first-movable-member moving device can move the first movable member in the lengthwise direction of the arm, while allowing the movement of the first movable member caused by the pivotal motion of the lever. In this case, however, it is needed to locate the first-movable-member moving device at a position distant from the first movable member. In contrast, the engaging device recited in the twelfth feature (12) enables the first-movable-member moving device to be located at a position in the vicinity of the arm, which leads to constructing the downward-movement control device in a compact manner.

(13) According to a thirteenth feature of the present invention that includes the eleventh or twelfth feature (11) or (12), the apparatus further comprises a connecting rod which is pivotally connected, at one of opposite end portions thereof, to the first movable member and is pivotally connected, at the other end portion thereof, to the elevator member, and thereby connects the first movable member and the elevator member to each other.

(14) According to a fourteenth feature of the present invention that includes the thirteen feature (13), the downward-movement control device further comprises a first-movable-member guide which is curved along an arc whose center is located on an axis line about which the other end portion of the connecting rod is pivoted relative to the elevator member being positioned at a position of an end of an upward movement thereof caused by the elevating and lowering device.

Whichever position the first movable member may take on the first-movable-member guide, the axis line about which the other end portion of the connecting rod is pivoted is positioned at the center of the arcuate guide, in the state in which the elevator member is positioned at its upward-movement end position. Thus, if the stroke of upward and downward movement of the elevator member is changed, the upward-movement end position of the same is not changed, and the downward-movement end position of the same is changed.

(15) According to a fifteenth feature of the present invention that includes the fourteenth feature (14), the second-movable-member guide extends along a straight line, and the second-movable-member drive device comprises a position determining means for determining, based on a target downward-movement-end position of the suction nozzle, a position of the second movable member.

It is possible to employ a curved second-movable-member guide which is curved parallel to the curved first-movable-member guide. In contrast, a linear second-movable-member guide which extends along a straight line contributes to simplifying the construction of the second-movable-member drive device itself or that of a drive-force transmitting device which transmits the drive force of the drive device to the second movable member. In the latter case, however, the amount of operation of the drive device is not regularly proportional to the amount of movement of the suction nozzle. Hence, it is preferred that the drive device itself include a position determining means for determining, based on a target downward-movement-end position of the nozzle, a position of the second movable member. In the last case, the present apparatus can be used more easily.

(16) According to a sixteenth feature of the present invention that includes any one of the first to fifteenth features (1) to (15), the downward-movement control device comprises a memory which stores control data; and a control-data-depending determining means for determining, based on the control data stored in the memory, the at least one of the position of the end of the downward movement of the suction nozzle and the position where the deceleration of the downward movement of the nozzle is started.

The control data may be data which are obtained in advance, and stored in the memory, before an EC-mounting operation is started, or data which are obtained, and stored in the memory, during an EC-mounting operation. In addition, the control data may be data which are automatically obtained and stored in the memory, or data which are manually obtained, and stored in the memory, by an operator.

Respective positional errors of the nozzle holder, the EC-supplying device, and the circuit-substrate supporting device relative to one another (in particular, their height-positional errors with respect to a vertical direction), resulting from respective errors of various constituent devices and members of the EC mounting apparatus, are corrected when those devices and members are assembled into the apparatus. And yet the suction nozzle may fail to suck or mount an EC, because there are not only some errors which cannot be corrected by correcting the positional errors of the apparatus, but also some nominal-dimension differences. For example, replaceable elements relating the EC mounting apparatus, such as ECs, circuit substrates, suction nozzles, or EC-supply feeders, have not only manufacturing errors, but also nominal-dimension differences among manufacturing companies. In addition, in the case where the EC mounting apparatus employs a plurality of sorts of suction nozzles, and mounts a plurality of sorts of ECs on a circuit substrate, those nozzles and those ECs have nominal-dimension differences. Therefore, if those errors and those nominal-dimension differences are obtained and stored in advance and the upward and downward movement of the suction nozzle is controlled based on those data, it is possible to reduce the chance of occurrence of failure to suck or mount an EC. The control-data-depending determining means can be said as a given-data-depending determining means.

(17) According to a seventeenth feature of the present invention that includes any one of the first to sixteenth features (1) to (16), the downward-movement control device comprises an error detecting device which detects at least one of an error of a position of an end surface of the suction nozzle that applies the suction, an error of a position of an upper surface of the electric component supported by a component-supply portion of the electric-component supplying device, an error of a position of a mounted surface of the electric component held by the suction nozzle that is to be mounted on the circuit substrate supported by the circuit-substrate supporting device, and an error of a position of a support surface of the circuit substrate that is to support the electric component mounted thereon; and a detected-error-depending determining means for determining, based on the error detected by the error detecting device, the at least one of the position of the end of the downward movement of the suction nozzle and the position where the deceleration of the downward movement of the nozzle is started.

The error of the position of the end surface of the suction nozzle may be produced by a manufacturing error of the nozzle, or wearing of the end surface. The error of the position of the upper surface of each EC supported by the EC-supply portion of the EC supplying device may be directly detected, or may be determined as the sum of a positional error of the EC-supply portion and a thickness error of the each EC. In the case where it can be assumed that one of the position of the EC-supply portion and the thickness of each EC has no error, the error of the position of the upper surface of the each EC can be determined based on only the error of the other of the position of the EC-supply portion and the thickness of the each EC. The error of the position of the mounted surface of each EC held by the suction nozzle that is to be mounted on the circuit substrate may be directly detected, or may be determined as the sum of a positional error of the end surface of the nozzle and a thickness error of the each EC. In the case where it can be assumed that one of the position of the end surface of the nozzle and the thickness of each EC has no error, the error of the position of the mounted surface of the each EC can be determined based on only the error of the other of the position of the end surface and the thickness of the each EC. The error of the position of the support surface of the circuit substrate supported by the circuit-substrate supporting device may be directly detected, or may be determined as the sum of a positional error of a circuit-substrate-support surface of the circuit-substrate supporting device and a thickness error of the circuit substrate. In the case where it can be assumed that one of the position of the circuit-substrate-support surface and the thickness of the circuit substrate has no error, the error of the position of the support surface of the circuit substrate can be determined based on only the error of the other of the position of the circuit-substrate-support surface and the thickness of the circuit substrate.

If, based on at least one of the positional error of the end surface of the suction nozzle and the positional error of the upper surface of each EC supported by the EC-supply portion of the EC supplying device, at least one of the downward-movement-end position and downward-movement-deceleration-start position of the nozzle is determined, the nozzle is effectively prevented from failing to suck and hold the each EC. In addition, if, based on at least one of the positional error of the mounted surface of each EC held by the suction nozzle and the positional error of the support surface of the circuit substrate supported by the circuit-substrate supporting device, at least one of the downward-movement-end position and downward-movement-deceleration-start position of the nozzle is determined, the nozzle is effectively prevented from failing to mounting the each EC on the circuit substrate.

At least one of the above-indicated errors may be obtained, and stored in the memory, before an EC-mounting operation is started, or may be obtained, and stored in the memory, during an EC-mounting operation. In the former case, the detected-error-depending determining means also functions as a given-data-depending determining means.

According to the seventeenth feature (17), even if the EC mounting apparatus may not include the given-data-depending determining means, the apparatus can reduce the number of failures to suck or mount ECs, by controlling the upward and downward movements of the suction nozzle based on the error detected by the error detecting device. On the other hand, if the apparatus includes the given-data-depending determining means, the apparatus can control the upward and downward movements of the nozzle based on not only the detected error but also the nominal-dimension differences, etc., and thereby minimize the number of failures to suck or mount ECs.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF PREFERRED EMBODIMENTS

Hereinafter, there will be described an embodiment of the present invention in detail by reference to the drawings. An electric-component (EC) mounting apparatus 8 to which the present invention is applied has a construction similar to that of an EC mounting apparatus disclosed in Japanese Patent Document No. 6-342998. The same portions of the two EC mounting apparatuses are briefly illustrated and described, and only the different portions thereof are described in detail.

Figure 1:
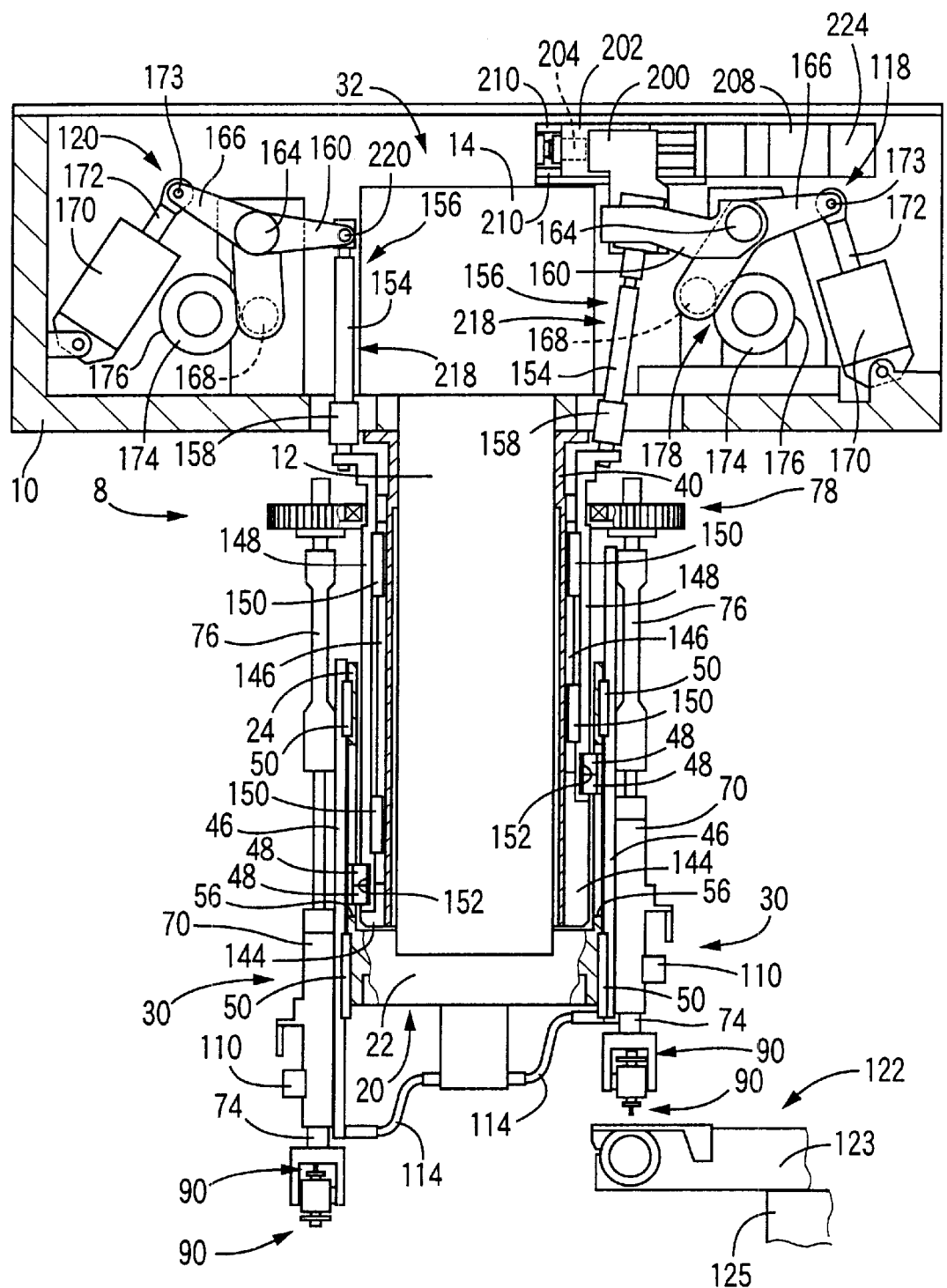
FIG. 1 is a partly cross-sectioned, front elevation view of an electric-component (EC) mounting apparatus to which the present invention is applied.

In FIG. 1, reference numeral 10 designates a frame which supports a rotary shaft 12 such that the rotary shaft 12 is rotatable about an axis line, e.g., a vertical axis line in the present embodiment. The rotary shaft 12 is rotated by a rotary-shaft drive device 14 including a roller gear and a roller gear cam, both not shown. When the roller gear cam is rotated at a prescribed speed in a prescribed direction by an index servomotor 16 (FIG. 16), a plurality of rollers of the roller gear sequentially engage a cam rib of the roller gear cam, so that the rotary shaft 12 is rotated intermittently at a prescribed angular pitch about the vertical axis line. A rotation angle of the index servomotor 16 is detected by an encoder 18 (FIG. 16) as a rotation detecting device.

An index table 20 as an intermittently rotatable member as a sort of displaceable member is fixed to a lower end portion of the rotary shaft 12 which projects downward from the frame 10. The index table 20 has a generally cylindrical shape, and includes a bottom portion 22 which is fixed to the rotary shaft 12, and a cylindrical portion 24 which extends toward the frame 10. The cylindrical portion 24 supports a plurality of EC mounting units 30, e.g., sixteen EC mounting units 30 in the present embodiment, such that the EC mounting units 30 are equiangularly spaced from one another on a circle whose center is located on the axis line about which the rotary shaft 12 is rotated. When the rotary shaft 12 is rotated, the index table 20 is rotated intermittently at the prescribed angular pitch equal to an angular pitch at which the sixteen EC mounting units 30 are supported.

Figure 2:
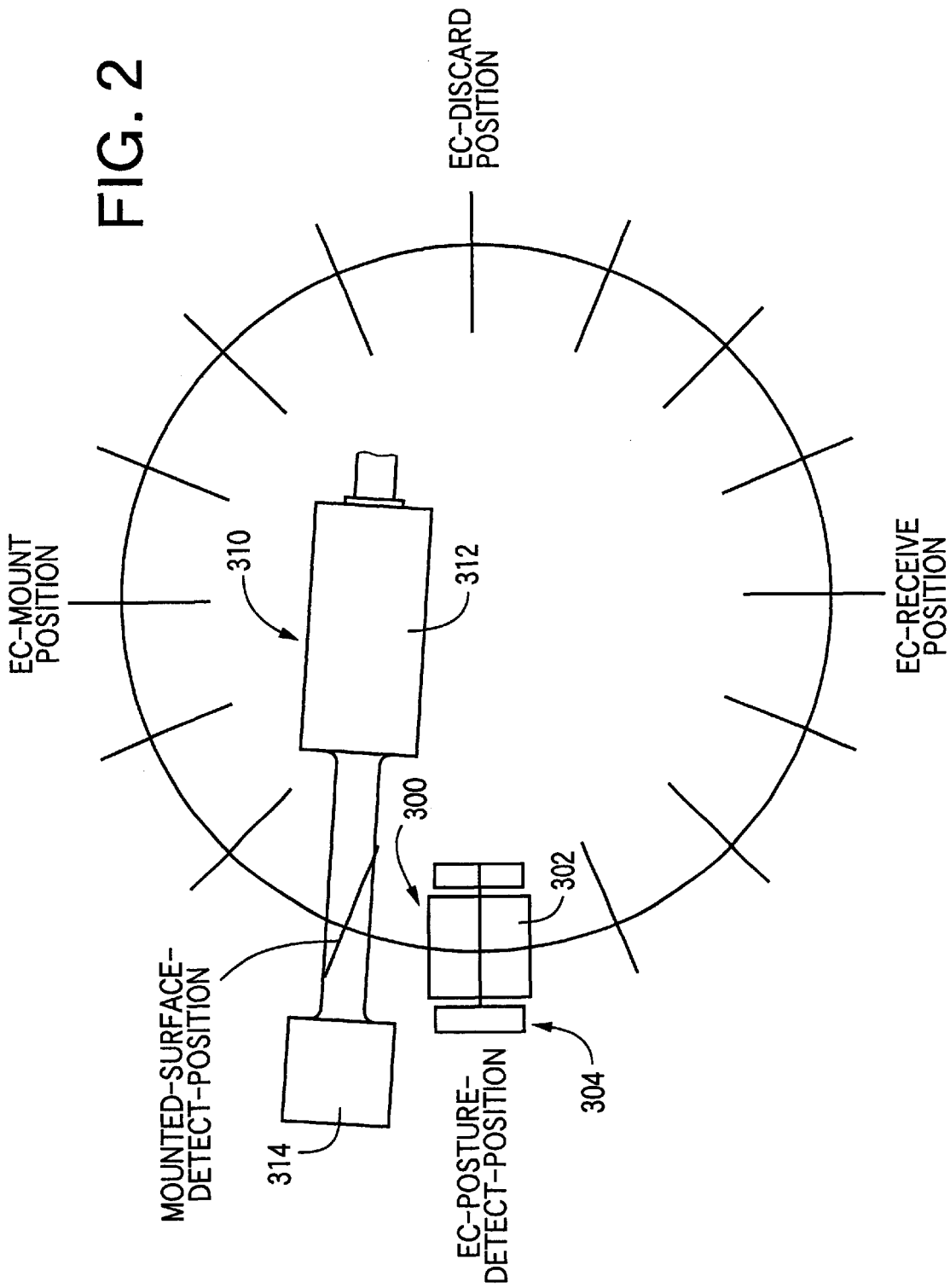
FIG. 2 is a plan view for explaining a plurality of stop positions of the EC mounting apparatus and showing respective image-taking devices which are provided at an EC-posture-detect position and a mounted-surface-detect position as two stop positions.

Thus, each EC mounting unit 30 is stopped at sixteen stop positions including a plurality of operation positions and a plurality of detection positions. The rest of the stop positions are resting positions where no operation or detection is performed. In the present embodiment, as schematically illustrated in FIG. 2, the operation positions include an EC-receive position, an EC-mount position, and an EC-discard position; and the detection positions include an EC-posture-detect position and a mounted-surface-detect position. When the index table 20 is intermittently rotated, the sixteen EC mounting units 30 are revolved about the vertical axis line, while being sequentially moved to, and stopped, at the sixteen stop positions provided on the locus of revolution thereof. The rotary shaft 12, the rotary-shaft drive device 14, and the index table 20 cooperate with one another to provide a nozzle revolving device 32.

The operation positions include, in addition to the above-described EC-receive position and other positions, an EC-posture-correct position, an EC-mounting-unit-posture-correct position, and a nozzle-select position where an EC-posture correcting device, an EC-mounting-unit-posture correcting device, and a nozzle selecting device are provided, respectively. The detection positions additionally include a suction-nozzle-detect position where a suction-nozzle detecting device is provided. However, since those positions are not relevant to the present invention, no illustration or description is provided here.

As shown in FIG. 1, a cylindrical cam 40 is fixed to a lower surface of the frame 10. The cylindrical cam 40 is externally fitted around the rotary shaft 12, such that a space is left between the cam 40 and the shaft 12 in a radial direction of the cam 40 and that a lower portion of the cam 40 is inserted in a space present between the shaft 12 and the cylindrical portion 24 of the index table 20. A cam groove (not shown) is formed in the lower portion of the cam 40, such that the cam groove opens in an outer circumferential surface of the cam 40. A pair of rollers 48 which are attached to a guide rail 46 of each EC mounting unit 30 are engaged with the cam groove, such that the rollers 48 are rollable in the cam groove.

Sixteen pairs of guide blocks 50 are fixed to an outer circumferential surface of the index table 20, such that the sixteen pairs of guide blocks 50 are equiangularly spaced from one another. Thus, the sixteen pairs of guide blocks 50 are fixed to the index table 20, at an angular pitch equal to the angular pitch at which the index table 20 is intermittently rotated. The two guide blocks 50 of each pair are spaced from each other in a vertical direction parallel to an axis line about which each EC mounting unit 30 is revolved, and the guide rail 46 is fitted in the two guide blocks 50 such that the rail 46 is vertically movable relative to the blocks 50. The guide rail 46 has an elongate shape, and is supported by the guide blocks 50 such that the rail 46 is movable relative to the blocks 50 in a lengthwise direction of the rail 46 that is a vertical direction.

Figure 4:
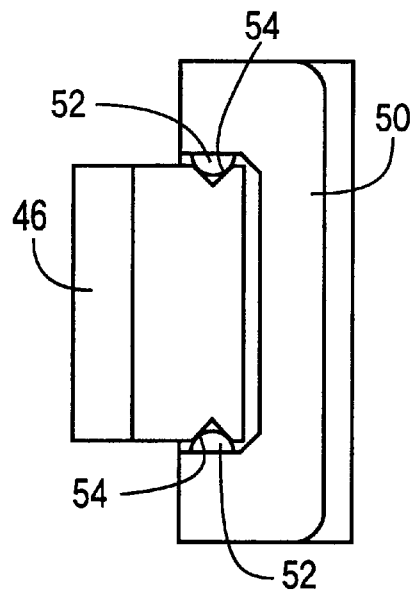
FIG. 4 is a plan view of a guide rail and a guide block which guide the upward and downward movements of the EC mounting unit.

As shown in FIG. 4, each guide block 50 has a generally U-shaped transverse cross section, and holds a plurality of balls 52 each as a rolling member such that the balls 52 are circulateable. The guide rail 46 has a pair of grooves 54 each of which has a V-shaped cross section and extends parallel to the lengthwise direction of the rail 46. The balls 52 are fitted in the grooves 54. The guide rail 46 is engaged with the guide blocks 50 via the balls 52, such that the rail 46 is movable relative to the blocks 50 in the lengthwise direction of the rail 46. A pair of side walls of each U-shaped guide block 50 prevent the guide rail 46 from being moved in a widthwise direction thereof, and the engagement of the balls 52 and the grooves 54 prevents the rail 46 from being moved in a direction perpendicular to the lengthwise and widthwise directions thereof, i.e., moved off the each block 50. Thus, the guide rail 46 is engaged with the guide blocks 50 such that the rail 46 is movable relative to the blocks 50 in only the lengthwise direction of the rail 46.

The above-mentioned pair of rollers 48 are attached to a lengthwise intermediate portion of the guide rail 46, such that each roller 48 is rotatable about a horizontal axis line perpendicular to the axis line about which the index table 20 is rotated. The pair of rollers 48 are fitted in the cam groove of the cylindrical cam 40, via an elongate hole 56 which is formed in a portion of the cylindrical portion 24 between the pair of guide blocks 50 and extends in a vertical direction. The pair of rollers 48 are attached to the guide rail 46 such that the two rollers 48 are arranged side by side in a vertical direction and are held in engagement with an upper wall surface and a lower wall surface of the cam groove, respectively.

The height position of the cam groove continuously changes in a circumferential direction of the cylindrical cam 40. When the index table 20 is rotated and the EC mounting units 30 are revolved, each pair of rollers 48 are moved in the cam groove, so that the corresponding EC mounting unit 30 is elevated and lowered. In the present embodiment, the cam groove is so formed that each EC mounting unit 30 reaches an upward-movement end position at the EC-receive position, reaches a downward-movement-end position at the EC-mount position, and moves horizontally around each of the EC-receive position and the EC-mount position.

Figure 3:
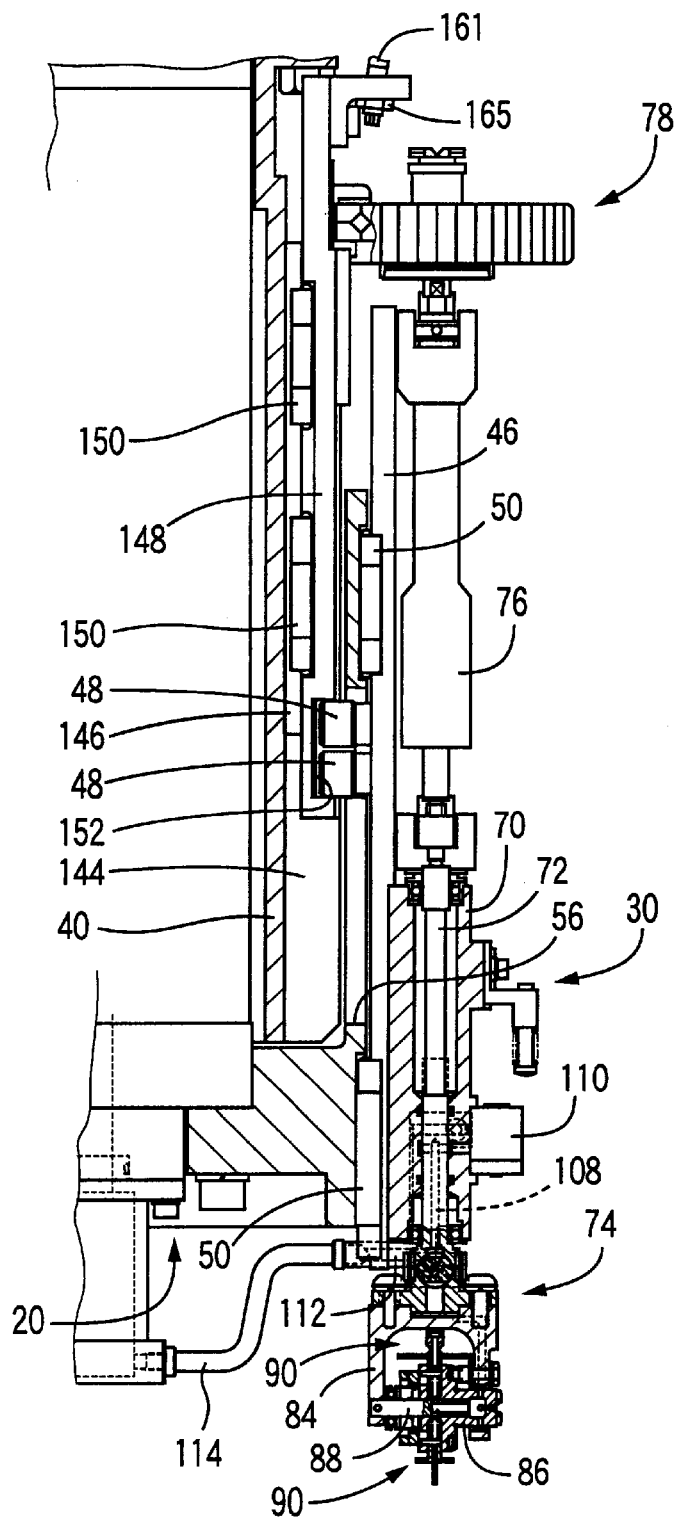
FIG. 3 is a partly cross-sectioned, front elevation view of an EC mounting unit, and an EC-mounting-unit elevating and lowering device provided at the EC-receive position, of the EC mounting apparatus.

A sleeve 70 as a cylindrical member is fixed to an outer surface of the guide rail 46. As shown in FIG. 3, a rod 72 having a circular transverse cross section is fitted in the sleeve 70, such that the rod 72 takes a vertical posture, i.e., a posture parallel to the axis line about which the nozzle holders 74 are revolved, and such that the rod 72 is rotatable about its own axis line and is not movable relative to the sleeve 70 in an axial direction of the rod 72. The rod 72 provides a shank portion of a nozzle holder 74. In the present embodiment, the nozzle holder 74 of each EC mounting unit 30 is rotated, at the EC-posture-correct position, about its own axis line by the EC-posture correcting device, and the rotation position of the unit 30 about the axis line is returned, at the EC-mounting-unit-posture-correct position, to an original position before correction, by the EC-mounting-unit-posture correcting device. A portion of the rotation of the unit 30 is effected concurrently with a portion of the rotation of the index table 20. To this end, the rod 72 receives a rotating or driving force from the EC-posture correcting device or the EC-mounting-unit-posture correcting device, via a rotation transmitting member 76, while the rod 72 is permitted to be elevated or lowered. A rotating device 78 rotates the rotation transmitting member 76 about an axis line parallel to the axis line about which the index table 20 is rotated, independent of the rotation of the table 20. However, those elements are not relevant to the present invention, no illustration or description thereof is provided here.

As shown in FIG. 3, an attachment member 84 is fixed to a lower end of the rod 72 that projects downward out of the sleeve 70. The attachment member 84 supports a rotary holder 86 via a support shaft 88 such that the rotary holder 86 is rotatable about a horizontal axis line perpendicular to an axis line of the rod 72. The attachment member 84, the rotary holder 86, and the rod 72 cooperate with one another to provide the nozzle holder 74. The rotary holder 86 holds a plurality of suction nozzles 90 such that the suction nozzles 90 are equiangularly spaced from each other about the support shaft 88 and extend in radial directions of the same 88. When the rotary holder 86 is rotated about the support shaft 88, one of the suction nozzles 90 is selectively moved to, and positioned at, an operative position where the one nozzle 90 is oriented downward and an axis line of the one nozzle 90 coincides with that of the rod 72. It can be said that the nozzle holder 74 and the suction nozzles 90 cooperate with each other to provide an EC holding head, which cooperates with the guide rail 46 to provide each EC mounting unit 30. The axis line of the one nozzle 90 being positioned at the operative position extends in a vertical direction, and the one nozzle 90 is moved in a direction intersecting an axial direction thereof when the index table 20 is rotated.

Figure 5:
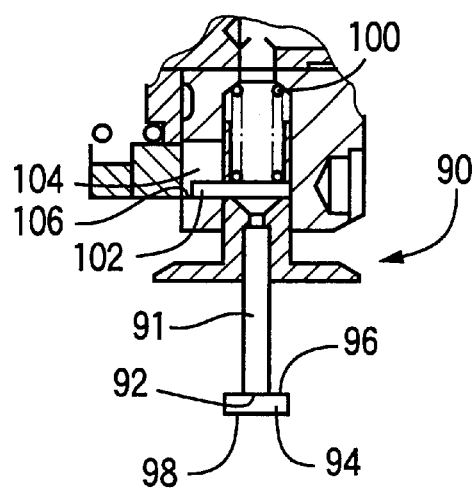
FIG. 5 is a partly cross-sectioned, front elevation view of a suction nozzle of the EC mounting unit.

FIG. 5 shows one of the suction nozzles 90, as a representative thereof. The one suction nozzle 90 includes a suction pipe 91, and a free-end (i.e., lower-end) surface of the suction pipe 91 provides a sucking end surface 92 which is perpendicular to the axis line of the one nozzle 90 and is plane. In the present embodiment, each suction nozzle 90 applies a suction or negative pressure to an EC 94 and thereby holds the same 94. In the present embodiment, the suction nozzles 90 include at least two nozzles 90 of different sorts, but respective lengths of all the suction pipes 91 are equal to each other. Thus, respective distances of the respective sucking end surfaces 92 of the suction pipes 91 from the axis line about which the rotary holder 86 is rotated, are equal to each other. Hereinafter, an upper surface of the EC 94 that is sucked and held by the suction nozzle 90 will be referred to as a "sucked" surface 96 of the EC 94; and a lower surface of the EC 94 that is mounted on the PWB will be referred to as a "mounted" surface 98 of the EC94.

Each suction nozzle 90 is held by the rotary holder 86 such that the each nozzle 90 is not rotatable, but is movable in an axial direction thereof, relative to the holder 86. Each suction nozzle 90 is biased, by a spring 100 as a biasing device that is provided between the each nozzle 90 and the rotary holder 86, in a direction in which the each nozzle 90 advances out of the holder 86. The limit of advancement of the nozzle 90 caused by the biasing action of the spring 100 is defined by the engagement of a pin 102 fitted in the nozzle 90 and extending perpendicularly to the axis line of the nozzle 90, with a wall surface 106 defining an end of an elongate hole 104 formed in the rotary holder 86. Thus, the pin 102 and the wall surface 106 provide respective engaging portions which engage each other and cooperate with each other to provide an advancement-limit defining device. The pin 102 is fitted in the elongate hole 104, such that the pin 102 is movable relative to the hole 104 in the axial direction of the suction nozzle 90. A position of the suction nozzle 90 where the pin 102 is engaged with the wall surface 106 defining the end of the elongate hole 104 and is prevented from being further moved is an advancement-end position of the nozzle 90. From this position, the nozzle 90 can be retracted into the rotary holder 86 while compressing the spring 100. FIG. 1 shows that each EC mounting unit 30 has two suction nozzles 90, for easier illustration purposes only.

The one suction nozzle 90 being positioned at the operative position is connected to a negative-pressure supplying device or an air suction device, not shown, via respective negative-pressure passages 108 of the support shaft 88, the rotary holder 86, the attachment member 84, and the rod 72 (numeral 108 is assigned, in FIG. 3, to only the negative-pressure passage provided in the rod 72), a switch valve 110 as a control valve that is fixed to the sleeve 70, a coupling member 112, a hose 114, and respective negative-pressure passages (not shown) of the index table 20 and the rotary shaft 12. The negative-pressure passage of the support shaft 88 is so formed as to be connected to only the one suction nozzle 90 being positioned at the operative position. In addition, when the rotary holder 86 is rotated, the respective negative-pressure passages of the attachment member 84, the holder 86, and the support shaft 88 are kept communicated with one another. Moreover, when the rotary shaft 12 is rotated, the respective negative-pressure passages of the index table 20 and the rotary shaft 12 are kept communicated with the negative-pressure supplying device or the air suction device.

The switch valve 110 is mechanically switched like the switch valve disclosed in Japanese Patent Document No. 10-126097. When each EC mounting unit 30 is lowered at the EC-receive position, the switch valve 110 is switched to a negative-pressure-supply position thereof to cause the negative-pressure passage 108 to be communicated with the negative-pressure supplying device or the air suction device so that a negative-pressure air is supplied to the suction nozzle 90, and then the switch valve 110 is kept to the negative-pressure-supply position till the EC 94 is mounted on the PWB. When the EC mounting unit 30 is lowered at the EC-mount position to mount the EC 94 on the PWB, the switch valve 110 is switched to a positive-pressure-supply position thereof to supply an atmospheric-pressure air or a positive-pressure air to the suction nozzle 90 so that the EC 94 is released from the nozzle 90.

As shown in FIGS. 1 and 3, two EC-mounting-unit elevating and lowering devices 118, 120 are provided at respective portions of the frame 10, and respective portions of the cylindrical cam 40 fixed thereto, that correspond to the EC-receive position and the EC-mount position, respectively. Each of the EC-mounting-unit elevating and lowering devices 118, 120 provides an EC-mounting-unit moving device or a nozzle moving device that elevates and lowers each EC mounting unit 30, or moves the suction nozzle 90 thereof in the axial direction of the nozzle 90. Each EC-mounting-unit elevating and lowering device 118, 120 also functions as a nozzle elevating and lowering device.

Figure 24:
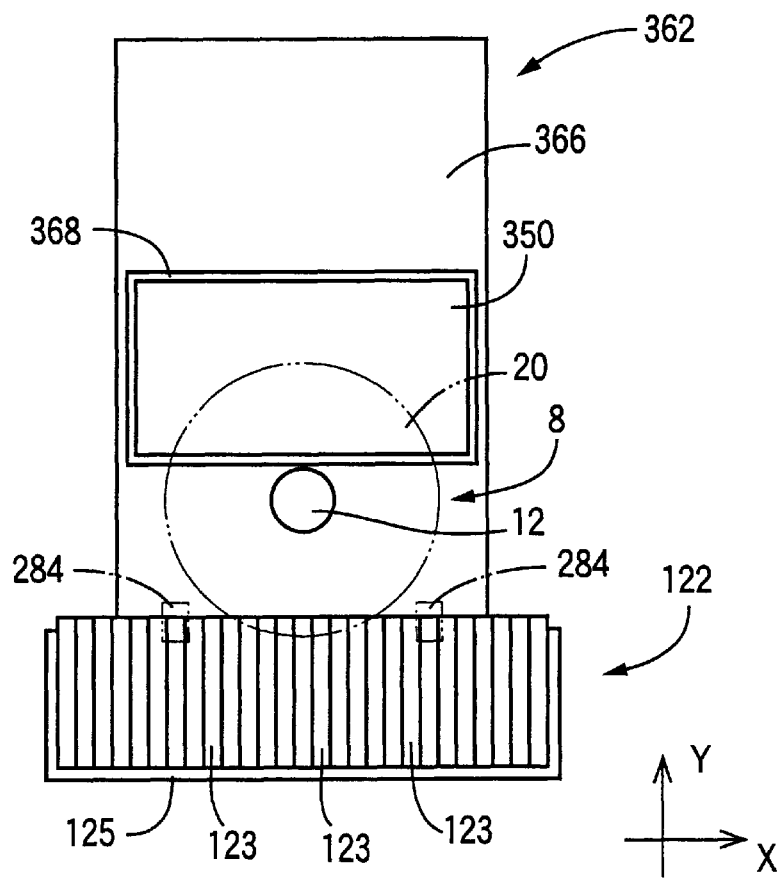
FIG. 24 is a schematic plan view of the EC mounting system including the EC mounting apparatus.

Next, there will be described the EC-mounting-unit elevating and lowering device 118 provided at the EC-receive position. At the EC-receive position, there is provided an EC supplying device 122 which supplies ECs 94. In the present embodiment, the EC supplying device 122 includes a plurality of EC-supply feeders (hereinafter, simply referred to as the feeders) 123. The feeders 123 are positioned, on a table 125, by respective positioning devices, not shown, and are detachably attached to the table 125 by respective attaching devices, not shown, such that, as schematically shown in FIG. 24, respective EC-supply portions of the feeders 123 are arranged along a straight line. Each suction nozzle 90 picks up an EC 94 from the EC-supply portion of each feeder 123. The direction in which the respective EC-supply portions of the feeders 123 are arranged will be referred to as an X-axis direction. When the table 125 is moved in the X-axis direction by a table moving device including, as a drive source thereof, a table moving servomotor 128 (FIG. 16), the EC-supply portion of an appropriate one of the feeders 123 is selectively moved to an EC-supply position which is right below the one EC mounting unit 30 being positioned at the EC-receive position, more specifically described, the one suction nozzle 90 thereof being positioned at the operative position. Thus, the feeders 123 are moved relative to the EC-mounting-unit elevating and lowering device 118. The EC-receive position can be said as an EC-suck position.

Figure 20:
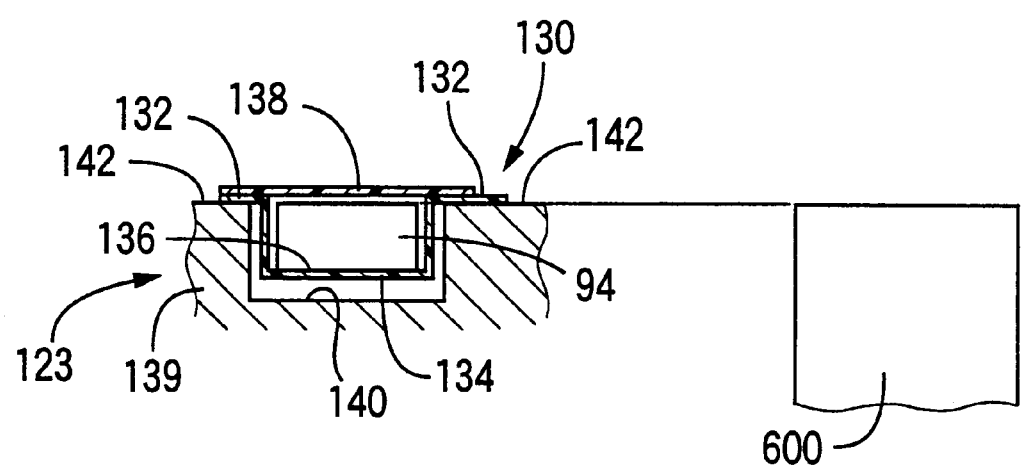
FIG. 20 is a view for showing a state in which an EC to be mounted on a printed wiring board by the EC mounting apparatus is held by an EC carrier tape, and showing a standard feeder.
Figure 21:
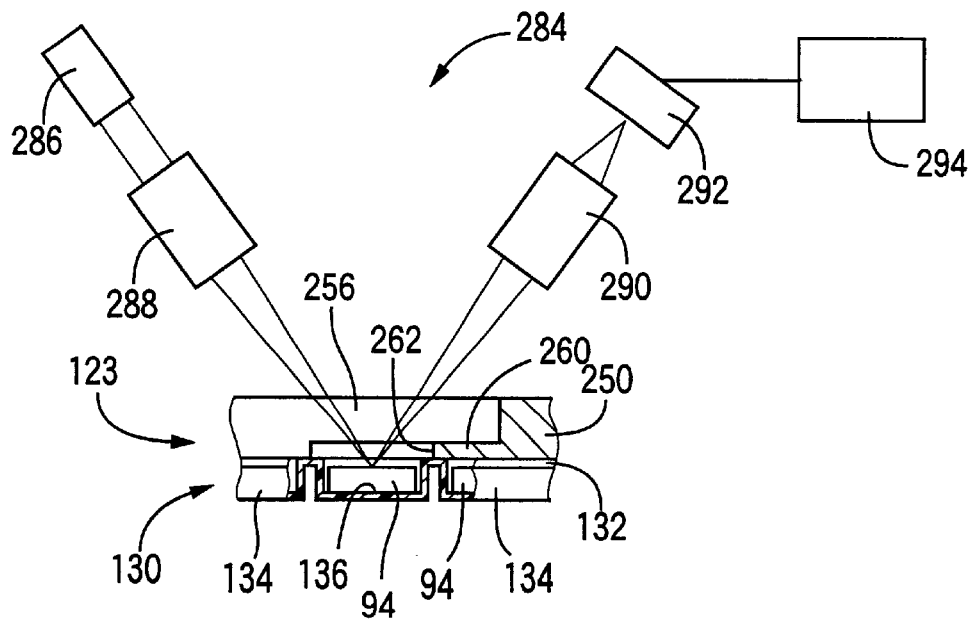
FIG. 21 is a partly cross-sectioned, front elevation view of an EC-supply portion of a tape-type feeder of an EC supplying device which supplies ECs to the EC mounting apparatus, and an EC-height-position detecting device of the apparatus.

In the present embodiment, each EC 94 may be one which has lead wires, or a chip-like one which has no lead wires. As shown in FIGS. 20 and 21, some of the feeders 123 are tape-type feeders 123 each of which holds an EC carrier tape 130 carrying ECs 94, and the others of the feeders 123 are bulk-type feeders 123 each of which holds ECs 94 in bulk.

In the present embodiment, as shown in FIGS. 20 and 21, the EC carrier tape 130 includes a pair of supported portions 132 which are located at widthwise opposite end portions of the tape 130 and extend parallel to each other; and an EC accommodating portion 134 which projects downward from the two supported portions 132 and has a plurality of EC accommodating pockets 136 at respective regular intervals in a lengthwise direction of the tape 130. Each EC accommodating pocket 136 accommodates one EC 94. Respective openings of the EC accommodating pockets 136 are closed by a cover tape 138. The EC carrier tape is a so-called embossed-type one having a pair of supported portions 132 which are supported on a main frame 139 of the feeder 123. The EC accommodating portion 134 of the EC carrier tape 130 is fitted in a groove 140 which is formed in an upper surface of the main frame 139, such that the pair of supported portions 132 of the tape 130 are supported on a pair of tape-support surfaces 142 provided on both sides of the groove 140 as seen in a widthwise direction thereof. Therefore, even if different sorts of EC carrier tapes 130 carrying different sorts of ECs 94 having different thickness values may be fed, respective height positions of respective upper surfaces of the respective cove tapes 138 of the different sorts of carrier tapes 130 do not differ from one another, and respective height positions of the respective upper surfaces of the different sorts of ECs 94 do not differ from one another.

Each tape-type feeder 123 has the same construction as that of a tape-type feeder disclosed in Japanese Patent Document No. 7-9381, and accordingly is briefly described below. The tape-type feeder 123 includes a feeding device, not shown, which feeds the EC carrier tape 130; and a take-up device, not shown, which takes up the cover tape 138 peeled from the carrier tape 130. A leading one of the ECs 94 from which the cover tape 138 has been peeled is fed to the EC-supply portion of the feeder 123. A portion of the main frame 139 that corresponds to the EC-supply portion of the feeder 123 is covered with a cover member 250, which prevents the ECs 94 from which the cover tape 138 has been peeled, from jumping out of the EC accommodating pockets 136.

Figure 23:
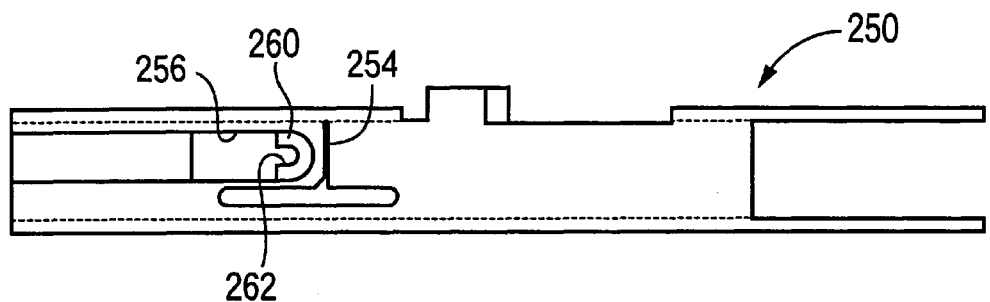
FIG. 23 is a plan view of a cover member of the tape-type feeder shown in FIG. 21.

The cover member 250 has a generally U-shaped transverse cross section and, as shown in FIG. 23, has a slit 254 which extends in a direction perpendicular to a tape-feed direction in which the carrier tape 130 is fed. The cover tape 138 peeled from the carrier tape 130 is drawn out through the slit 254, and is taken up by a take-up member, not shown, of the take-up device. In addition, the cover member 250 has a rectangular opening 256 on the front side of the slit 254, and the suction nozzle 90 picks up each EC 94 through the opening 256. A thin tongue member 260 is provided on the upstream side of the opening 256 as seen in the tape-feed direction, and has a U-shaped recess 262 which opens in the opening 256.

The cover member 250 is moved by a cover-member moving device, not shown, to a closing position where the tongue member 260 covers one EC 94 fed to the EC-supply portion and thereby prevents the EC 94 from jumping out of the EC accommodating pocket 136, and to an opening position where the tongue 260 is away from the EC 94 and allows the suction nozzle 90 to take out the EC 94 from the pocket 136. The cover-member moving device and the above-mentioned feeding and take-up devices are driven by the index servomotor 16 as their drive source. As will be described later, the EC-mounting-unit elevating and lowering device 118 is also driven by the index servomotor 118 as its drive device. Thus, the advancement and retraction of the cover member 250, the feeding of the EC carrier tape 130, and the peeling and taking-up of the cover tape 138 are effected in synchronism with the upward and downward movements of each suction nozzle 90, i.e., the sucking and holding of each EC 94 by the each nozzle 90.

In the present embodiment, in a state in which the tape-type feeder 123 waits for the suction nozzle 90 to pick up the leading one of the ECs 94 from which the cover tape 138 has been peeled, the leading EC 94 is fed to the EC-supply portion, and the cover member 250 is moved to the closing position. Since the tongue member 260 has the recess 262, the nozzle 90 can contact the leading EC 94 through the recess 262. While the nozzle 90 is lowered to receive the leading EC 94, the carrier tape 130 is not fed, but the cover tape 138 is taken up and the cover member 250 is moved backward. Thus, the tongue member 260 is moved away from the leading EC 94 fed to the EC-supply portion, and the opening of the EC accommodating pocket 136 is exposed to allow nozzle 90 to take out the EC 94 from the pocket 136. The nozzle 90 is so lowered that before the tongue 260 is moved backward and is completely offset from the EC 94, the nozzle 90 may contact the EC 94. After the cover 250 is retracted to the position where the tongue 260 is offset from the EC 94, the nozzle 90 is moved up to take out the EC 94 from the pocket 136. When the nozzle 90 is moved up after sucking and holding the EC 94, the cover 250 is moved forward and concurrently the carrier tape 130 is fed forward, so that a new leading EC 94 from which the cover tape 138 has been peeled is fed to the EC-supply portion while being covered with the tongue 260. However, the cover tape 138 is not taken up, thereby allowing the feeding of the carrier tape 130.

Figure 22:
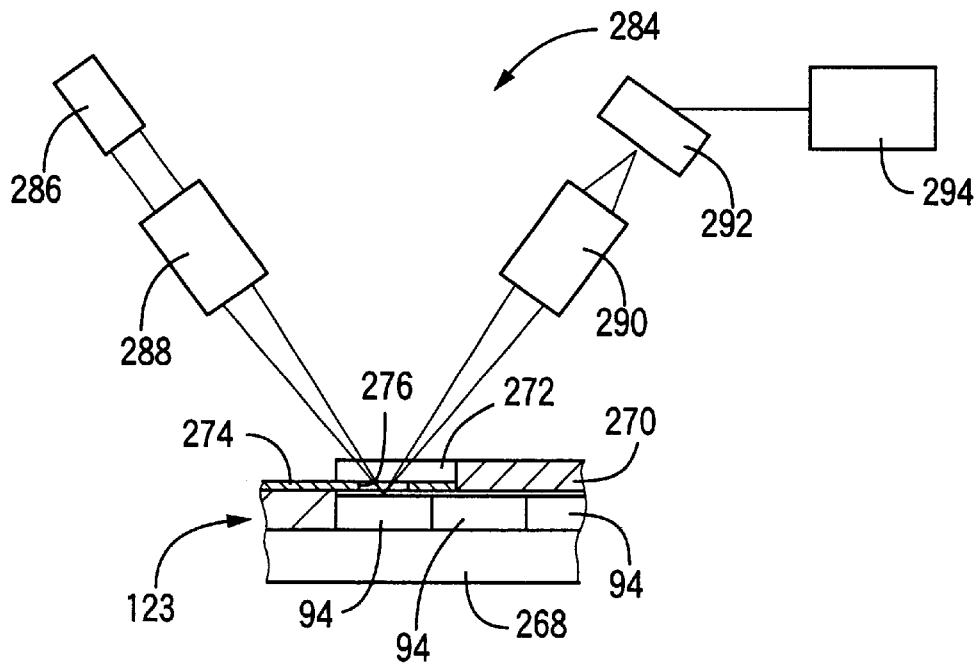
FIG. 22 is a partly cross-sectioned, front elevation view of an EC-supply portion of a bulk-type feeder of the EC supplying device, and the EC-height-position detecting device.

Each of the bulk-type feeders 123 has the same construction as that of a bulk-type feeder disclosed in Japanese Patent Document No. 11-20933. A number of ECs 94 which are stored in bulk in a casing are arranged into an array of ECs 94, which are transferred onto a conveyor belt 268. When the conveyor belt 268 is moved by a belt driving device, not shown, the array of ECs 94 are fed to the EC-supply portion of the feeder 123. As shown in FIG. 22, a portion of a main frame 270 of the feeder 123 that corresponds to the EC-supply portion has an opening 272 which opens upward and allows the suction nozzle 90 to take out the leading one of the array of ECs 94 and which is covered with a cover member 274. The cover member 274 is advanced and retracted by a cover-member driving device including the index servomotor 16 as its drive source, and is moved, like the cover member 250 of each tape-type feeder 123, to each of its closing and opening positions in synchronism with the movements of each suction nozzle 90. In a state in which the bulk-type feeder 123 waits for the nozzle 90 to take out the leading EC 94, the cover member 274 is positioned at its closing position to close the opening 272. However, since the cover member 274 has a recess 276 in a portion thereof that is aligned with the opening 272 when the cover 274 closes the opening 272, an operator can see and check, through the recess 276, whether the leading EC 94 is present in the opening 272.

In the present embodiment, even if different sorts of ECs 94 having different thickness values are fed by a plurality of bulk-type feeders 123, respectively, respective height positions of the respective sucked surfaces 96 of all the ECs 94 as the respective upper surfaces thereof do not differ from one another, and are equal to those of the respective sucked surfaces 96 of all the ECs 94 fed by the tape-type feeders 123.

As shown in FIG. 24, two EC-height-position detecting devices 284 are provided and fixed at respective positions which are offset from the EC-supply position of the EC supplying device 122 in a positive and a negative direction of the X-axis direction, i.e., the direction of movement of the feeders 123, and which are aligned with the EC-supply portions of the feeders 123 in the Y-axis direction. Each of the EC-height-position detecting devices 284 detects a height position of the sucked surface 96 of each EC 94 as the upper surface thereof that is to be sucked by each suction nozzle 90. Since the two EC-height-position detecting devices 284 have the same construction, one of the two devices 284 will be described below as a representative thereof In the present embodiment, the EC-height-position detecting device 284 is provided by a laser displacement sensor. As shown in FIG. 21, the detecting device 284 includes a laser-beam emitter 286 which emits laser beams; and a lighting optical system 288 which converges the laser beams emitted by the emitter 286 and irradiates the EC 94 fed to the EC-supply portion. Regarding each tape-type feeder 123, the EC 94 fed to the EC-supply portion is free from the cover tape 138 and is covered with the cover member 250, so that the EC 94 is irradiated with the laser beams through the recess 262 of the tongue member 260. Regarding each bulk-type feeder 123, the EC 94 is irradiated with the laser beams through the recess 276 of the cover member 274.

The EC-height-position detecting device 284 additionally includes a receiving optical system 290 which converges the light reflected from the EC 94; a semiconductor position-sensing element 292 to which the converged light is incident; and an analogue computer 294 which determines a light-incidence position where the light is incident to the sensing element 292. Since the light-incidence position on the sensing element 292 changes depending on the height position of the sucked surface 96, the height position of the sucked surface 96 can be determined based on the determined light-incidence position. Hereinafter, the respective positions where the two EC-height-position detecting devices 284 are provided in the X-axis direction and where the height position of the sucked surface 96 of the EC 94 fed to the EC-supply portion of each feeder 123 is detected will be referred to as the "EC-height-position-detect position", when appropriate.

Each EC mounting unit 30 is lowered and elevated, at the EC-receive position, by the EC-mounting-unit elevating and lowering device 118, so that the one suction nozzle 90 being positioned at the operative position receives an EC 94 from the one feeder 123 being positioned at the EC-supply position. To this end, as shown in FIG. 1, the cylindrical cam 40 has, in a portion thereof corresponding to the EC-receive position, a guide groove 144 which opens in the outer circumferential surface of the cam 40 and extends in a vertical direction. An elongate guide rail 146 as a guide member is fixed to a wall surface defining a bottom of the guide groove 144, such that the guide rail 146 extends in a vertical direction parallel to the axial direction of the one suction nozzle 90 being positioned at the operative position and the axis line about which the index table 20 is rotated. Two guide blocks 150 which are fixed to an elevator member 148 as a nozzle-side member, are fitted on the guide rail 146 such that the guide blocks 150 are movable on the rail 146. The elevator member 148 has a width which assures that the elevator member 148 is just fitted in the guide groove 144, and has, in a lower end portion thereof, a horizontal engaging groove 152 which opens on the side of the outer circumferential surface of the cylindrical cam 40 and has the same width (i.e., dimension as measured in a lengthwise direction of the elevator member 148) as that of the cam groove of the cam 40. In a state in which the elevator member 148 is positioned at an upward-movement-end position thereof, the engaging groove 152 takes the same height position as that of one of the horizontal portions of the cam groove of the cylindrical cam 40, and accordingly is continuous with the cam groove.

Figure 7:
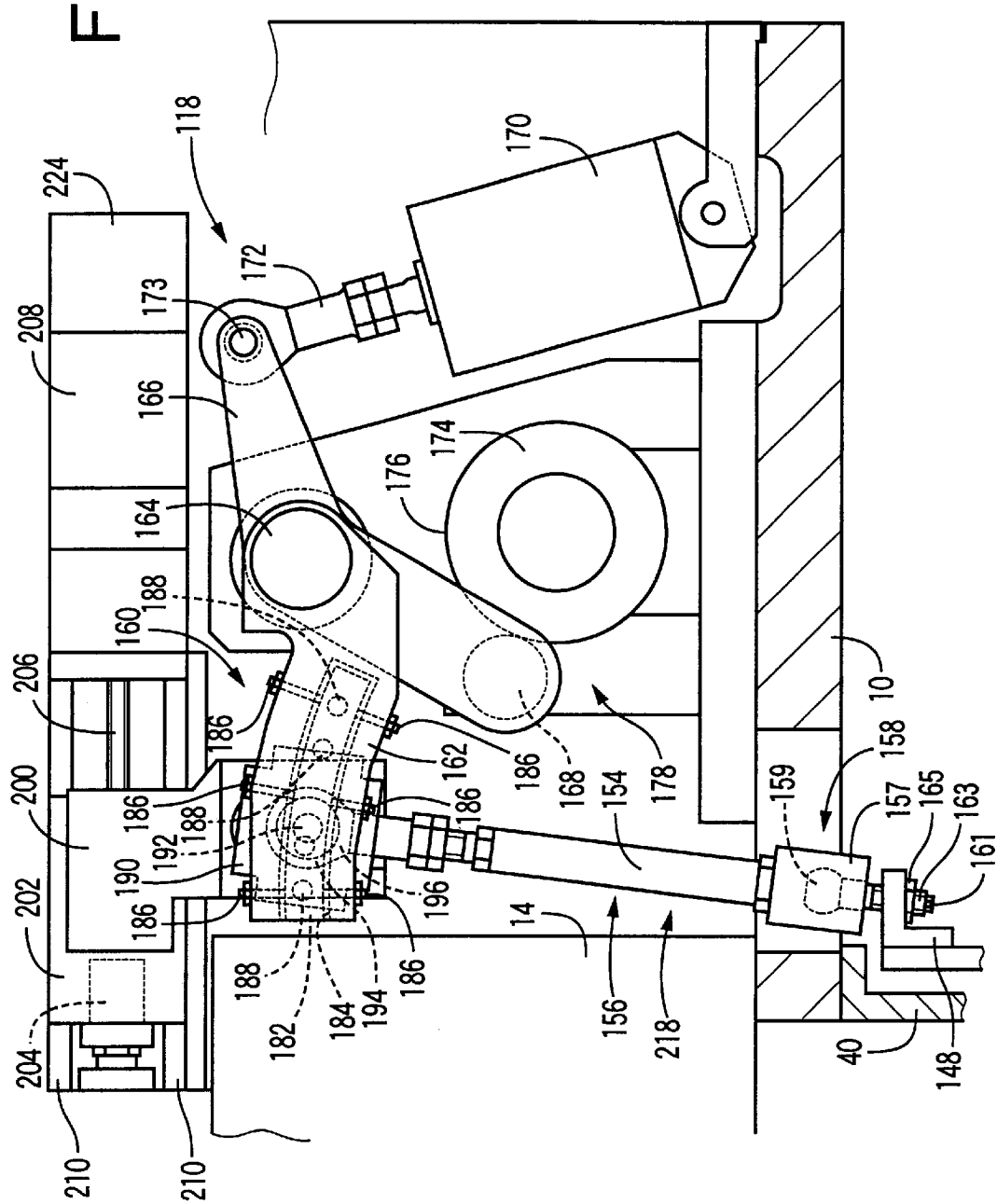
FIG. 7 is a partly cross-sectioned, front elevation view of the EC-mounting-unit elevating and lowering device, and a downward-movement control device, provided at the EC-receive position.

As shown in FIG. 7, an upper end portion of the elevator member 148 projects upward out of the guide groove 144, and is connected to a lower end portion of a main member 154 of a connecting rod 156, via a spherical joint 158, such that the elevator member 148 is rollable or pivotable, but is not movable in an axial direction thereof, relative to the rod 156. The spherical joint 158 is integral with the main member 154 of the connecting rod 156, and includes a case portion 157 having a concave surface and a shaft 161 having a spherical surface 159 which is fitted in the case portion 157 such that the shaft 161 is rollable or pivotable relative to the case portion 157 but is not removable from the same 157. The shaft 161 has an externally threaded portion 163 which is threadedly engaged with the elevator member 148 and is fixed to the same 148 with a nut 165.

An upper end portion of the main member 154 of the connecting rod 156 is connected to an arm 162 of a lever 160, such that the rod 156 is pivotable relative to the lever 160 and a connection position where the rod 156 is connected to the lever 160 is adjustable. A rotatable shaft 164 is supported by the frame 10 such that the shaft 164 is rotatable about a horizontal axis line, and the lever 160 is supported by the rotatable shaft 164 such that the lever 160 is not rotatable relative to the shaft 164. The rotatable shaft 164 supports another lever 166 such that the lever 166 is not rotatable relative to the shaft 164. A roller 168 as a cam follower or a movable member is attached to one end portion of the lever 166, such that the roller 168 is rotatable relative to the lever 166; and a piston rod 172 of an air-operated cylinder device 170 is connected via a pin 173 to the other end portion of the lever 166 such that the piston rod 172 is pivotable relative to the lever 166. When the lever 166 is biased by the air cylinder 170, the roller 168 engages a cam surface 176 of a rotary cam 174 as a sort of cam. The rotary cam 174 is rotated by the previously-described index servomotor 16, and cooperates with the roller 168 to provide a cam device 178. Thus, the EC mounting-unit elevating and lowering devices 118, 120 and the nozzle revolving device 32 share the common drive source 16. The air cylinder 170 is a double-action-type one and, in a state in which a pressurized air is supplied to one of air chambers of the cylinder 170 and accordingly the roller 168 is pressed against the cam surface 176, if the rotary cam 174 is rotated, the lever 166 is pivoted and accordingly the lever 160 is also pivoted.

Figure 9:
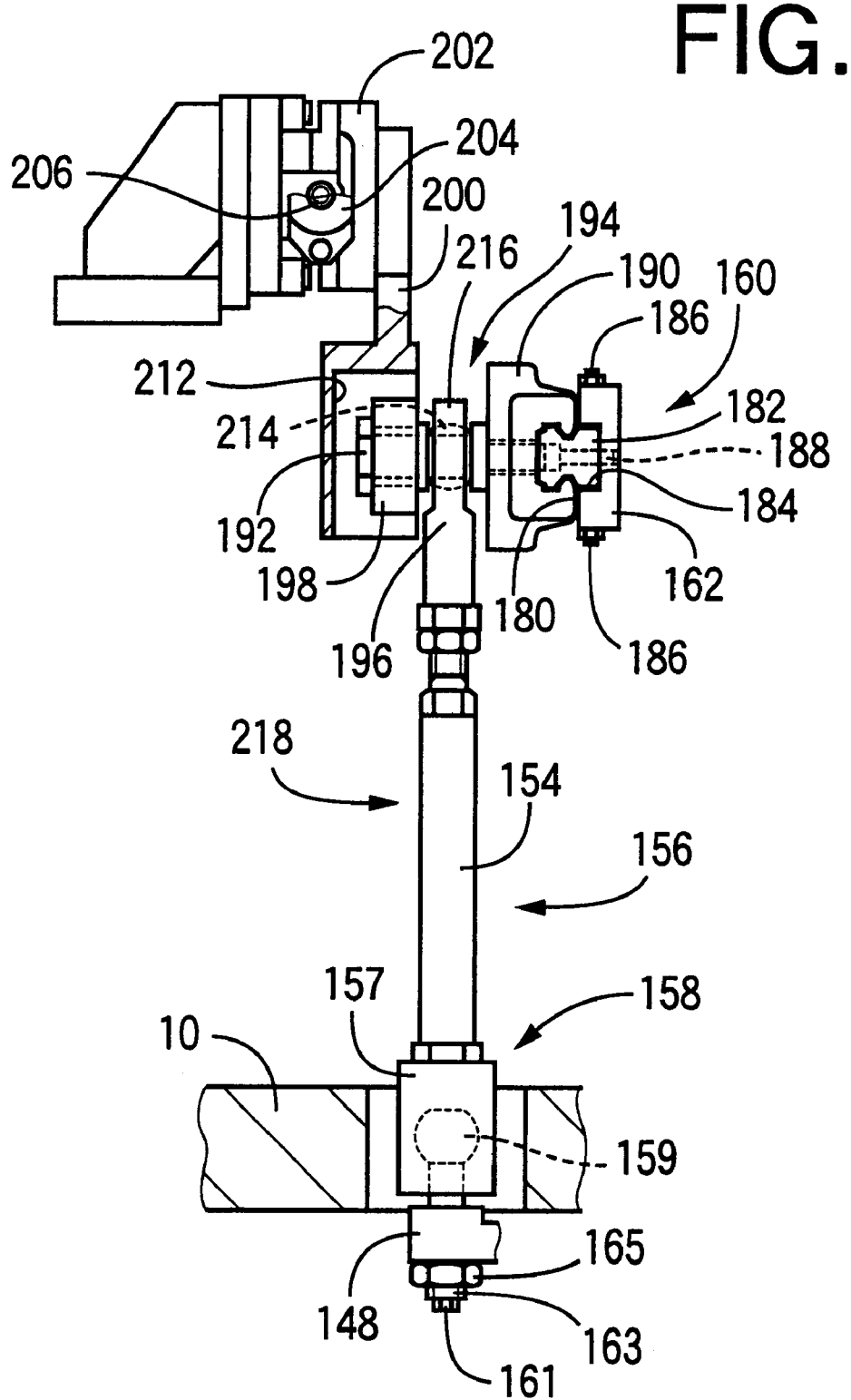
FIG. 9 is a side elevation view of the EC-mounting-unit elevating and lowering device and the downward-movement control device.

As shown in FIGS. 7 and 9, the arm 162 is provided with a guide member 182 which is curved along an arc. In the present embodiment, the guide 182 is provided by a member produced separately from the arm 162, and is fitted in an arcuate groove 184 opening in a vertical surface 180 of the arm 162. A width of the arcuate groove 184 (i.e., a dimension as measured in a radial direction of the arc) is greater than that of the guide 182, so that the guide 182 is fitted in the groove 184 and is engaged with, and positioned by, a plurality of pairs of adjuster bolts 188 threadedly engaged with the arm 162, in the radial direction of the arc. The guide 182 is fixed to the arm 162 with a plurality of bolts 188. An amount of threaded engagement of the adjustor bolts 186 with the arm 162 can be adjusted to adjust a position of the guide 182 relative to the arm 162 in the radial direction of the arc. This adjustment will be described later.

The guide 182 projects from the vertical surface 180, and a first slide member 190 as a first movable member is fitted on the projecting portion of the guide 182 such that the first slide 190 is movable relative to the guide 182. Thus, the first slide 190 is supported by the arm 162 such that the first slide 190 is movable relative to the arm 162 in a lengthwise direction of the arm 162. A support shaft 192 projects from the first slide 190, such that the support shaft 192 extends parallel to an axis line about which the lever 160 is pivoted.

The upper end portion of the main member 154 of the connecting rod 156 is connected via a spherical joint 194 to the support shaft 192 such that the rod 156 is pivotable, but is not movable in an axial direction thereof, relative to the shaft 192.

The spherical joint 194 includes a spherical member 214 held by the support shaft 192, and an engaging member 216 having a part-spherical concave surface. The engaging member 216 is fitted on the spherical member 214 such that the engaging member 216 is rollable or pivotable relative to the spherical member 214, and one end portion of the engaging member 216 that is opposite to the other end portion fitted on the spherical member 214 is threadedly engaged with the upper end portion of the main member 154 of the connecting rod 156. In the present embodiment, the main member 154, the case portion 157, and the engaging member 216 cooperate with one another to provide the connecting rod 156, which cooperates with the shaft 161, the spherical member 214, and the support shaft 216 to provide a connecting device 218 which connects the elevator member 148 and the first slide 190 to each other. Hereinafter, an upper end portion of the connecting rod 156 that is pivotally connected to the lever 160 will be referred to as a connection portion 196.

When the rotary cam 174 is rotated and accordingly the lever 160 is pivoted, the connecting rod 156 is elevated or lowered and accordingly the elevator member 148 is elevated or lowered, so that the EC mounting unit 30 or the suction nozzle 90 is elevated or lowered. In the present embodiment, the cam surface 176 has such a shape which assures that first the suction nozzle 90 is smoothly accelerated, then is moved downward at a constant speed, and is smoothly decelerated during a terminal portion of the downward movement. When the EC mounting unit 30 is elevated or lowered, the roller 168 is biased by the air cylinder 170 to follow the cam surface 176. On the other hand, when the EC mounting unit 30 is not elevated or lowered, the roller 168 is not biased by the air cylinder 170 being switched to a different state, and does not follow the cam surface 176. In the state in which the roller 168 follows the cam surface 176, one full rotation of the rotary cam 174 causes one downward movement and one upward movement of the elevator member 148. Thus, while the roller 168 moves to follow the cam surface 176, the EC mounting unit 30 also moves. If the suction nozzle 90 contacts the EC 94 before reaching its downward-movement-end position, the nozzle 90 is retracted into the rotary holder 86 while compressing the spring 100, till the nozzle holder 74 reaches its downward-movement-end position. Thus, the nozzle 90 is not moved to the prescribed downward-movement-end position, and the downward movement of the nozzle 90 is interrupted. On the other hand, if the nozzle 90 does not contact the EC 94, the nozzle 90 would continue moving downward. Thus, it can be said that while the roller 168 continues moving, the suction nozzle 90 also continues moving downward and upward.

Figure 8:
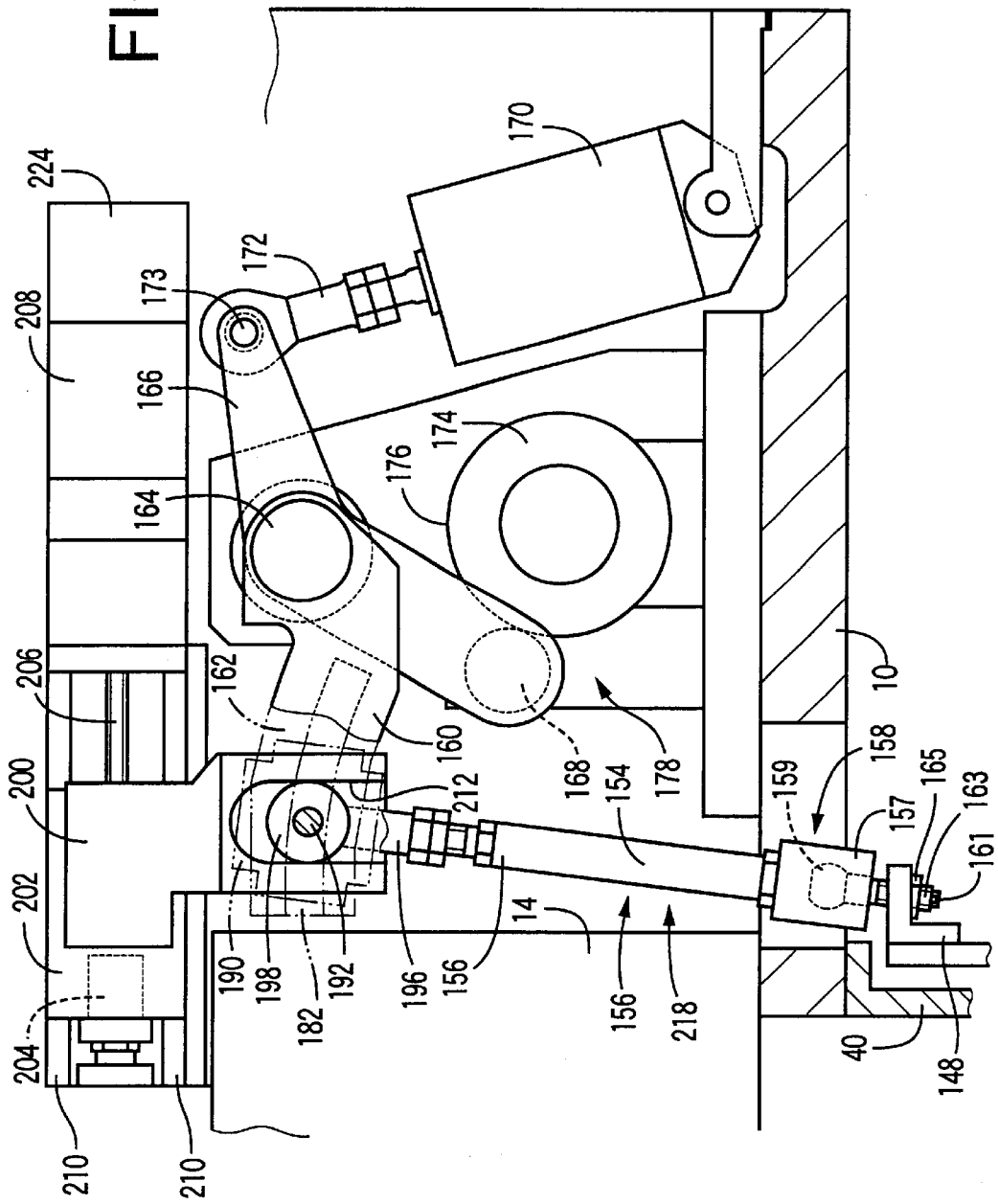
FIG. 8 is a front view of a second slide and a roller of the downward-movement control device.

As shown in FIG. 9, the support shaft 192 additionally supports a roller 198 such that the roller 198 is rotatable relative to the shaft 192. The roller 198 provides a first engaging portion. The roller 198 is engaged with an engaging member 200 as a second engaging portion, such that the roller 198 is rotatable relative to the engaging member 200 and is movable upward and downward relative to the same 200. As shown in FIGS. 7 and 9, the engaging member 200 is provided on a second slide member 202 as a second movable member that is supported by the frame 10 such that the second slide 202 is movable relative to the frame 10. As shown in FIG. 8, a nut 204 is fixed to the second slide 202, and is threadedly engaged with a feed screw 206. The feed screw 206 is supported by the frame 10 such that the screw 206 is rotatable, but not movable in an axial direction thereof, relative to the frame 10. When the feed screw 206 is rotated by a second-slide-drive servomotor 208 as a sort of an electric motor as a drive source that is accurately controllable with respect to rotation angle, the second slide 202 is moved, while being guided by a pair of guide members 210, in horizontal directions which are substantially parallel to a lengthwise direction of the arm 162 and is perpendicular to the axis line about which the lever 160 is pivoted. The rotation angle of the servomotor 208 is detected by an encoder 224 as a rotation detecting device.

Figure 10A:
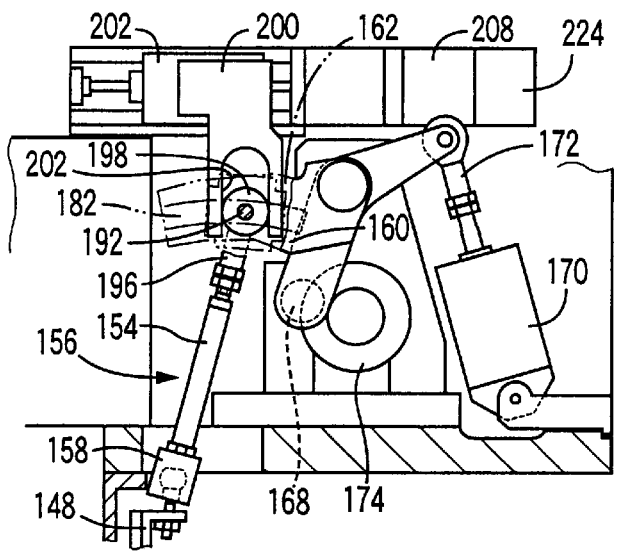
FIGS. 10A, 10B, and 10C are views for explaining a manner in which the downward-movement control device changes a target downward-movement-end position of each suction nozzle.
Figure 10B:
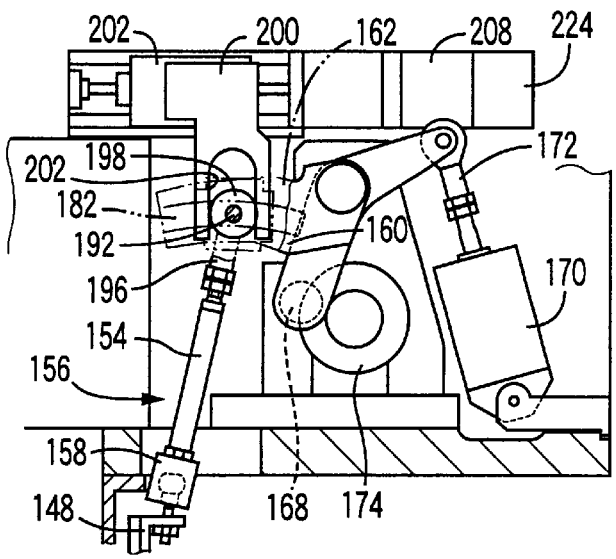
Figure 10C:
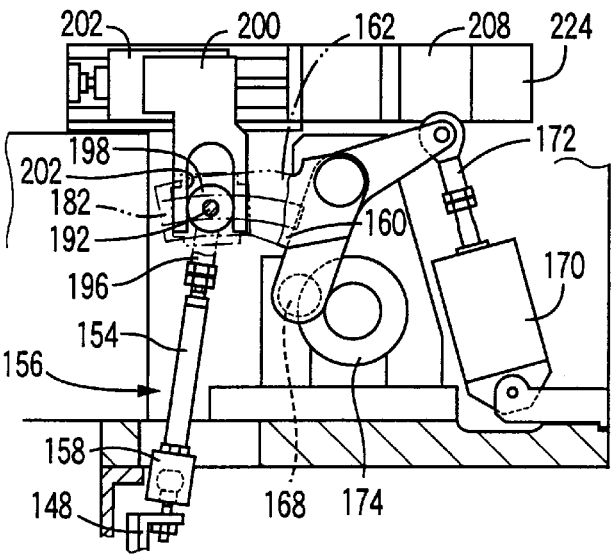

As shown in FIG. 8, the engaging member 200 includes a projecting portion projecting downward from the second slide 202, and the projecting portion has a vertical recess 212 in which the roller 198 is fitted such that the roller 198 is rotatable, and vertically movable, relative to the engaging member 200, but is not movable relative to the same 200 in a direction parallel to the directions in which the second slide 202 is moved. Therefore, when the second slide 202 is moved, the roller 198 is moved with the second slide 202, the first slide 190 is moved in the lengthwise direction of the lever 160, while being guided by the guide 182, and the connection portion 196 of the connecting rod 156 is moved relative to the lever 160. Thus, as shown in FIGS. 10A, 10B, and 10C, a distance between the center of the connection portion 196 (i.e., the center of the spherical member 214 of the spherical joint 194) and the axis line about which the lever 160 is pivoted is changed, so that a stroke of upward and downward movements of the elevator member 148 or the suction nozzle 90 is changed. The above distance can be substantially continuously changed, so that the stroke of upward and downward movements of the suction nozzle 90 can be changed to any one of an infinite number of different strokes. Since the connecting rod 156 is connected to the elevator member 148 via the spherical joint 158, the rod 156 is permitted to be pivoted relative to the elevator member 148, when the stroke is changed or the lever 160 is pivoted. In addition, when the connection portion 196 of the rod 156 is moved relative to the lever 160 to change the above distance, or when the lever 160 is pivoted, the roller 198 is moved vertically, which is permitted by the vertical recess 212. The recess 212 has such a dimension which assures that the roller 198 does not come out of the recess 212 when the roller 198 is moved vertically by the pivotal motion of the lever 160.

In the present embodiment, the guide 182 extends along an arc, and the center of the arc is located on an axis line about which a lower end portion of the connecting rod 156 is pivoted in a state in which the elevator member 148 is positioned at its upper-movement-end position. That is, in a state in which the roller 168 is engaged with a portion of the cam surface 176 of the rotary cam 174 that causes the elevator member 148 to be positioned at its upward-movement-end position, the center where the connecting rod 156 is rollably connected to the elevator member 148 via the spherical joint 158 (i.e., the center of the spherical portion 159) is located on the center of the arcuate guide 182. Therefore, even if the connection portion 196 is moved relative to the lever 160, the upward-movement-end position of the elevator member 148 is not changed, but the downward-movement-end position of the same 148 is changed, so that the downward-movement-end position of the suction nozzle 90 is changed and accordingly the stroke of upward and downward movements of the same 90 is changed.

The respective positions of the guide 182 and the elevator member 148 are so adjusted that in the state in which the center about which the connecting rod 156 is pivoted relative to the elevator member 14 is located on the center of the arcuate guide 182 and the suction nozzle 90 is positioned at its upward-movement-end position, the engaging groove 152 is always aligned with the cam groove of the cylindrical cam 40 and the roller 48 can be moved from the cam groove to the engaging groove 152 and vice versa. More specifically described, first, in a state in which a distance between the center of the spherical joint 158 of the connecting rod 156 and the center of the spherical joint 194 is adjusted to a correct length, the first slide 190 is moved along the guide 182, while the position of the guide 182 is so adjusted, with the adjustor bolts 186, that the first slide 190 can be smoothly moved relative to the guide 182. Then, the bolts 188 are fastened to fix the guide 182 to the arm 162. Subsequently, the nut 165 which fixes the elevator member 148 to the shaft 161 is loosened, and the shaft 161 is rotated, as needed, to adjust the height position of the elevator member 148. After the adjustment, the nut 165 is fastened to fix the elevator member 148 to the shaft 161.

The above-mentioned "downward-movement-end position of the suction nozzle 90" is not limited to an actual downward-movement-end position, but may mean a target downward-movement-end position, when appropriate. The target downward-movement-end position is defined as a position, corresponding to a downward-movement-end position of the nozzle holder 74, where the suction nozzle 90 does not compress the spring 100, i.e., does not move back to the side of the nozzle holder 74. That is, the target downward-movement-end position is a prescribed position to which the suction nozzle 90 should be moved downward unless the nozzle 90 is contacted with the EC 94 and is prevented thereby from being further moved downward. If the suction nozzle 90 is contacted with the EC 94 and is prevented thereby from being further moved downward, the actual downward-movement-end position of the nozzle 90 is higher than the target downward-movement-end position thereof. On the other hand, if the suction nozzle 90 is just contacted with the EC 94, or any space is left between the nozzle 90 and the EC 94, when the nozzle 90 is moved to, and stopped, at an actual downward-movement-end position thereof, the actual downward-movement-end position is equal to the target downward-movement-end position.

In the present embodiment, when the target downward-movement-end position of the suction nozzle 90 is changed, the upward-movement-end position of the nozzle 90 is not changed, and accordingly an amount of change of the stroke of upward and downward movements of the nozzle 90 can be entirely used as an amount of change of the target downward-movement-end position of the same 90. Thus, the amount of change of the stroke can be effectively used and accordingly be minimized. FIGS. 10A, 10B, and 10C show the state in which the elevator member 148 is positioned at its downward-movement-end position.

Figure 11:
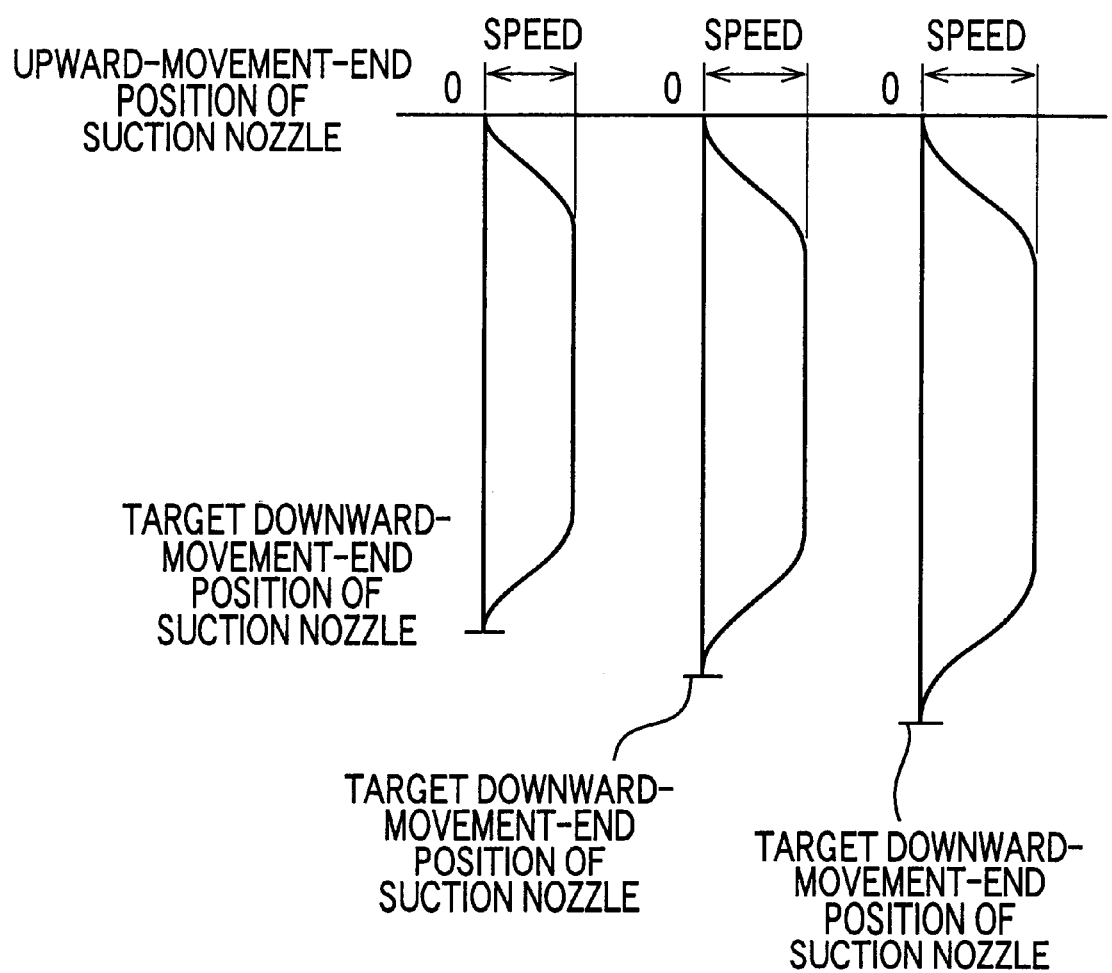
FIG. 11 is a view for explaining a manner in which the downward-movement control device changes the target downward-movement-end position, and a deceleration-start position, of each suction nozzle.

Thus, when the downward-movement-end position of the elevator member 148 is changed, the target downward-movement-end position of the suction nozzle 90 is changed, and simultaneously a position where the acceleration of downward movement of the nozzle 90 is ended, a position where the deceleration of downward movement of the nozzle 90 is started, and a speed of downward movement of the nozzle 90 are changed, as illustrated in FIG. 11. That is, a speed decreasing mode is changed. In the present embodiment, since a height position of the feeders 123 and the table 125 of the EC supplying device 122 cannot be adjusted, the target downward-movement-end position of the suction nozzle 90 is changed to assure that each nozzle 90 can reliably receive an EC 94 from each feeder 123.

The EC-mounting-unit elevating and lowering device 120 cannot adjust the target downward-movement-end position of each suction nozzle 90. Thus, the target downward-movement-end position is constant. An upper end portion of a main member 154 is pivotally connected to a lever 160 via a pin 220. Thus, the main member 154 cooperates with a case portion 157 of a spherical joint 158 to provide a connecting rod 156, which cooperates with a shaft 161 and the pin 220 to provide a connecting device 218. Except those differences, the EC-mounting-unit elevating and lowering device 120 has a construction similar to that of the EC-mounting-unit elevating and lowering device 118, and the same reference numerals as used for the device 118 are used to designate the corresponding elements of the device 120, without describing them.

As schematically illustrated in FIG. 2, an image taking device 300 is provided at the EC-posture-detect position. The image taking device 300 includes a CCD (charge-coupled-device) camera 302 that is a surface-image taking device which can take a two-dimensional image of the EC 94 at once. The CCD camera 302 includes a matrix of CCDs each as a sort of solid image sensor, i.e., a number of small light-receving elements arranged on a plane. The CCD camera 302 is provided below each EC mounting unit 30 being positioned at the EC-posture-detect position on the locus of revolution of the each unit 30, such that the camera 302 is oriented upward. A lighting device 304 is provided adjacent to the CCD camera 302, and emits an ultraviolet light toward a lighting plate of each suction nozzle 90, so that the lighting plate emits, from a fluorescent surface thereof, a visible light toward the EC 94 and the CCD camera 302 takes a silhouette image of the EC 94 held by the nozzle 90.

Figure 6:
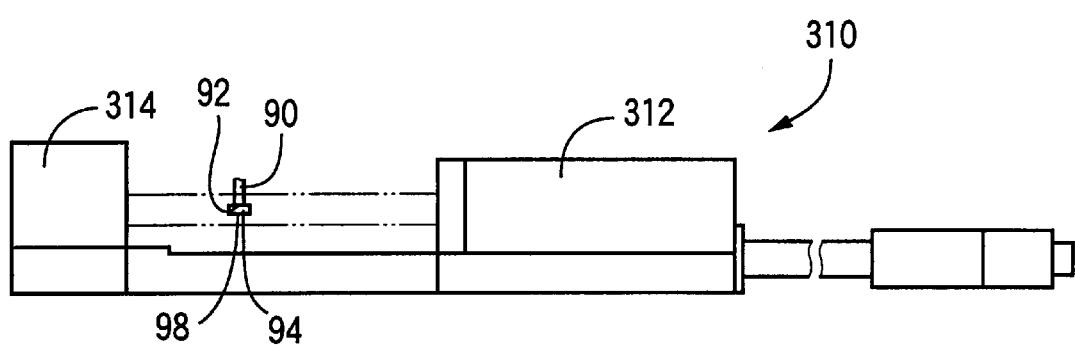
FIG. 6 is a front elevation view of the image-taking device provided at the mounted-surface-detect position as one of the stop positions.

As shown in FIG. 2, an image taking device 310 is provided at the mounted-surface-detect position. The image taking device 310 includes a CCD camera 312. The CCD camera 312 is, like the CCD camera 302, a surface-image taking device which can take a two-dimensional image of the EC 94 at once. The image taking device 310 additionally includes a lighting device 314 which is opposed to the CCD camera 312. Respective optical axes of the CCD camera 312 and the lighting device 314 are perpendicular to the vertical suction nozzle 90 being positioned at the operative position and accordingly, in the present embodiment, the optical axes are horizontal. The CCD camera 312 is provided inside the locus of revolution of the suction nozzle 90 being positioned at the operative position, such that the CCD camera 312 is oriented toward outside the locus. The lighting device 314 is provided outside the locus such that the lighting device 314 is oriented toward inside the locus, i.e., is opposed to the CCD camera 312. As shown in FIG. 6, the CCD camera 312 and the lighting device 314 are located, with respect to the vertical direction, i.e., the axial direction of the suction nozzle 90, at a position where the camera 312 and the lighting device 314 can take an image of the lower end portion of the nozzle 90 and the EC 94 held by the nozzle 90, that is, a position where the lower end portion of the nozzle 90 and the EC 94 held by the nozzle 90 are positioned inside an image-take space, indicated at two-dot-chain line, irrespective of which shape or size each nozzle 90 or each EC 94 may have. The CCD camera 312 takes an image of the nozzle 90 and the EC 94, as seen in a direction perpendicular to the axial direction of the nozzle 90.

As shown in FIGS. 12 to 15, at the EC-mount position, there is provided a wiring-board (WB) supporting and moving device 352 as a circuit-substrate supporting and moving device that supports and moves a printed wiring board (PWB) 350 as a sort of circuit substrate. The WB supporting and moving device 352 cooperate with the EC mounting apparatus 8 and the EC supplying device 122 to provide an EC mounting system. In the present embodiment, the WB supporting and moving device 352 has the same construction as that of the WB supporting and moving device disclosed in Japanese Patent Document No. 10-224099 or a corresponding U.S. patent application Ser. No. 09/015,521, and accordingly is briefly described. The WB supporting and moving device 352 essentially includes (1) a WB conveying device 354 which conveys the PWB 350; (2) a WB holding device 356 which positions and holds the PWB 350 conveyed by the WB conveying device 354; (3) a WB-holding-device elevating and lowering device 358 which moves the WB conveying device 354 and the WB holding device 356 in a vertical, Z-axis direction, and elevates and lowers the devices 354, 356 between a WB-transfer height position, indicated at two-dot-chain line, and an EC-mount height position, indicated at solid line; (4) a height-position adjusting device 360 which adjusts, at the EC-mount height position, a height position of the WB holding device 356; and (5) an X-Y table 362 which supports the WB holding device 356 via the height-position adjusting device 360 and moves the device 356 to an arbitrary position on a horizontal plane.

The X-Y table 362 moves the WB conveying device 354 and the WB holding device 356 being positioned at the EC-mount height position, to an arbitrary position on the horizontal plane, and thereby positions each place on a support surface 364 of the PWB 350 held by the device 356, where an EC 94 is to be mounted, to a position right below the suction nozzle 90 of the EC mounting unit 30 being positioned at the EC-mount position. The support surface 364 is an upper surface of the PWB 350 and, in the present embodiment, a horizontal plane. The X-Y table 362 includes an X table 366 and a Y table 368. The X table 366 is moved in the X-axis direction by an X-table moving device 376 including a feed screw 370, a nut 372, and an X-table moving servomotor 374. The Y table 368 is provided on the X table 366 such that the Y table 368 is movable in the Y-axis direction, and is moved in the Y-axis direction perpendicular to the X-axis direction on the horizontal plane, by a Y-table moving device 380 including a feed screw 378, a nut, not shown, and a Y-table moving servomotor, not shown.

Figure 13:
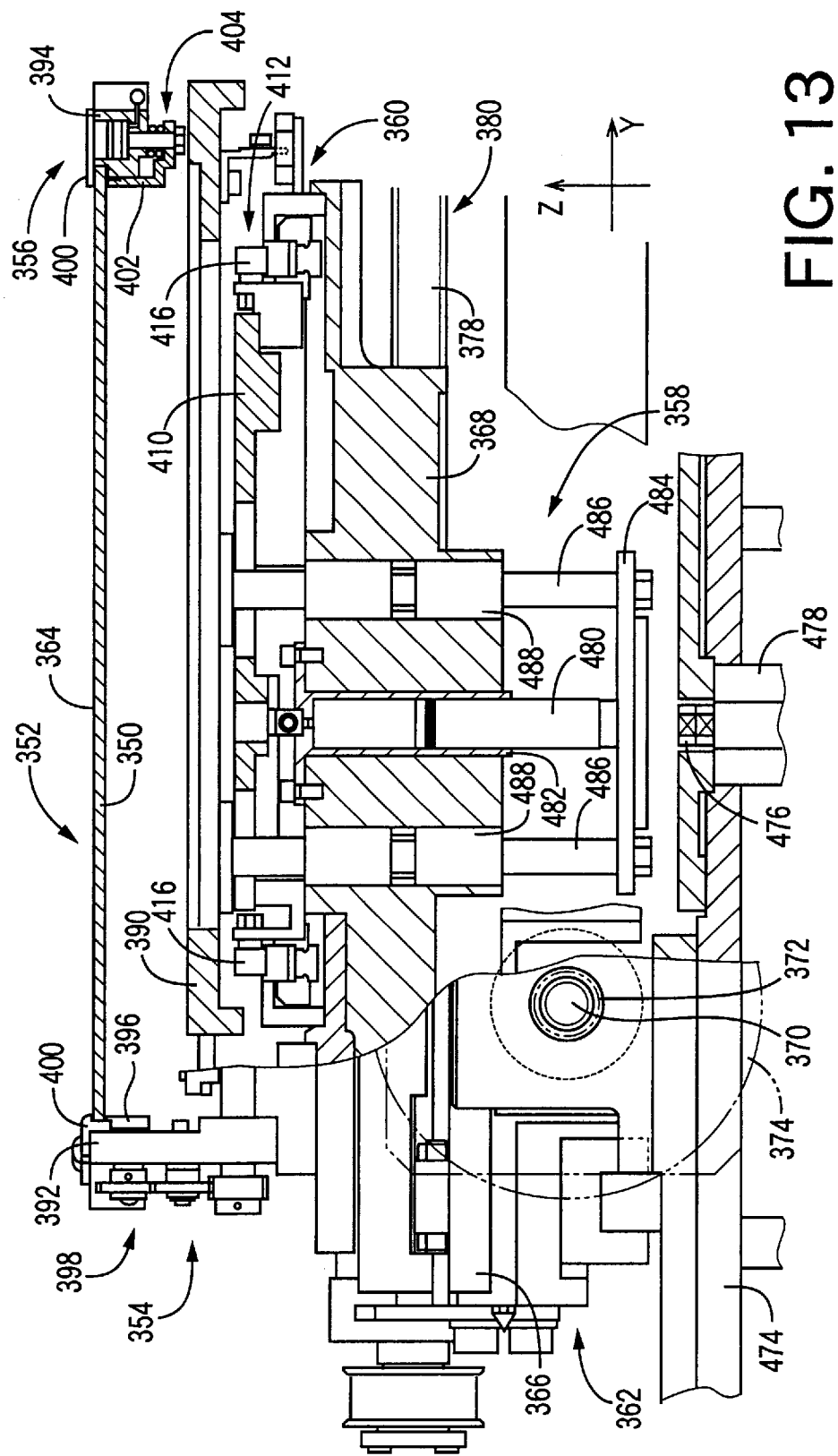
FIG. 13 is a partly cross-sectioned, enlarged front elevation view of the wiring-board supporting and moving device.

As shown in FIG. 13, the WB conveying device 354 includes a horizontal main frame 390 having a central opening, and a pair of side frames 392, 394 supported by the main frame 390. The main frame 390 is elevated and lowered by the WB-holding-device elevating and lowering device 358, and the height position of the frame 390 is adjusted, at the EC-mount height position, by the height-position adjusting device 360. Simultaneously, the side frames 392, 394 are elevated and lowered, and the height position of the frames 392, 394 is adjusted. The WB conveying device 354 additionally includes a pair of conveying belts 396 (only one belt 396 is shown in FIG. 13) which are supported by the side frames 392, 394, respectively, and extend parallel to each other; and a belt moving device 398 which moves the conveying belts 396. Thus, the WB conveying device 354 conveys the PWB 350 in the X-axis direction perpendicular to the sheet of FIG. 13. In a state in which the WB conveying device 354 is positioned at the WB-transfer height position by the WB-holding-device elevating and lowering device 358, the WB conveying device 354 conveys the PWB 350 on which the ECs 94 have been mounted, transfers the PWB 350 to a WB carry-out device, not shown, and receives, from a WB carry-in device, not shown, a PWB 350 on which ECs 94 are to be mounted, and conveys the PWB 350 to each of prescribed positions.

The WB holding device 356 includes two fixed clamp members 400 which are fixed to the two side frames 392, 394, respectively; two movable clamp members 402 (only one member 402 on the side of the side frame 394 is shown in FIG. 13) which cooperate with the fixed clamp members 400 to clamp respective end portions of the PWB 350; and a plurality of WB-hold members, not shown, which cooperate with each other to support a lower surface of the PWB 350. The movable clamp members 402 are moved toward, and away from, the fixed clamp members 400, by a drive device including air-operated cylinder devices each as an actuator. In the present embodiment, the fixed clamp members 400 and the movable clamp members 402 cooperate with each other to provide a WB-support member as a substrate-support member; and the WB holding device 356, the main frame 390, and the side frames 392, 394 cooperate with one another to provide a WB supporting device 404 as a substrate supporting device.

Figure 14:
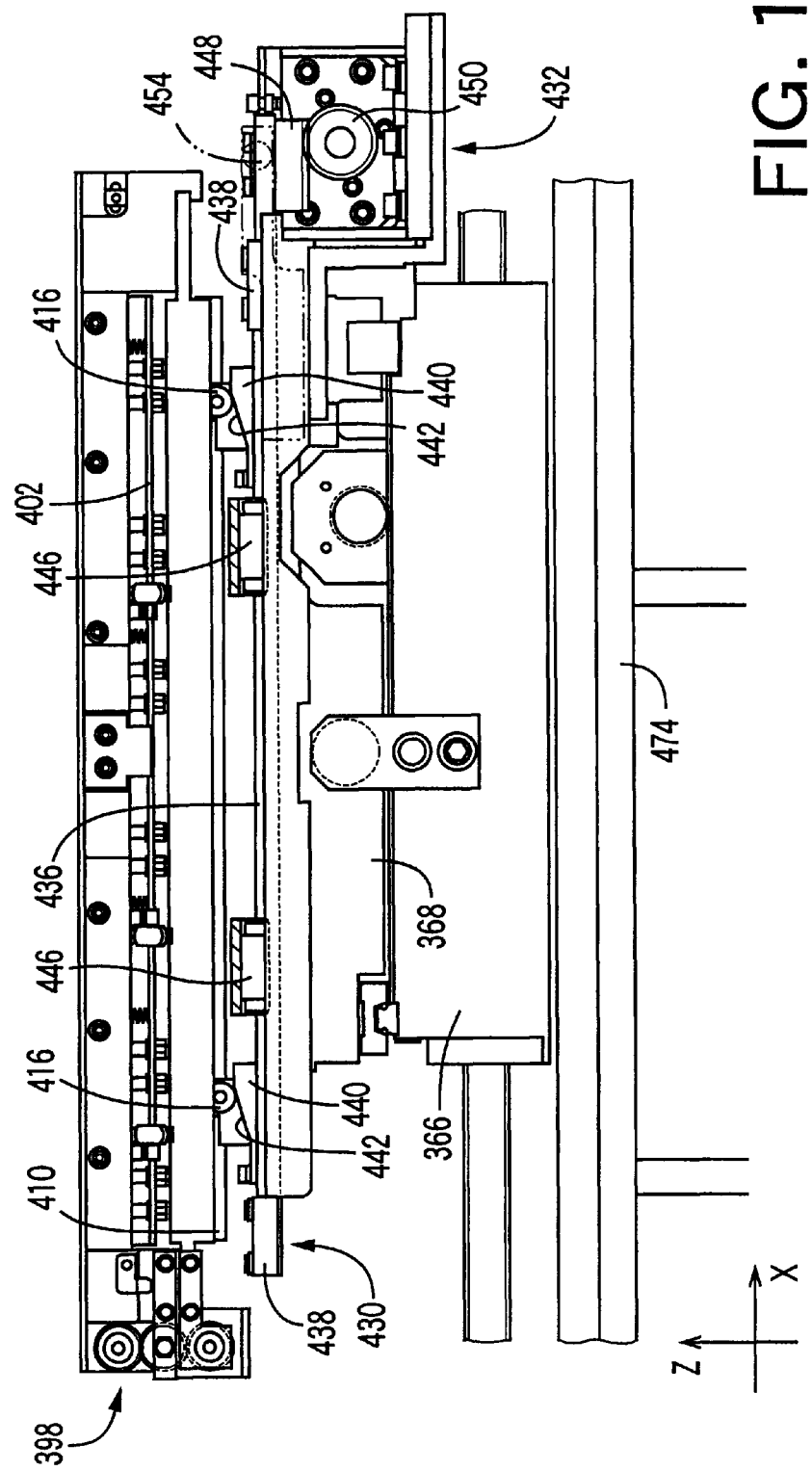
FIG. 14 is a side elevation view of a height-position adjusting device of the wiring-board supporting and moving device.
Figure 15:
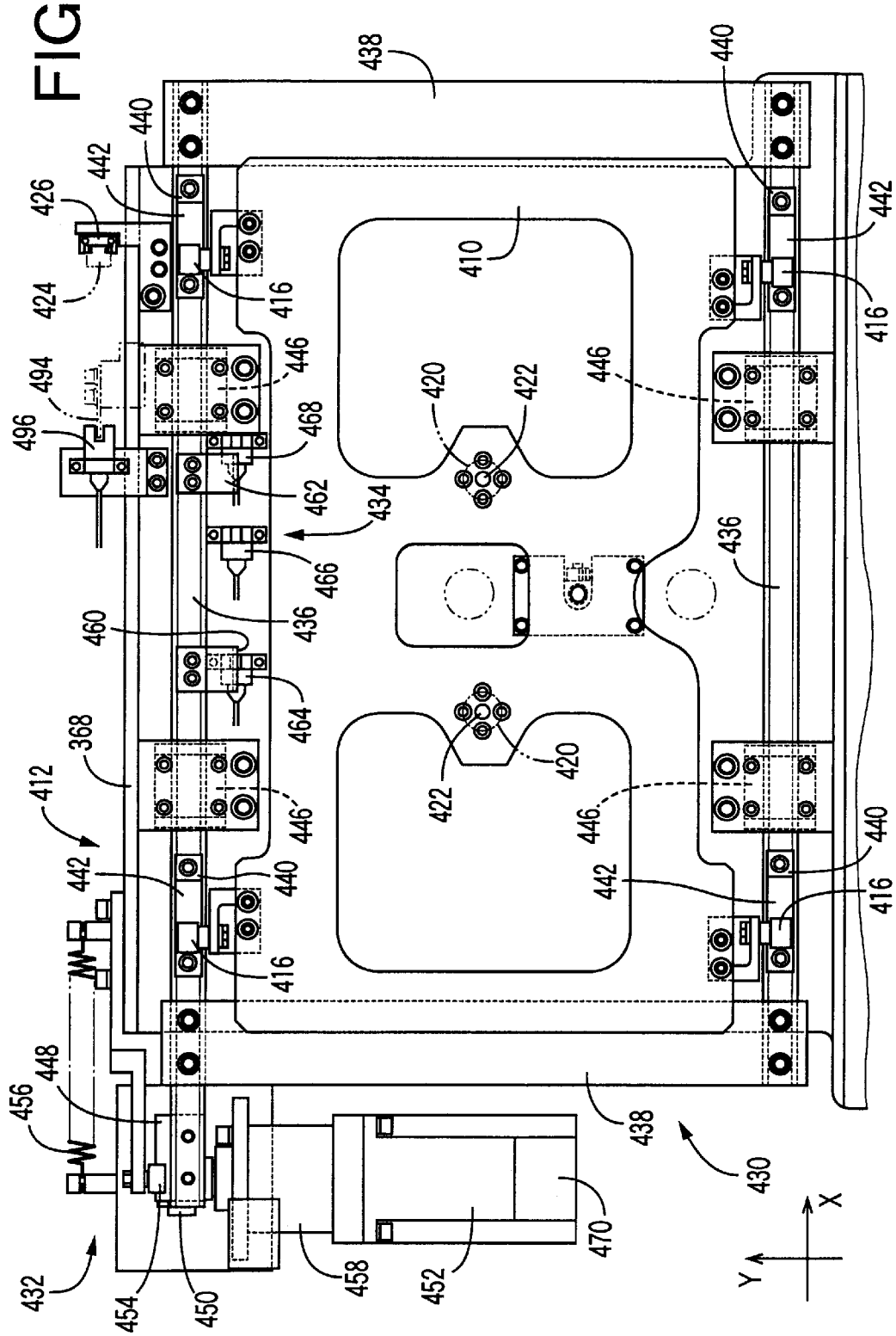
FIG. 15 is a plan view of the height-position adjusting device of the wiring-board supporting and moving device.

As shown in FIGS. 14 and 15, the height-position adjusting device 360 includes a Z table 410 which supports, at the EC-mount height position, a lower surface of the main frame 390; and a Z-table moving device 412 which moves the Z table 410 in the Z-axis direction. As is apparent from FIG. 15, the Z table 410 has, at four places on two side surfaces thereof, four rollers 416 such that each of the rollers 416 is rotatable relative to the table 410. When the four rollers 416 are moved in the Z-axis direction by the Z-table moving device 412, the Z table 410 is moved in the Z-axis direction. The Z table 410 has two positioning bushings 420 which are engaged with two positioning pins 422 fixed to the Y table 368, so that the Z table 410 and the Y table 368 are prevented from being moved relative to each other in each of the X-axis and Y-axis directions. The main frame 390 is provided with a horizontal-plane maintaining mechanism, not shown, and the main frame 390 is supported by the Z table 410 via the horizontal-plane maintaining mechanism, so that an upper surface of the main frame 390 and accordingly the upper surface of the PWB 350 can be maintained accurately horizontal. In addition, the main frame 390 is provided with a rail 424, and the Y table 368 is provided with a linear guide 426 (the rail 424 and the guide 426 are not shown in the other figures), so that the main frame 390 and the Y table 368 are smoothly moved relative to each other in the Z-axis direction while respective relative positions of the frame 390 and the table 368 in the X-axis and Y-axis directions are prevented from being deviated.

The Z-table moving device 412 includes a wedge block frame 430; a wedge-block-frame moving device 432 which moves, on the Y table 368, the wedge-block frame 430 relative to the Y table 368 in the X-axis direction; and a relative-position detecting device 434 which detects a relative position of the wedge-block frame 430 and the Y table 368 in the X-axis direction.

The wedge-block frame 430 is a rectangular frame which is obtained by connecting two rails 436 to each other with two connecting members 438, such that the two rails 436 extend parallel to each other. Respective lengthwise directions of the two rails 436 are parallel to the X-axis direction. A wedge block 440 is provided at each of two places of each of the two rails 436 (i.e., four places in total). A normal vector which is normal to an inclined surface 442 of each of the four wedge blocks 440 does not have a Y-axis-direction component, but has a Z-axis-direction component and an X-axis-direction component. The four inclined surfaces 442 are engaged with the four rollers 416 of the Z table 410, respectively. The wedge-block frame 430 is moved, by the wedge-block-frame moving device 432 described later, on the Y table 368 in the X-axis direction. Therefore, the wedge blocks 440 are also moved in the X-axis direction. However, since the rollers 416 which are engaged with those wedge blocks 440 are inhibited from being moved in the X-axis or Y-axis direction (that is, the Z table 410 having those rollers 416 is inhibited from being moved in the X-axis or Y-axis direction), the rollers 416 are rolled up on the inclined surfaces 442, while being moved upward in the Z-axis direction only. That is, when the wedge-block frame 430 and the Y table 368 are moved relative to each other in the X-axis direction, the Z table 410 is moved relative to the Y table 368 in the Z-axis direction only.

The wedge-block-frame moving device 432 includes (1) four linear guides 446 which are fixed to the Y table 368 and hold the two rails 436 such that the rails 436 are movable relative to the linear guides 446 in the X-axis direction; (2) a rack 448 which is fixed to an end portion of one of the two rails 436; (3) a pinion 350 which is engaged with the rack 448; (4) a drive motor 452 which rotates the pinion 450; (5) a hold-down roller 454 which prevents the rack 448 and the pinion 450 from being moved away from each other in a direction perpendicular to the lengthwise direction of the rack 448 and the axial direction of the pinion 450; and (6) a spring 456 which eliminates the backlash of the rack 448 and the pinion 450 which are engaged with each other. Each of the two rails 436 is hung by two linear guides 446. Thus, each rail 436 is smoothly moved relative to the Y table 368. When the pinion 450 is rotated by the drive motor 452, the engagement of the rack 448 and the pinion 450 causes the wedge-block frame 430 to be moved relative to the Y table 368 in the X-axis direction. A reduction gear 458 is provided between the drive motor 452 and the pinion 450. One end of the spring 456 is engaged with the rack 448, and the other end of the spring 456 is engaged with the Y table 368, so that the spring 456 biases the rack 448 in a rightward direction as seen in FIG. 15. In the present embodiment, the drive motor 452 is provided by a servomotor, and a rotation angle of the motor 452 is detected by an encoder 470 as a rotation detecting device.

The relative-position detecting device 434 includes two relative-position-detect plates 460, 462 which are provided on the one rail 436 to which the rack 448 is fixed; and three photo interrupters 464, 466, 468 which are provided on the Y table 368. Since the photo interrupters 464, 466, 468 detect the relative-position-detect plates 460, 462, it is possible to define an origin of the position of the wedge-block frame 430 relative to the Y table 368 in the X-axis direction, a range of movement of the frame 430 relative to the Y table 368 in the X-axis direction, and a range of upward and downward movements (i.e., an upward-movement-end position and a downward-movement-end position) of the Z table 410 relative to the Y table 368.

Figure 12:
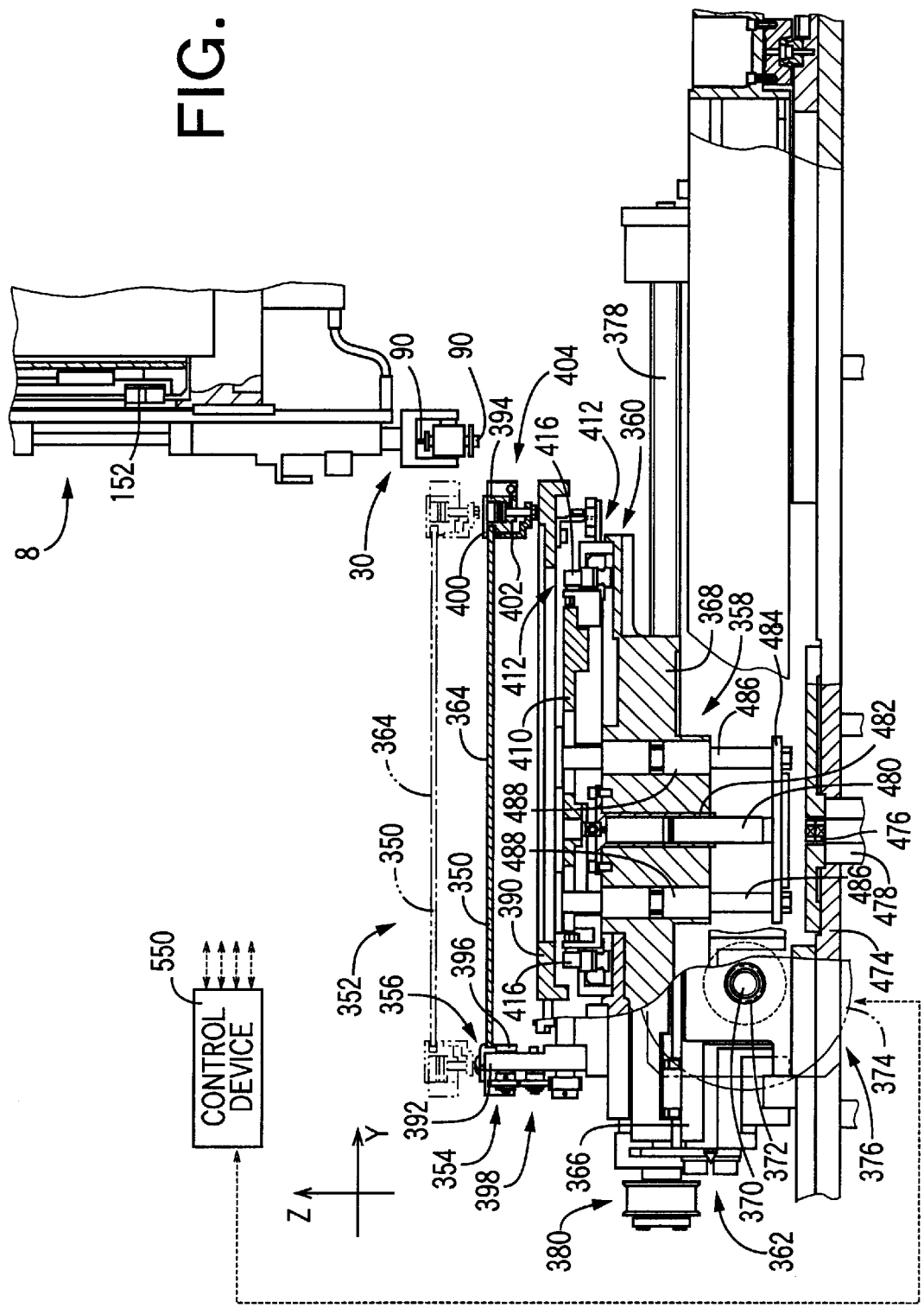
FIG. 12 is a partly cross-sectioned, front elevation view of a wiring-board supporting and moving device provided at an EC-mount position as one of the stop positions where each EC mounting unit is stopped.

As shown in FIG. 12, the WB-holding-device elevating and lowering device 358 includes (1) an air-operated cylinder device 478 which is provided on a base 474 and includes a piston rod 476; (2) an air-operated cylinder device 482 which is fixed to the Y table 368 and includes a plunger 480; (3) two guide shafts 486 whose upper ends are fixed to the main frame 390 and whose lower ends are connected to the plunger 480 via a connection member 484; (4) two guide bushings 488 which are fixed to the Y table and are fitted on the two guide shafts 486, respectively, such that the bushings 488 are movable relative to the shafts 486 in the axial direction thereof. The air cylinders 482, the guide shafts 486, and the guide bushings 488 extend in the Z-axis direction.

In a state in which the inner chamber of the air cylinder 482 is communicated with the atmosphere, the piston rod 476 of the air cylinder 478 is projected upward in the Z-axis direction. The piston rod 476 being projected upward butts on the connection member 484, thereby pushing up the connection member 484, the guide shafts 486, and the main frame 390. Thus, the PWB 350 is moved up to the WB-transfer height position indicated at two-dot-chain line in FIG. 12. On the other hand, when the inner chamber of the air cylinder 482 is supplied with a pressurized air and the inner chamber of the air cylinder 478 is communicated with the atmosphere, the plunger 480, the guide shafts 486, and the main frame 390 are moved downward, so that the main frame 390 is supported on the Z table 410 and the PWB 350 is moved down to the EC-mount height position indicated at solid line in FIG. 12. In this state, the inner chamber of the air cylinder 482 is constantly supplied with the pressurized air, so that the main frame 390 is pressed against the Z table 410 and the four rollers 416 provided on the Z table 410 are pressed against the four inclined surfaces 442, respectively. Whether the PWB 350 has been moved to the EC-mount height position can be judged by judging whether the relative-movement-detect plate 494 provided on the main frame 390 has been detected by the photo interrupter 496 provided on the Y table 368 (FIG. 15).

Figure 16:
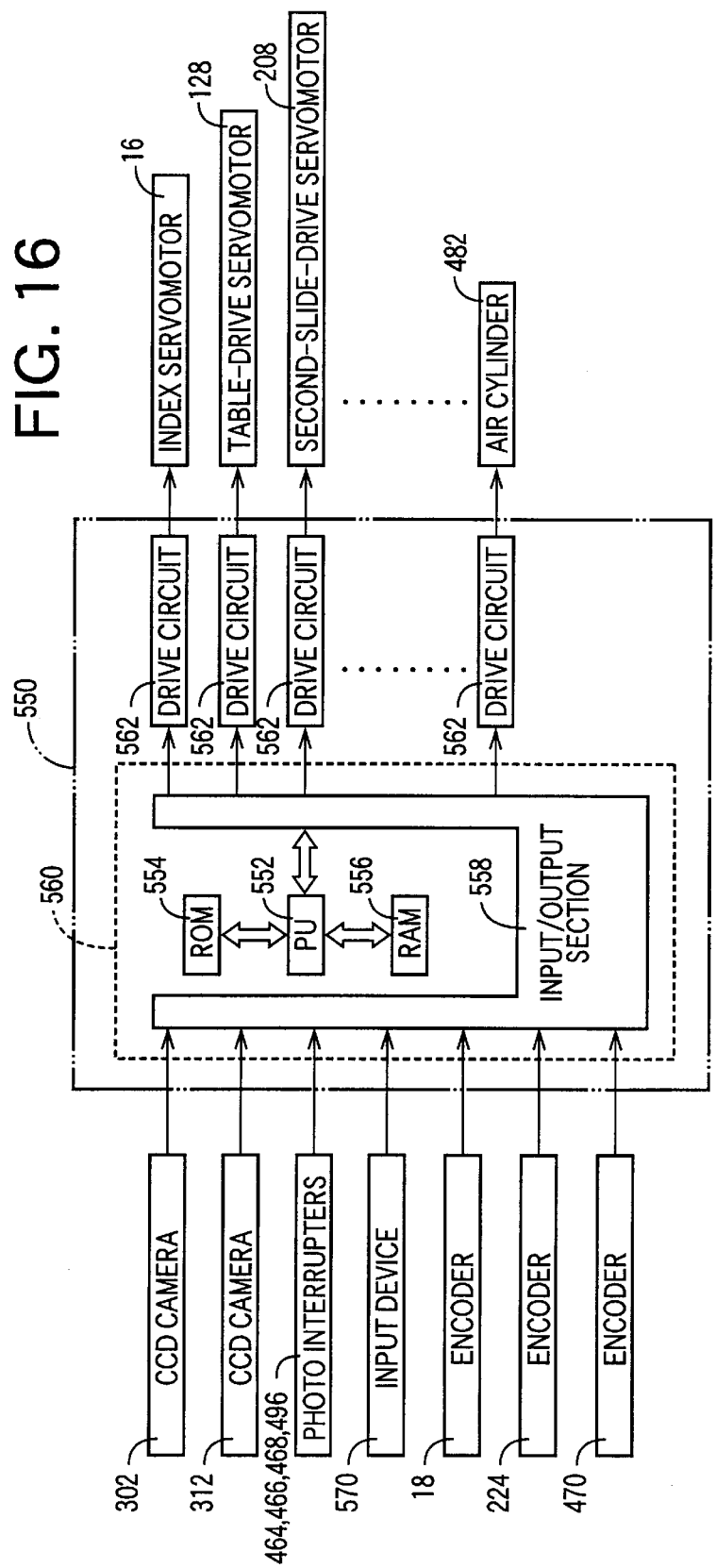
FIG. 16 is a diagrammatic view of a control device which controls an EC mounting system including the EC mounting apparatus.
Figure 25:
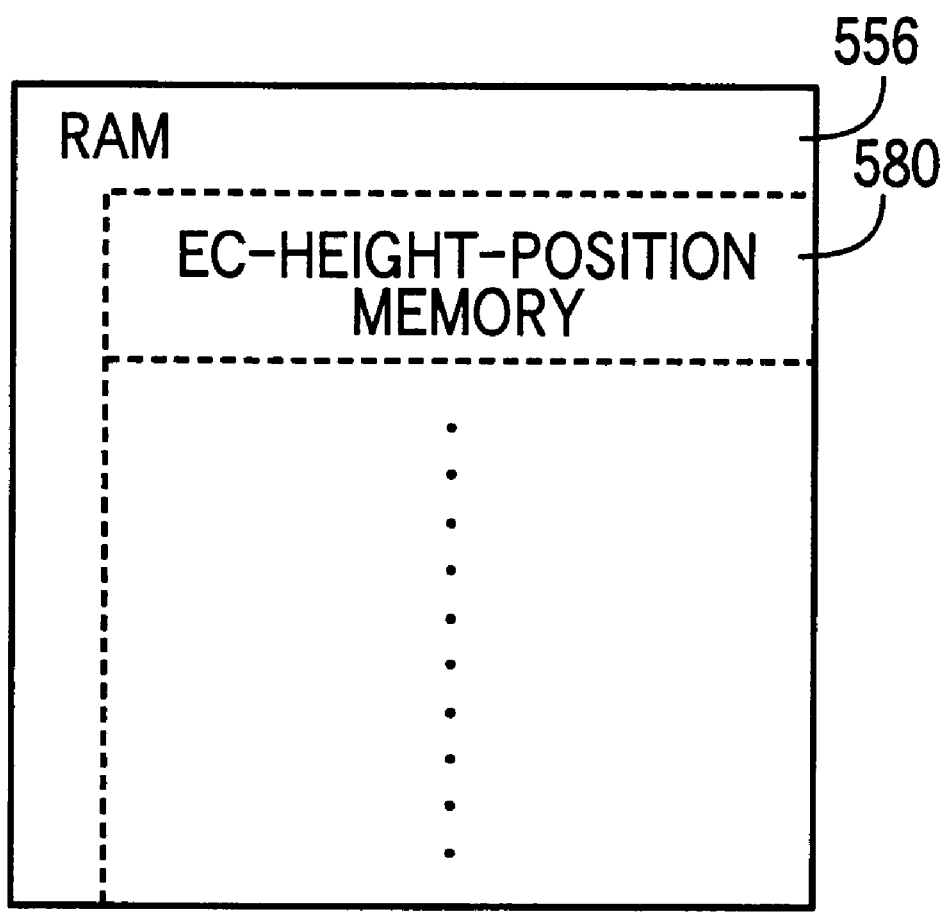
FIG. 25 is a diagrammatic view of a relevant portion of a RAM (random access memory) of a computer of the control device.

The present EC mounting system is controlled by a control device 550 shown in FIG. 16. The control device 550 is essentially provided by a computer 560 including a PU (processing unit) 552, a ROM (read only memory) 554, a RAM (random access memory) 556, and an input/output section 558. In addition to the CCD camera 302, etc., an input device 570 is connected to the input/output section 558. The input device 570 includes character keys, numeral keys, and special-operation keys, and is operated by an operator to input, e.g., data needed to carry out an EC mounting operation. Various actuators such as the index servomotor 16 are also connected to the input/output section 558 via respective drive circuits 562. The drive circuits 562 and the computer 560 cooperate with each other to provide the control device 550. The servomotors employed in the present EC mounting system, such as the index servomotor 16, are electric motors which are accurately controllable with respect to rotation angle and each of which provides a drive source. The rotation angle of each servomotor is detected by an encoder. FIG. 16 particularly shows the encoders 18, 224, 470 which are provided for the index servomotor 16, the second-slide-drive servomotor 208, and the drive motor 452, respectively. The RAM 556 provides a memory which stores the data needed to hold and mount the ECs 94, and the data obtained by detections and calculations. For example, the RAM 556 includes an EC-height-position memory 580, as shown in FIG. 25.

Next, there will be described the operation of the EC mounting system constructed as described above.

In the EC mounting system, the sixteen EC mounting units 30 are sequentially moved to the sixteen stop positions as the index table 20 is intermittently moved, so that at the EC-receive position, each unit 30 receives an EC 94 and, at the EC-mount position, each unit 30 mounts the EC 94 on the PWB 350. When the EC mounting unit 30 is moved to the EC-receive position, the rollers 48 attached to the guide rail 46 transfer from the cam groove of the cylindrical cam 40 to the engaging groove 152 of the elevator member 148 of the EC-mounting-unit elevating and lowering device 118. Before the rollers 48 has completely transferred to the engaging groove 152, the downward movement of the elevator member 148 is started, so that the EC mounting unit 30 is moved downward.

The elevating and lowering device 118 first smoothly accelerates the downward movement of the EC mounting unit 30, subsequently moves the unit 30 at a prescribed, constant speed, and smoothly decelerates the unit 30 in a terminal period of the downward movement, so that the suction nozzle 90 contacts the EC 94. In the present embodiment, the target downward-movement-end position of each suction nozzle 90 being positioned at the operative position to suck and hold an EC 94, is prescribed at a position where the nozzle 90 just contacts the upper surface of the EC 94 as the sucked surface 96 thereof when the nozzle holder 74 is moved downward to, and stopped at, its downward-movement-end position. That is, the target downward-movement-end position of the suction nozzle 90 is so prescribed that the nozzle 90 may contact the EC 94, without compressing the spring 100 or pressing the EC 94, and with its downward-movement deceleration being equal to zero. In the present embodiment, the target downward-movement-end position of the suction nozzle 90 is changed based on an error of an axial-direction position of the sucking end surface 92 of the nozzle 90 (e.g., an amount of wearing of the end surface 92 in the present embodiment) and an error of a thickness of the EC 94. This will be described later.

In the present embodiment, before an EC mounting operation is started to mount the ECs 94 on the PWB 350, a height position of the sucked surface 96 of the EC 94 fed to the EC-supply portion of each of the feeders 123 of the EC supplying device 122 is detected and stored, in the EC-height-position memory 580, in association with a sequential number identifying the each feeder 123. When the table 125 is moved, the plurality of feeders 123 are sequentially moved to the EC-height-position-detect positions where a height position of the sucked surface 96 is detected. In addition, a standard feeder 600 is attached to the table 125, and a reference height position of the sucked surface 96 is determined and stored in the EC-height-position memory 580.

The standard feeder 600 is shown in FIG. 20. The standard feeder 600 is so accurately manufactured that when the feeder 600 is attached to the upper surface of the table 125, a height position of the upper surface of the feeder 600 is equal to a reference height position. The standard feeder 600 is, like the feeders 123, positioned on, and attached, to the table 125. The reference height position is defined as a height position of an upper surface of each EC 94 which has no dimensional errors and is correctly carried by an EC carrier tape 130 which has no dimensional errors and is correctly held by a feeder 123 which has no dimensional errors and is correctly attached to the table 125. As described previously, the target downward-movement-end position of each suction nozzle 90 is defined as a position where the each nozzle 90 just contacts the EC 94 without applying a pressing force thereto, and sucks and holds the same 94, when the nozzle holder 74 reaches its downward-movement end position. Therefore, the height position of the upper surface of the standard feeder 600 can be used as the reference height position of the sucked surface 96 of each EC 94, and also as a reference target downward-movement-end position of each suction nozzle 90. The target downward-movement-end position of each suction nozzle 90 is a prescribed position to which the each nozzle 90 should be moved downward unless the nozzle 90 is contacted with the EC 94 and is prevented thereby from being further moved downward. The height position of the upper surface of the standard feeder 600 is detected by either one of the two EC-height-position detecting devices 284, and is stored as the reference height position of sucked surface 96 in the EC-height-position memory 558.

In the present embodiment, the tape-type feeders 123 and the bulk-type feeders 123, employed in the EC supplying device 122, are so designed that though the two types of feeders 123 feed the ECs 94 in the different manners and feed the ECs 94 having the different nominal thickness values, the respective upper surfaces of all the ECs 94 take, when each of the ECs 94 is positioned at the EC-supply portion, take a same height position. That is, the reference height position of sucked surface 96 is common to all the feeders 123 and all the ECs 94.

When the EC mounting apparatus 8 starts an EC mounting operation to mount ECs 94 on a PWB 350 and each of the suction nozzles 90 sucks an EC 94, the target downward-movement-end position of the each nozzle 90 is changed based on an error of a height position of the sucked surface 96 of the EC 94 and an amount of wearing of the sucking end surface 92 of the each nozzle 90, and accordingly the stroke of upward and downward movements of the each nozzle 90 is changed. Since the wearing amount of the end surface 92 is determined based on a taken image of the each nozzle 90, first, a manner in which the target downward-movement-end position of the each nozzle 90 is changed based on the error of height position of the sucked surface 96 of the EC 94 will be described, and then a manner in which the target position of the each nozzle 90 is changed based on the wearing amount of the end surface 92 will be described.

When each suction nozzle 90 sucks and holds an EC 94 supplied by a feeder 123 being positioned at the EC-supply position, the computer 560 reads, from the RAM 556, the height position of the sucked surface 96 of each EC 94 supplied by the feeder 123 that was detected in advance and stored in the EC-height-position memory 580, and compares the read height position with the reference sucked-surface height position. If the read height position is higher than the reference height position, the target downward-movement-end position of the each nozzle 90 is increased by the difference of the two height positions; and if the read height position is lower than the reference height position, the target position of the each nozzle 90 is decreased by the difference of the two height positions. The target position of the each nozzle 90 is changed by changing the driving amount of the second-slide-drive servomotor 208 to drive the second slide 202. In the present embodiment, this driving amount is determined based on a magnitude, and a direction, of an error of the detected sucked surface 96 of the EC 94 from the reference sucked-surface height position, and the reference driving amount of the servomotor 208. As will be described later, the driving amount is determined by additionally taking into consideration an axial-direction-positional error of the sucking end surface 92, after the error is detected.

The reference driving amount is determined by causing a standard suction nozzle 90' held by the nozzle holder 74 to contact a reference surface which is defined by the EC supplying device 122. The reference surface is defined by an upper surface of the standard feeder 600. In the state in which the respective positions of the elevator member 148, and the guide 182 guiding the movement of the first slide 190, have been adjusted as previously described, the second slide 202 is moved to a position corresponding to the minimum stroke of each suction nozzle 90 (i.e., a position corresponding to the highest target downward-movement-end position of the each nozzle 90), and the rotary cam 174 is rotated to a position corresponding to the downward-movement-end position of the nozzle holder 74. Then, an operator accurately attaches a standard suction nozzle 90' to the nozzle holder 74. In the state in which the stroke of the standard nozzle 90' takes the minimum value, the sucking end surface 92' of the standard nozzle 90' does not contact the upper surface of the standard feeder 600, even if the nozzle holder 74 is lowered to its downward-movement-end position and accordingly the standard nozzle 90' is lowered to its target downward-movement-end position. Hence, from this state, the second slide 202 is moved in a direction to increase the stroke of the standard nozzle 90', till the standard nozzle 90' contacts the upper surface of the standard feeder 600 in the state in which the standard nozzle 90' is held at its advancement-end position. Whether the standard nozzle 90' has contacted the upper surface of the standard feeder 600 may be judged by an operator who uses an inspecting jig such as a clearance gauge. Alternatively, this may be done by operator's eyes which can narrowly see the light, emitted by the lighting device, that passes through a very small clearance left between the sucking end surface 92' and the upper surface of the standard feeder 600.

The driving amount of the second-slide-drive servomotor 208 needed to cause the sucking end surface 92' to contact the upper surface of the standard feeder 600 (i.e., the rotation angle of the motor 208 measured by the encoder 224 from the origin), is stored as the reference driving amount in the RAM 556 of the computer 560. The position of the standard nozzle 90' in the state in which the sucking end surface 92' thereof just contacts the upper surface of the standard feeder 600 will be referred to as a reference target downward-movement-end position; and the position of the second slide 202 in the same state will be referred to as a reference slide position. In the present embodiment, the respective sucked surfaces 96 of the different sorts of ECs 94 take the same height position, as described previously. Therefore, the reference target downward-movement-end position of each suction nozzle 90 is common to all the sorts of ECs 94.

When each suction nozzle 90 sucks and holds an EC 94, the driving amount of the servomotor 208 is changed based on the height-position error of the sucked surface 96 of the EC 94, so that the target downward-movement-end position of the each nozzle 90 is changed. The height-position error of the sucked surface 96 is determined based on the actual height position of the sucked surface 96 of each EC 94 stored in the EC-height-position-error memory 580, and the reference sucked-surface height position. A relationship between the target downward-movement-end position of each nozzle 90 and the driving amount of the servomotor 208 is, in the present embodiment, approximated by a quadratic function, and the diving amount of the servomotor 208 is calculated based on the height-position error of the sucked surface 96 of the EC 94, and the reference driving amount of the servomotor 208. In other words, the diving amount of the servomotor 208 is so calculated that the reference target downward-movement-end position is changed to a new target position which is deviated from the reference target position by an amount corresponding to the height-position error of the sucked surface 96 of the EC 94. When the target downward-movement-end position of each nozzle 90 is changed, the second slide 202 is moved to increase or decrease the distance between the position where the connection portion 196 of the connecting rod 156 is connected to the lever 160, and the axis line about which the lever 160 is pivoted. If the actual height position of the sucked surface 96 is higher than the reference sucked surface height position, the target downward-movement-end position of the each nozzle 90 is changed to be higher than the reference position; and if the actual height position of the sucked surface 96 is lower than the reference sucked-surface height position, the target position of the each nozzle 90 is changed to be lower than the reference position. This changing is effected, each time the current feeder 123 being positioned at the EC-supply position is changed with a new feeder 123, based on the determined height-position error of the sucked surface 96 of each EC 94 fed to the EC-supply portion of the new feeder 123, and the reference driving amount of the servomotor 208.

Figure 19:
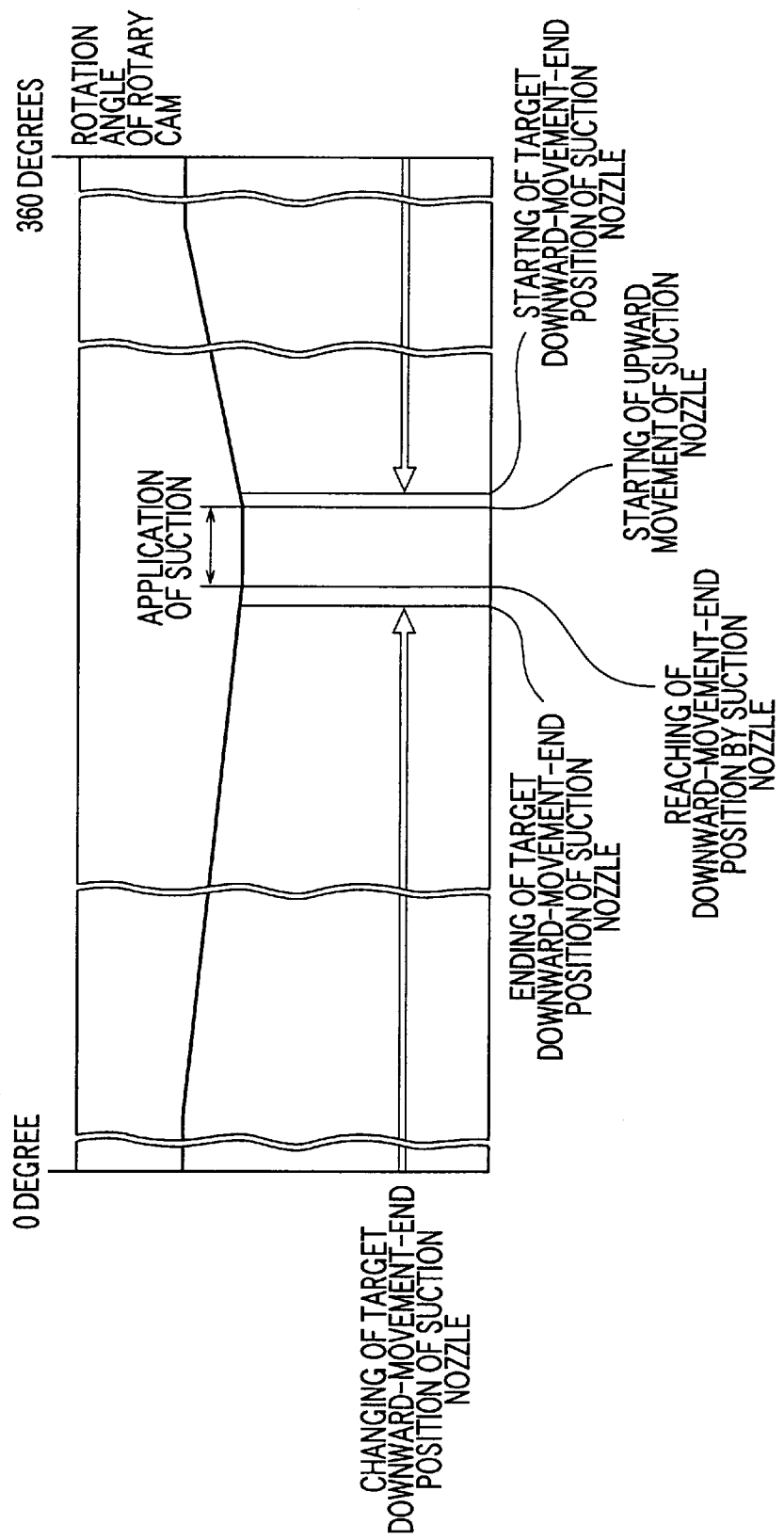
FIG. 19 is a view for explaining a relationship between the upward and downward movements of a nozzle holder, and the changing of the target downward-movement-end position of each suction nozzle, both of which occur while a rotary cam of the EC-mounting-unit elevating and lowering device is rotated by 360 degrees.

The changing of the target downward-movement-end position of the suction nozzle 90 may be effected during the upward and downward movements of the nozzle 90, or in the state in which the nozzle 90 is positioned at its upward-movement-end position. In either case, the changing is effected during one full rotation of the rotary cam 174 of the EC-mounting-unit elevating and lowering device 118. However, as illustrated in FIG. 19, it is preferred that the changing of the stroke of each suction nozzle 90 be ended before the nozzle 90 contacts the EC 94, and it is more preferred in view of possible errors that the changing be ended more or less earlier than the time when the nozzle 90 contacts the EC 94. If the changing, e.g., decreasing, of the stroke has not been ended at a time when the nozzle 90 will contact the EC 94, then the nozzle 90 moving downward would collide with the EC 94. More specifically described, if the changing has not been finished, then the current downward-movement-end position has not been changed to a new target position higher than the current target position, so that the nozzle 90 would contact the EC 94 at a speed higher than zero, i.e., with some impact. In the case where the stroke is increased, when the rotary cam 174 has been rotated to a rotation position corresponding to the downward,movement-end position of the nozzle holder 74, the suction nozzle 90 has not reached a new target downward-movement-end position lower than an old target position, so that the nozzle 90 would not collide with the EC 94. However, the nozzle 90 may apply suction to the EC 94, at a position away from the EC 94. When the first slide 190 is further moved relative to the lever 160 to complete the changing of the stroke, the nozzle 90 reaches the new target position where the nozzle 90 contacts the EC 94 and sucks and holds the same 94.

In addition, as illustrated in FIG. 19, it is preferred that the changing of the target downward-movement-end position of each suction nozzle 90 be started after the suction nozzle 90 preceding the each nozzle 90 has started moving upward and the EC 94 held by the preceding nozzle 90 has taken off the bottom surface of the EC accommodating pocket 136. For example, in the case where the current target downward-movement-end position of the each nozzle 90 is changed to a new target position lower than the current target position, i.e., the stroke is increased, if the changing of the current target position is started before the EC 94 held by the preceding nozzle 90 has taken off the bottom surface of the pocket 136, then the preceding nozzle 90 is moved relative to the rotary holder 86 while compressing the spring 100 and thereby applying a pressing force to the EC 94.

However, it is not essentially required that the changing of the target downward-movement-end position be effected in the state in which there is no possibilities that the EC 94 may be subjected to any impact or pressing force. That is, the changing may be finished after the suction nozzle 90 contacts the EC 94, and may be started before the nozzle 90 starts moving upward, because the impact or pressing force applied to the EC 94 is small, if any, and because the impact or pressing force is a force applied to the EC 94 in a vertical direction and the vertical-direction force less adversely influences the holding of the EC 94 by the nozzle 90 than a force applied to the EC 94 in a direction perpendicular to the axial direction of the nozzle 90. In the present embodiment, some of the feeders 123 are the tape-type feeders 123 each of which feeds the emboss-type EC carrier tape 130, and a space is left under the EC accommodating portion 134 of the tape 130. Therefore, even if any impact or pressing force is applied to an EC 94, it will be sufficiently absorbed by the elastic deformation of the tape 130, so that no excessive force is applied to the EC 94.

The rotary cam 174 is rotated just one time in one cycle time of each EC mounting unit 30, i.e., a time duration from a time when the unit 30 is stopped at one of the sixteen stop positions to a time when the unit 30 is moved to, and stopped, at the next stop position adjacent to the one stop position. During the one-time rotation of the cam 174, the target downward-movement-end position of the suction nozzle 90 is changed. Therefore, even if the target position is changed, the cycle time of the unit 30 is not increased, and accordingly the efficiency of mounting of ECs 94 is not lowered.

The error of the height position of the sucked surface 96 of the EC 94 from the reference height position includes all errors that may result from all possible causes each of which produces a height-position error of the sucked surface 96 of the EC 94; such as the manufacturing errors of the main frame 139, an error with which the feeder 123 is attached to the table 125, the manufacturing errors of the EC 94, and the manufacturing errors of the EC carrier tape 130. Since the target downward-movement-end position of the suction nozzle 90 is changed based on the error of the height position of the sucked surface 96 of the EC 94 from the reference height position, the frequency at which each suction nozzle 90 fails to hold an EC 94.

When each feeder 123 is moved to one of the two EC-height-position-detect positions after having supplied one or more ECs 94, a height position of the sucked surface 96 of the EC 94 being positioned at the EC-supply portion, i.e., the next EC 94 to be sucked is detected. Hence, when the EC 94 positioned at the EC-supply portion is sucked by a suction nozzle 90, the target downward-movement-end position of the nozzle 90 is changed based on the height position of the sucked surface 96 of the EC 94 itself.

There is a general rule that when the EC supplying device 122 supplies the ECs 94, the table 125 is moved forward in the X-axis direction at a predetermined pitch (i.e., a distance equal to the predetermined pitch at which the feeders 123 are attached to the table 125), so that the feeders 123 are sequentially positioned at the EC-supply position to supply respective ECs 94 and, after all the feeders 123 have supplied the respective ECs 94, all the feeders 123 are returned to their supply-start position without supplying any ECs 94, or moved backward while supplying respective ECs 94. In either case, after each of the feeders 123 has supplied one EC 94, the each feeder 123 is moved to either one of the two EC-height-position-detect positions, before the each feeder 123 supplies the next EC 94, so that a height position of the sucked surface 94 of the next EC 94 positioned at the EC-supply portion is detected and, when the next EC 94 is sucked by a suction nozzle 90, the target downward-movement-end position of the nozzle 90 is changed based on the detected height position of the sucked surface 96. In the case where one feeder 123 successively supplies two or more ECs 94, a height position of the sucked surface 96 of each of the second or following ECs 94 out of the two or more ECs 94 is not detected, and the detected height position of the sucked surface 96 of the first EC 94 out of the two or more ECs 94 is used to change the target downward-movement-end position of each of one or more suction nozzles 90 which are to suck and hold the second or following ECs 94. In the case where the feeders 123 supply the ECs 94 while being moved forward and backward, one or more of the feeders 123 may not be moved to either one of the two EC-height-position-detect positions. In the last case, the last detected height position of the sucked surface 96 is used. In the present embodiment, when each of the feeders 123 supplies the first EC 94 after the EC mounting operation is started, the target downward-movement-end position of the suction nozzle 90 to suck the first EC 94 is changed based on the height position of the sucked surface 96 that was detected and stored in the EC-height-position memory 580 before the EC mounting operation is started; and after the each feeder 123 has supplied one or more ECs 94, the target position of suction nozzle 90 is changed based on the height position of sucked surface 96 that was detected when the each feeder 123 is moved to one of the two EC-height-position-detect positions.

In the case where the current target downward-movement-end position of each suction nozzle 90 is changed to a new target position lower than the reference target position, based on the height-position error of the sucked surface 96 of EC 94, the stroke of the nozzle 90 is so increased that the each nozzle 90 reaches, and stops at, the new target position, and contacts the EC 94, when the nozzle holder 74 reaches its downward-movement-end position, even if the sucked surface 96 is lower than the reference height position. That is, the nozzle 90 contacts the EC 94 at a downward-movement speed substantially equal to zero, i.e., without applying any impact thereto, and sucks and holds the EC 94 without applying any pressing force thereto. On the other hand, in the case where the current target position of each suction nozzle 90 is changed to a new target position higher than the reference target position, the stroke of the nozzle 90 is so decreased that the nozzle 90 contacts the EC 94, when the nozzle holder 74 reaches its downward-movement-end position, even if the sucked surface 96 is higher than the reference height position. Likewise, the nozzle 90 contacts the EC 94 without applying any impact thereto. In either case, if the nozzle 90 contacts the EC 94 before reaching the new target downward-movement-end position, then the nozzle 90 is retracted into the rotary holder 86, while compressing the spring 100. The compression of the spring 100 absorbs the excessive distance of downward movement of the nozzle 90, thereby preventing the EC 94 from being broken by the nozzle 90. That is, the spring 100 functions as a cushion device. The amount of compression of the spring 100 caused by the nozzle 90 is very small, and accordingly the pressing force produced by the compressed spring 100 is applied to the EC 94 with no problem. On the other hand, if the nozzle 90 reaches, and stops at, the new target downward-movement-end position, before contacting the EC 94, then a space is left between the sucking end surface 92 of the nozzle 90 and the sucked surface 96 of the EC 94. However, the space is very small. Therefore, the nozzle 90 can apply suction to the EC 94 and hold the same 94. Thus, even if the height position of the sucked surface 96 may have some error, the nozzle 90 can contact the EC 94 at a downward-movement speed substantially equal to zero, without applying excessive impact to the EC 94 or braking the same 94. In addition, the distance of downward movement of the nozzle 94 is effectively preventing from being short, so that the nozzle 90 is freed from the problems that the nozzle 90 fails to reach or hold an EC 94, or holds an EC 94 having a great positional error or taking a lying-on-its-side posture. Since each suction nozzle 90 can reliably hold an EC 94, the EC mounting apparatus 8 is prevented from being interrupted by the occurrence of a failure to hold an EC 94, and accordingly the production efficiency of the apparatus 8 is prevented from being lowered. In particular, since, before an operation is started, a height position of the sucked surface 96 of an EC 94 is detected and the downward and upward movements of a suction nozzle 90 to suck the EC 94 are controlled based on the detected height position, the nozzle 90 is prevented from failing to suck the EC 94, even if the EC 94 may have an error relative to a nominal dimension or may have an error resulting from its secular change.

After the suction nozzle 90 contacts the sucked surface 96 of the EC 94, and holds the EC 94 by applying the negative pressure thereto, the nozzle 90 is moved upward, and then is moved to, and stopped at, the next stop position. During this movement, the suction nozzle 90 holds and conveys the EC 94 in a state in which the nozzle 90 is held at its advancement-end position by the spring 100. Meanwhile, at the EC-posture-detect position, the image taking device 300 takes an image of the EC 94 held by the nozzle 90. A batch of image data representing the taken image is compared with a batch of correct image data representing a correct image having no errors, and respective positional errors, $\Delta X_E$, $\Delta Y_E$, of a center of the EC 94 in the X-axis and Y-axis directions on the horizontal plane, and a rotation-position error, $\Delta \theta$, of the EC 94 about its center are determined by the computer 560. In addition, whether the nozzle 90 is holding an EC 94 is judged by the computer 560. If a negative judgment is made, a set of data indicating the fact is produced and stored, so that the set of data may be used to control the EC mounting units 30. Moreover, dimensions of a transverse cross section of the EC 94 held by the nozzle 90, i.e., a cross section taken along a plane perpendicular to the axis line of the EC 94, e.g., respective lengths of two sides of the cross section that intersect each other are determined.

Next, at the mounted-surface-detect position, the image-taking device 310 takes an image of the lower end portion of the suction nozzle 90 and the EC 94 held by the nozzle 90, as viewed in a direction perpendicular to the axial direction of the nozzle 90. Based on a batch of image data representing the taken image, a position of the mounted surface 98 of the EC 94 in the axial direction of the nozzle 90 and a position of the sucking end surface 92 of the nozzle 90 in the same direction are determined by the computer 560; and based on the thus determined positions, a thickness of the EC 94 is determined by the same 560.

Based on the thickness of the EC 94, and the dimensions of the transverse cross section of the EC 94 determined based on the image taken at the EC-posture-detect position, whether the EC 94 actually held by the suction nozzle 90 is a correct sort of EC 94 that should be held by the nozzle 90 is judged by the computer 560. In addition, based on the batch of image data, whether the EC 94 held by the nozzle 90 is taking a posture which allows the EC 94 to be mounted on the PWB 350, for example, whether the EC 94 held by the nozzle 90 is taking a lying-on-its-side posture is judged by the computer 560; and whether the EC94 held by the nozzle 90 is taking respective positions in the X-axis and Y-axis directions perpendicular to the axial direction of the nozzle 90 that allow the EC 94 to be mounted on the PWB 350, that is, whether the EC 94 held by the nozzle 94 is so largely deviated out of position that the EC 94 cannot be mounted on the PWB 350 is judged by the computer 360. If the nozzle 90 is not holding the correct sort of EC 94, if the nozzle 90 is holding the EC 94 taking the lying-on-its-side posture, or if at least one of the respective errors of the respective positions of the EC 94 in the directions perpendicular to the axial direction of the nozzle 90 is greater than a reference amount, then a set of data indicating the fact is produced and stored, so that the mounting unit 30 or the nozzle 90 may not carry out an EC mounting action at the EC-mount position and may discard the EC 94 taking the incorrect posture, at the EC-discard position.

On the other hand, if the suction nozzle 90 is holding the correct sort of EC 94 taking the correct posture that can be mounted on the PWB 350, then the axial-direction position of the mounted surface 98 of the EC 94 is compared with a correct position, and an error of the axial-direction position of the mounted surface 98 is determined by the computer 560. Since an image of the suction nozzle 90 being positioned at the operative position and the EC 94 held by the nozzle 90 is taken in the state in which the EC mounting unit 30 is stopped at the mounted-surface-detect position and the nozzle 90 is held at its advancement-end position by the biasing force of the spring 100, the axial-direction position of the nozzle 90 is known in advance. The axial-direction position of the nozzle 90 is defined by a position of a portion thereof whose position relative to the nozzle holder 74 in the axial direction is not changed by the manufacturing errors of the nozzle 90 and/or the wearing of the sucking end surface 92, for example, a portion of the nozzle 90 that is held by the nozzle holder 74. Although the nozzle 90 is held by the rotary holder 86 as part of the nozzle holder 74 such that the nozzle 90 is movable relative to the rotary holder 86 in the axial direction of the nozzle 90, the axial-direction position of the nozzle 90 is discussed here with respect to the state in which the nozzle 90 is taking a prescribed position relative to the rotary holder 86 and, in the present embodiment, with respect to the state in which the nozzle 90 is held at its advancement-end position. Thus, the axial-direction position of the nozzle 90 is known, and the correct position of the sucking end surface 92 (on the assumption that the nozzle 90 has no manufacturing errors and the sucking end surface 92 has no wearing) and the correct position of the mounted surface 98 (on the assumption that the EC 94 has no dimensional errors) are known. That is, respective positions where respective images of the sucking end surface 92 and the mounted surface 98 taking the respective correct positions are formed on the image-take surface of the CCD camera 312 are known, and there is a set of correct position data which is compared with a set of actual position data representing respective actual positions of the sucking end surface 92 and the mounted surface 98 that are determined based on the actually taken image of the sucking end surface 92 and the mounted surface 98. In the present embodiment, all the sorts of suction nozzles 90 have the same length, and accordingly the respective correct positions of the sucking end surfaces 92 of the different sorts of nozzles 90 are equal to each other and are stored in the RAM 556 of the computer 560. The correct position of the mounted surface 98 is determined in advance based on the correct position of the sucking end surface 92 and the correct thickness of the EC 94, and is stored in association with the particular sort of EC 94 in the RAM 556. Therefore, based on the actual axial-direction position of the mounted surface 98 determined based on the image data, and the correct axial-direction position of the same 98, an error of the axial-direction position of the mounted surface 98 of the EC 94 is determined, and is stored, in the RAM 556, with a set of data identifying the nozzle 90 holding the EC 94, so that the thus determined positional error of the mounted surface 98 of the EC 94 can be associated with the nozzle 90 holding the EC 94. This positional error consists of a magnitude and a direction.

In addition, based on the axial-direction position of the sucking end surface 92 of the suction nozzle 90, an amount of wearing or bending of the nozzle 90 is detected. More specifically described, the actual position of the sucking end surface 92 is compared with the correct position of the same 92, and the thus determined difference of the tow positions is compared with a prescribed value. If the difference is not smaller than the prescribed value, it is judged that the nozzle 90 is so worn that the nozzle 90 should be replaced with a new one. Even if the difference, i.e., the amount of wearing is smaller than the prescribed value, the difference is stored, in the RAM 556, in association with a set of data identifying the nozzle 90. In addition, whether the lower end of the nozzle 90 is deviated not less than a prescribed amount from its axis line, in a direction perpendicular to the axis line, is judged and, if a positive judgment is made, it is judged that the nozzle 90 is so bent that the nozzle 90 should be replaced with a new one. If the nozzle 90 is so worn or bent and needs to be replaced with a new one, a set of data indicating that the nozzle 90 be replaced with a new one is prepared and stored by the computer 560.

In the present embodiment, the detection of wearing or bending of each suction nozzle 90 is carried out, not each time the each nozzle 90 is moved to the mounted-surface-detect position to take an image, but each time the total number of ECs 94 mounted on the PWB or PWBs 350 by the each nozzle 90 reaches a prescribed number. In the present embodiment, each of the EC mounting units 30 employed in the EC mounting apparatus 8 holds the plurality of suction nozzles 90 including at least two different sorts of nozzles 90, and selectively positions an appropriate one of the nozzles 90 at the operative position. Those different sorts of nozzles 90 may be used at different frequencies, or may have different degrees of durability. Therefore, the above-indicated number is so prescribed for each sort of nozzles 90 that wearing or bending of the each nozzle 90 can be detected without delay. For example, since a suction pipe 91 having a small diameter is more easily worn than a suction pipe 91 having a large diameter, a smaller number is prescribed for a suction nozzle 90 having a small diameter, than a number prescribed for a suction nozzle 90 having a large diameter. The computer 560 counts, for each of the nozzles 90 of each of the units 30, the total number of ECs 94 which have been mounted by the each nozzle 90 and, if the counted number reaches the prescribed number associated with the each nozzle 90, judges whether the each nozzle 90 has an excessive wearing or bending. Since the number of ECs 94 mounted on the PWB 350 by each nozzle 90 is equal to the number of ECs 94 held by the each nozzle 90, in fact, the computer 560 counts the number of ECs 94 held by each nozzle 90, as the number of ECs 94 mounted by the each nozzle 90. When the computer 560 judges that the number of ECs 94 held by each nozzle 90 has reaches the prescribed number, the each nozzle 90 is being positioned at the operative position, so that based on an image of the each nozzle 90 taken at the mounted-surface-detect position, it is judged whether the each nozzle 90 has an excessive wearing or bending. A set of data representing the result of judgment is stored, in the RAM 556 of the computer 560, in association with the set of data identifying the each nozzle 90. In the present embodiment, each time each suction nozzle 90 holds an EC 94, an axial-direction position of the sucking end surface 92 of the each nozzle 90 is determined to determine a thickness of the EC 94. However, an axial-direction position of the sucking end surface 92 of each nozzle 90 is determined to judge whether the sucking end surface 92 of the each nozzle 90 has an excessive wearing or bending, each time the each nozzle 90 has mounted the prescribed number of ECs 94. The image of the sucking end surface 92 and the mounted surface 98 is automatically taken, at one of the plurality of stop positions where each EC mounting unit 30 is stopped, at a timing when the image taking operation does not adversely influences the production of the printed circuit board.

After the image taking operation, each EC mounting unit 30 is moved to the EC-posture-correct position, where the nozzle holder 74 is rotated about its own axis line by the EC-posture correct device to correct the rotation-position error Δ θ of the EC 94, to zero.

After the above-described correction, the EC mounting unit 30 is moved to the EC-mount position, where the unit 30 is lowered, by the EC-mounting-unit elevating and lowering device 120, to mount the EC 94 on the PWB 350. Before the transferring of the rollers 48 attached to the guide rail 46 from the cam groove of the cylindrical cam 40 to the engaging groove 152 of the elevator member 148 of the elevating and lowering device 120 is completed, the downward movement of the elevator member 148 is started, so that the downward movement of the unit 30 is started. The stroke of upward and downward movements of the suction nozzle 90, i.e., the target downward-movement-end position of the nozzle 90 is determined in advance. The nozzle 90 first is smoothly accelerated, subsequently is moved at a constant speed, and then is smoothly decelerated. The deceleration is started at a position corresponding to the predetermined stroke.

When the EC 94 is mounted on the PWB 350, the PWB 350 is moved along the horizontal plane by the X-Y table 362, so that each EC-mount place on the PWB 350 is positioned at a position right below the suction nozzle 90 which belongs to the EC mounting unit 30 being positioned at the EC-mount position and which is being positioned at the operative position. To this end, respective movement amounts of the X table 366 and the Y table 368 are modified to correct the above-explained center-position errors $\Delta X_E$, $\Delta Y_E$ of the EC 94, respective errors of the X-axis-direction and Y-axis-direction positions of the center of the EC 94 caused by the above-explained correction of the rotation-position error Δ θ of the EC 94, and respective errors, $\Delta X_P$, $\Delta Y_P$, of X-axis-direction and Y-axis-direction positions of each EC-mount place on the PWB 350.

Figure 17:
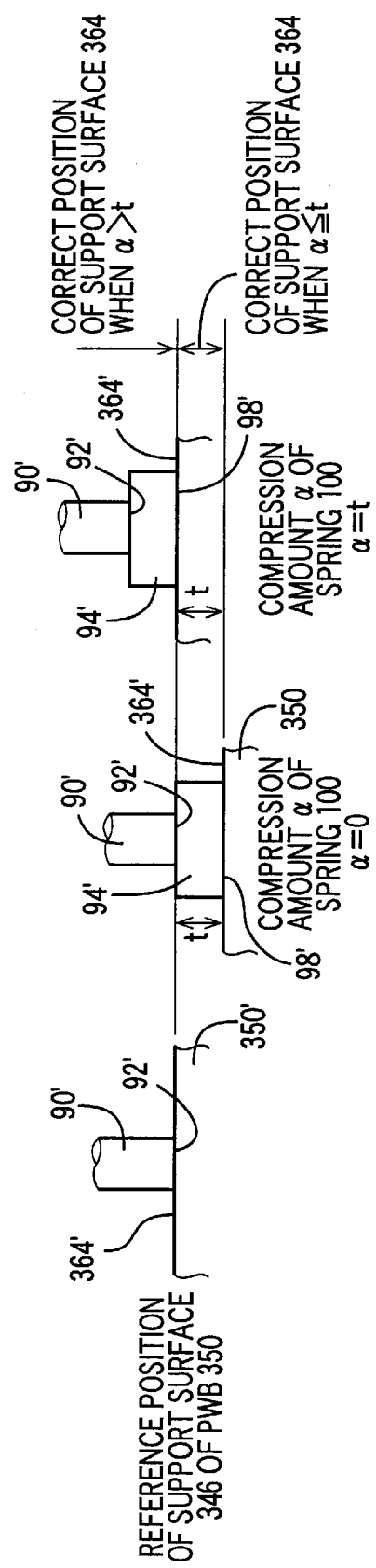
FIG. 17 is a view for explaining a manner in which a height position of a support surface of a printed wiring board is adjusted when an EC is mounted on the wiring board which is supported by a wiring-board supporting device of the wiring-board supporting and moving device.

In addition, the PWB 350 is elevated or lowered by the height-position adjusting device 360, according to the determined position of the mounted surface 98 of the EC 94, so that a height position of the support surface 364 of the PWB 350, i.e., a position of the surface 364 in the directions in which the surface 364 is moved toward, and away from, the suction nozzle 90, is adjusted. In the present embodiment, the adjustment of the height position of the support surface 364 is done by determining a reference position of the surface 364 and determining a target position of the surface 364 relative to the determined reference position. The target position of the support surface 364 is so determined that the EC 94 held by the nozzle 90 may be mounted on the support surface 364 without any axial-direction-positional error. Thus, the target position is a correct position. As illustrated in FIG. 17, in the present embodiment, a standard suction nozzle 90' having no manufacturing errors or no sucking end surface wearing is correctly held by the nozzle holder 74 and is moved downward to a downward-movement-end position and, in this state, a standard PWB 350' is caused to contact a sucking end surface 92' of the nozzle 90'. The standard PWB 350' has no manufacturing errors, and is correctly held by the holding device 356. The standard PWB 350' being positioned at the EC-mount height position is elevated by the height-position adjusting device 360, to a position where a support surface 364' of the PWB 350' contacts the sucking end surface 92' of the standard nozzle 90', without moving the nozzle 90' into the rotary holder 86 against the biasing force of the spring 100', and this position is determined as the reference position of the support surface 364. The downward-movement-end position of the standard suction nozzle 90' is a prescribed position to which the nozzle 90' should be moved downward unless the EC contacts the PWB and accordingly the downward movement is interrupted. Whether the standard PWB 350' has contacted the sucking end surface 92' is judged by an operator who uses an inspecting jig such as a clearance gauge. Alternatively, this may be done by operator's eyes which can narrowly see a light passing through a very small clearance left between the support surface 364' and the sucking surface 92'. A current driving amount of the drive motor 452 of the height-position adjusting device 360 (i.e., a current rotation angle of the motor 452 from an origin) in the state in which the support surface 364' is positioned at the reference position, is detected by the encoder 470, and is stored as a reference driving amount. The reference position of the support surface 364 may be determined using the standard suction nozzle 90' in place of a representative one of the plurality of suction nozzles 90 of the plurality of EC mounting units 30, alternatively may be determined as an average of respective reference positions which are determined, for each of the plurality of units 30, using the standard nozzle 90' in place of a representative one of the plurality of nozzles 90 of the each unit 30, or otherwise may be determined as an average of respective reference positions which are determined using the standard suction nozzle 90' in place of each of all the nozzles 90 employed in the EC mounting apparatus 8.

Then, the reference position of the support surface 364, the thickness, t, of the EC 94, and a compression amount, α, of the spring 100 are used to obtain, by calculation, a driving amount of the drive motor 452 that is needed to position the support surface 364 of the PWB 350 at the correct position. The thus obtained driving amount is stored in the RAM 556 of the computer 560. In the present embodiment, the compression amount α of the spring 100 is defined as being zero in a state in which the limit of advancement of the suction nozzle 90 caused by the biasing action of the spring 100 is defined by the previously-described advancement-limit defining device, and is measured as an amount of retraction of the nozzle 90 from the above-indicated state into the rotary holder 86. In a state in which the standard suction nozzle 90' holding a standard EC 94' is moved downward to, and positioned at, its downward-movement-end position, the position of the mounted surface 98' of the standard EC 94' is lower than its reference position by the thickness t of the standard EC 94', and similarly the position of the support surface 364' of the standard PWB 350' is also lower than its reference position by the thickness t of the standard EC 94'. The standard EC 94' is a correct EC having no manufacturing errors. In this state, the compression amount α of the spring 100 biasing the standard suction nozzle 90' is zero.

The compression amount α increases as the position of the support surface 364' changes upward from a position of the surface 364' when the amount α is zero. If the amount α is not greater than the thickness t of the EC 94, then the position of the surface 364' is not higher than the reference position; and if the amount α is greater than the thickness t of the EC 94, then the position of the surface 364' is higher than the reference position.

Therefore, the position of the support surface 364 is determined according to a pressing force with which the suction nozzle 90 needs to press the EC 94 against the surface 364. This pressing force which increases as the compression amount α of the spring 100 increases, is determined according to the sort of EC 94 or the sort of creamed solder with which the EC 94 is adhered to the surface 364. The pressing force is increased as the area through which the EC 94 and the creamed solder contact each other increases, or as the softness of the creamed solder decreases. Therefore, if the compression amount α of the spring 100 needed to produce the pressing force needed to mount the EC 94 is not greater than the thickness t of the EC 94, the correct position of the support surface 364 is lower than the reference position by (t−α); and if the same compression amount α is greater than the thickness t of the EC 94, the correct position of the surface 364 is higher than the reference position by (α−t). The correct position of the support surface 364 is the position where the EC 94 the mounted surface 88 of which is taking its correct position is mounted, and which is defined by the driving amount of the drive motor 452. The driving amount of the drive motor 452 that causes the support surface 364 to be positioned at its correct position is determined, for each sort of EC 94, based on a reference driving amount of the drive motor 452, the thickness t of the EC 94, and the compression amount α of the spring 100, and is stored in the RAM 556 of the computer 560.

Figure 18A:
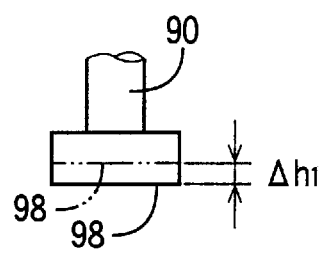
FIGS. 18A, 18B, 18C, and 18D are views for explaining a relationship between an axial-direction-positional error of the mounted surface of the EC held by each suction nozzle, and the adjustment of the height position of the support surface of the printed wiring board.
Figure 18C:
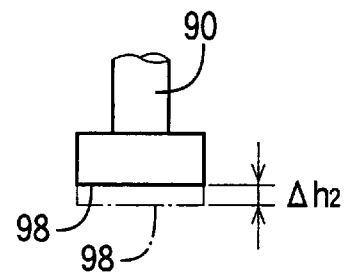
Figure 18B:
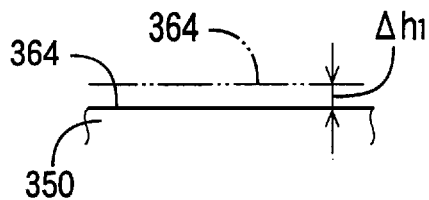
Figure 18D:
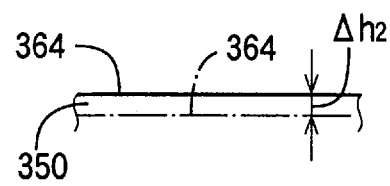

Then, if the axial-direction positional error of the mounted surface 98 determined based on the taken image indicates, as shown at two-dot-chain line in FIG. 18A, that the actual mounted surface 98 of the EC 94 is deviated upward from its correct position by an amount, Δh1, the position of the support surface 364 is modified, as shown in FIG. 18B, by being moved upward from its correct position by the amount Δh1. On the other hand, if the axial-direction positional error of the mounted surface indicates, as shown at one-dot-chain line in FIG. 18C, that the actual mounted surface 98 of the EC 94 is deviated downward from its correct position by an amount, Δh2, the position of the support surface 364 is modified, as shown in FIG. 18D, by being moved downward from its correct position by the amount Δh2. Thus, the driving amount of the drive motor 452 that causes the support surface 364 to be moved to its correct position is modified based on the magnitude and direction of the axial-direction positional error Δh1, Δh2, so that the support surface 364 is moved by the height-position adjusting device 360 to a position where the EC 94 is pressed against the surface 364 with the prescribed pressing force.

In the present embodiment, the support surface 364 is moved to the correct position as modified as described above, before the suction nozzle 90 is moved downward by a distance which causes the EC 94 to contact the surface 364 without compressing the spring 100. After the EC 94 contacts the support surface 364, the nozzle holder 74 is further moved downward, so that the suction nozzle 90 is moved back into the rotary holder 86 while compressing the spring 100. The axial-direction positional error of the mounted surface 98 includes all possible errors that cause the position of the surface 98 to be deviated from its correct position; such as the manufacturing errors of the nozzle 90, the positional errors of the EC 94 held by the nozzle 90, the wearing of the sucking end surface 92, and the dimensional errors of the EC 94. Since the position of the mounted surface 98 is obtained and the height position of the support surface 364 is modified, the EC 94 is contacted, in spite of the manufacturing errors of the nozzle 90, etc., with the support surface 364 at a position having only a small error from a correct position. That is, the EC 94 is contacted with the support surface 364, with a small impact only, after having been sufficiently decelerated. In addition, in the state in which the nozzle holder 74 has reached its downward-movement-end position, the EC 94 is pressed against the support surface 364 with a pressing force substantially equal to the prescribed pressing force. Moreover, the variation of respective amounts of pushing of ECs 94 into the creamed-solder spots applied to the support surface 364 is sufficiently small, and accordingly the ECs 94 are accurately mounted at the respective EC-mount places on the PWB 350.

When the EC mounting unit 30 mounts the EC 94 on the PWB 350, the switch valve 110 is switched to its positive-pressure-supply position during the downward movement of the unit 30, so that the suction nozzle 90 releases the EC 94. After the EC 94 is mounted, the unit 30 is moved to the next stop position by the rotation of the index table 20.

If the suction nozzle 90 is holding an EC 94 taking the lying-on-its-side posture, or an incorrect sort of EC 94, then the EC 94 is not mounted on the PWB 350. To this end, when the suction nozzle 90 holding the EC 94 is moved to the EC-mount position, the EC-mounting-unit elevating and lowering device 120 does not lower or elevate the EC mounting unit 30, by causing the roller 168 not to follow the cam 174. Thus, the unit 30 does not carry out an EC mounting action, and the switch valve 110 is kept at the negative-pressure-supply position, so that the nozzle 90 continues holding the EC 94. When the nozzle 90 is not holding an EC 94, too, the unit 30 does not carry out an EC mounting action.

When the EC mounting unit 30 which is holding the EC 94 that should be discarded, or which has failed to hold an EC 94, is moved to the EC-discard position, the switch valve 110 is switched to its positive-pressure-supply position by a switching device, not shown, so that the EC 94 is released and discarded into a collecting box, not shown.

When each suction nozzle 90 sucks and holds an EC 94 after an image of the each nozzle 90 and another EC 94 held thereby is taken, the driving amount of the second-slide-drive servomotor 208 is changed based on the wearing amount of the sucking end surface 92 in addition to the height-position error of the sucked surface 96 of the former EC 94, so that the target downward-movement-end position of the each nozzle 90 is changed. The wearing amount of the sucking end surface 92 of each suction nozzle 90 has been stored in the RAM 556 and, when a suction nozzle 90 sucks an EC 94, the wearing amount stored for the nozzle 90 is read out from the RAM 556 so as to be used to change the driving amount of the servomotor 208.

For example, in the case where there is only a certain amount of wearing of the sucking end surface 92 of each suction nozzle 90, the stroke of the nozzle 90 is increased by the wearing amount, and the driving amount of the servomotor 208 is so calculated that the reference target downward-movement-end position is changed to a new target position which is lower than the reference target position. The second slide 202 is moved based on the thus determined driving amount. In the case where the target downward-movement-end position is changed based on both the wearing amount of the sucking end surface 92 and the height-position error of the sucked surface 96 of the EC 94, the magnitude, and direction, of changing of the target position are determined based on the respective magnitudes, and respective directions, of the wearing amount and the height-position error, and the second slide 202 is moved to a position corresponding to the changed target position. As described previously, a wearing amount of the sucking end surface 92 of each suction nozzle 90 is detected each time the nozzle 90 has sucked and held a prescribed number of ECs 94. Therefore, the detected wearing amount is used to determine a target downward-movement-end position of the nozzle 90 for sucking and holding each of the prescribed number of ECs 94. Since the target downward-movement-end position of each suction nozzle 90, the speed of downward movement of the each nozzle 90, and the position where the deceleration of downward movement of the each nozzle 90 is started are changed based on not only the height-position error of the sucked surface 96 but also the wearing amount of the sucking end surface 92, the -frequency at which the each nozzle 90 fails to suck an EC 94 can be minimized.

It emerges from the foregoing description that in the present embodiment the EC-mounting-unit elevating and lowering device 118 provides a reception control device; the height-position adjusting device 360 provides a substrate elevating and lowering device; the EC-mounting-unit elevating and lowering device 120 provides a nozzle-holder elevating and lowering device, which cooperates with a portion of the computer 560 that controls the height-position adjusting device 360, to provide a mounting control device; a portion of the computer 560 that determines, based on the image data representing the image taken by the image-taking device 310, the respective axial-direction positions of the mounted surface 98 and the sucking end surface 92, provides an image processor; a portion of the computer 560 that controls, based on the axial-direction positional error of the mounted surface 98, the height-position adjusting device 360 to adjust the height position of the support surface 364 of the PWB 350, and a portion of the computer 560 that controls the second-slide-drive servomotor 208 to change the target downward-movement-end position of each suction nozzle 90 cooperate with each other to provide a control modifying device.

In addition, the levers 160, 166, the connecting device 218, the elevator member 148, the guide rail 46, the sleeve 70, and the nozzle holder 74 cooperate with one another to provide a connecting device which connects the roller 168 and each suction nozzle 90 to each other. The connecting device also functions as a motion converting device which converts the motion of the roller 168 into the upward and downward movements of the each nozzle 90. Moreover, a portion of the computer 560 that determines, based on the target downward-movement-end position of the each nozzle 90, the driving amount of the second-slide-drive servomotor 208 provides a movable-member-position determining means, which cooperates with the servomotor 208, the feed screw 206, and the nut 204 to provide a driving device 560, 208, 206, 204 which drives the second slide 202; the roller 198 and the engaging member 200 cooperate with each other to provide an engaging device 198, 200; the driving device and the engaging device cooperate with the second slide 202 to provide a moving device 560, 208, 206, 204, 198, 200, 202 which moves the first slide 190; a portion of the computer 560 that determines, based on the height-position of the sucked surface 96 of each EC 94, stored in the EC-height-position-detect position memory 580, the reference sucked-surface height position, and the wearing amount of the sucking end surface 92 of each suction nozzle 90, a target downward-movement-end position of the each nozzle 90 provides a control-data-depending determining means; the image-taking device 310, a portion of the computer 560 that determines, based on the image data representing the image taken by the device 310, the axial-direction-positional error of the sucking end surface 96, the EC-height-position detecting devices 284, and a portion of the computer 560 that determines, based on the height position detected by each device 284, the height-position error of the sucked surface 96 cooperate with one another to provide an error detecting device; a portion of the computer 560 that determines, based on the axial-direction-positional error of the sucking end surface 92 and the height-position error of the sucked surface 96, the target downward-movement-end position of each suction nozzle 90 provides a detected-error-depending determining means; and those determining means cooperate with the moving device 560, 208, 206, 204, 198, 200, 202, the lever 160, and the first slide 190 cooperate with one another to provide a downward-movement control device 560, 208, 206, 204, 198, 200, 202, 160, 190. The downward-movement control device also functions as a stroke-changing device 560, 208, 206, 204, 198, 200, 202, 160, 190. In the present embodiment, the nozzle revolving device 32 provides a transferring control device, also functions as a positioning device which positions each suction nozzle 90 at each of the EC-receive position and the EC-mount position, and also functions as a selecting device which selects one of the suction nozzles 90 that is to receive an EC 94 at the EC-receive position and mount the EC 94 at the EC-mount position.

In the present embodiment, the standard feeder 600 is used to determine the reference driving amount of the second-slide-drive servomotor 208. However, it is possible to employ a detecting device, such as a laser displacement sensor, to detect the height position of the tape-support surface 142 of the frame 139 of each feeder 123, or the height position of the bottom surface of the EC accommodating pocket 136 of the EC carrier tape 130, then determine the reference height position based on the thus determined height position, and finally determine the reference driving amount of the servomotor 208. If the height position of the tape-support surface 142 or the depth of the pocket 136 is obtained, it is possible to determine the height position of each EC 94 accommodated in the pocket 136 and determine, based on the thus determined height position, the reference driving amount of the servomotor 208. For example, an average of the respective height positions of the respective tape-support surfaces 142 of the respective frames 139 of the plurality of feeders 123 may be obtained as the height position of the tape-support surface 142. Similarly, an average of the respective depths of the respective pockets 136 of the respective EC carrier tapes 130 fed by the plurality of feeders 123 may be obtained as the depth of the pocket 136.

In the illustrated embodiment, the target downward-movement-end position, the deceleration-start position, and the downward-movement speed of the suction nozzle 90 are changed based on the axial-direction-positional errors of the sucking end surface 92 of the nozzle 90 and the height-position error of the sucked surface 96 of the EC 94. However, it is possible to employ a manner in which the target downward-movement-end position and the deceleration-start position of the nozzle 90 are changed but the downward-movement speed of the same 90 is not changed. This manner will be briefly described below by reference to FIG. 26.

Figure 26:
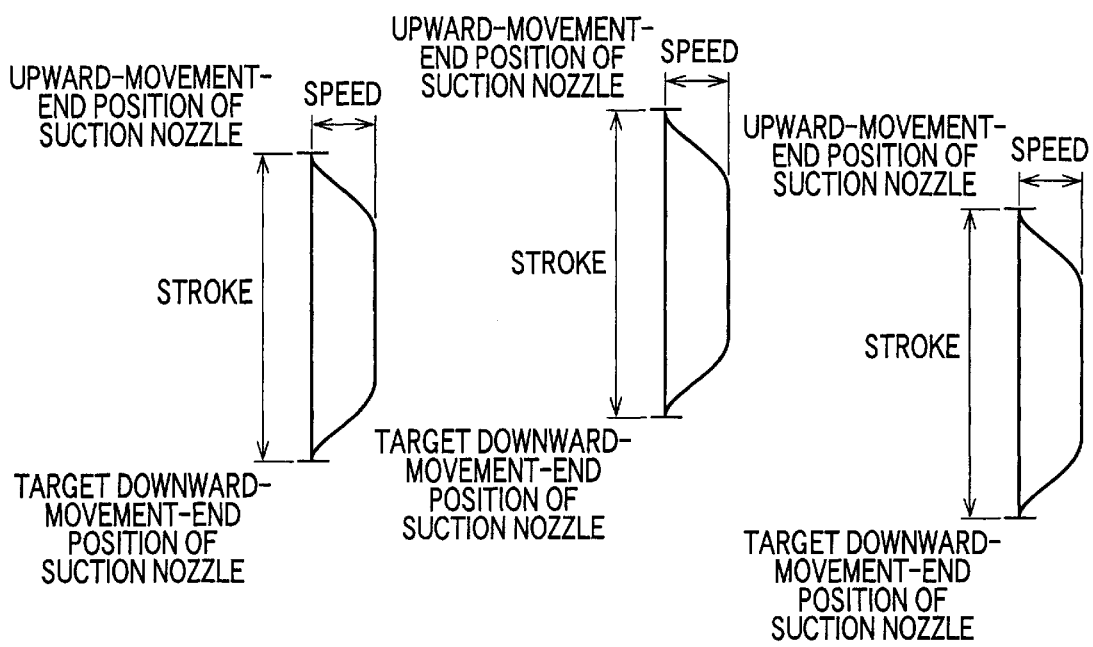
FIG. 26 is a view for explaining, in the case of another EC mounting apparatus as another embodiment of the present invention, a manner in which a target downward-movement-end position and a downward-movement-deceleration-start position of a suction nozzle are changed.

For example, the connecting device which connects each suction nozzle 90 to the roller 168, as the cam follower, of the EC-mounting-unit elevating and lowering device 118 is modified. For example, it is possible to employ a nozzle holder 74 including a rod 72 whose length is adjustable, and an adjusting device which adjusts the length of the rod 72 and thereby changes the position of the each nozzle 90 corresponding to the upward-movement-end position of the elevator member 148. Alternatively, it is possible to employ a sleeve 70 whose position relative to the guide rail 46 is adjustable, and an adjusting device which adjusts the position of the sleeve 70 and thereby changes the position of the each nozzle 90 corresponding to the upward-movement-end position of the elevator member 148. Otherwise, if it is allowed to change the upward-movement-end position of the elevator member 148, it is possible to employ a changing device which does not change the connection position where the connecting rod 156 is connected to the lever 160 which is pivoted by the cam device 178, and which automatically changes, based on the axial-direction-positional error of the sucking end surface 92, the distance between the above connection position and the position where the connecting rod 156 is connected to the elevator member 148. In this manner, the nozzle 90 is lowered or elevated, as illustrated in FIG. 26, such that the target downward-movement-end position and the deceleration-start position of the nozzle 90 are changed but the downward-movement speed of the same 90 is not changed.

In each of the illustrated embodiments, the EC supplying device 122 moves the feeders 123 and the circuit-substrate supporting device 404 moves the circuit substrate 350, whereas the EC mounting apparatus 8 is stationary. However, the present invention may be applied to an EC mounting system, as disclosed in Japanese Patent Document No. 10-163677, which includes an EC supplying device and a circuit-substrate supporting device both of which are stationary, and an EC mounting apparatus which is movable to mount an EC on a circuit substrate. This EC mounting system will be described below by reference to FIG. 27.

The present EC mounting system includes an EC mounting apparatus 950 including a nozzle revolving device 952 and an X-Y moving device 954 which moves the nozzle revolving device 952 to an arbitrary position on a horizontal plane parallel to a support surface of a PWB. The X-Y moving device 954 includes a Y table 956 which is movable in a Y-axis direction, and an X table 958 which is provided on the Y table 956 and is movable in an X-axis direction and on which the nozzle revolving device 952 is provided. The nozzle revolving device 952 includes an index table 960 which supports a plurality of EC mounting units 962 such that the units 962 are equiangularly spaced from each other about a vertical axis line of the table 960. When the index table 960 is rotated about its vertical axis line, the EC mounting units 962 are sequentially moved to, and stopped at, a plurality of stop positions. The EC mounting apparatus 950 is designed such that an EC is sucked and held, and mounted, at a common stop position, which will be referred to as the "EC-suck-and-mount position". An EC-mounting-unit elevating and lowering device is provided at a portion of the X table 958 that corresponds to the EC-suck-and-mount position, and elevates and lowers each of the EC mounting units 962 at the EC-suck-and-mount position.

The EC-mounting-unit elevating and lowering device has the same construction as that of the previously-described EC-mounting-unit elevating and lowering device 118, that is, shares a common drive source with the nozzle revolving device 952 and changes a target downward-movement-end position and a downward-movement-deceleration-start position of a suction nozzle as part of each EC mounting unit 962. The above-mentioned stop positions includes an EC-posture-detect position and a mounted-surface-detect position. Two image-taking devices which have the same constructions as those of the image-taking devices 300, 310, respectively, are provided at respective portions of the X table 958 that correspond to the EC-posture-detect position and a mounted-surface-detect position. Thus, the present EC mounting apparatus 950 may be obtained by mounting the EC mounting apparatus 8 employed in the prior embodiments, on the X-Y moving device 954, so that the apparatus 8 is movable to an arbitrary position on a horizontal plane.

When an EC is mounted on a PWB, the X-Y moving device 954 moves the index table 960 and the EC-mounting-unit elevating and lowering device toward an EC supplying device. As the index table 960 is rotated, the EC mounting units 962 are sequentially moved to the EC-suck-and-mount position, while being moved by the X-Y moving device 954 to appropriate ones of a plurality of feeders of the EC supplying device. Each of the EC mounting units 962 is lowered and elevated by the EC-mounting-unit elevating and lowering device to suck and hold an EC. After all the EC mounting units 962 have received respective ECs, the X-Y moving device 954 moves the index table 960 and the elevating and lowering device toward the PWB supported by a circuit,substrate supporting device. As the index table 960 is rotated, the EC mounting units 962 are sequentially moved to the EC- suck-and-mount position, while being moved by the X-Y moving device 954 to appropriate ones of a plurality of EC-mount places on the PWB. Each of the EC mounting units 962 is lowered and elevated by the EC-mounting-unit elevating and lowering device to mount the EC on the PWB.

When an EC is sucked and held by each suction nozzle, the target downward-movement-end position of the each nozzle is changed, like in the prior embodiments, based on a wearing amount of a sucking end surface of the each nozzle. When the EC is mounted on a PWB, the target downward-movement-end position of the each nozzle is changed, like in the prior embodiments, based on an axial-direction-positional error of a mounted surface of the EC. For example, first, a reference target downward-movement-end position of suction nozzle is determined using a standard suction nozzle and a standard PWB, then a correct target downward-movement-end position of each suction nozzle is determined, for each of ECs, based on the thus determined reference target position, a thickness of the each EC, and a compression amount of a spring associated with the each nozzle, and the thus determined correct target position is changed based on an axial-direction-positional error of the mounted surface of the each EC. Alternatively, a height position of a support surface of the PWB may be adjusted by elevating or lowering the PWB. In the present embodiment, the nozzle revolving device 952 rotates the index table 960 and thereby moves the suction nozzles in a direction intersecting respective axial directions thereof, so as to sequentially position the suction nozzles at the EC-suck-and-mount position, that is, functions as a selecting device which selects each of the suction nozzles so that the each nozzle sucks and mounts an EC at the EC-suck-and-mount position; and the X-Y moving device 904 provides an EC transferring device. It is possible to employ an EC-height-position detecting device which detects a height position of a sucked surface of an EC held by each of the feeders and which is movable relative to the EC supplying device. In the latter case, not only before an EC mounting operation is started, but also after the EC mounting operation is started, the EC-height-position detecting device is operated to detect a height position of a sucked surface of each of ECs, so that when each suction nozzle sucks an EC, the target downward-movement-end position of the each nozzle is changed based on a height-position error of the sucked surface of the EC.

Figure 27:
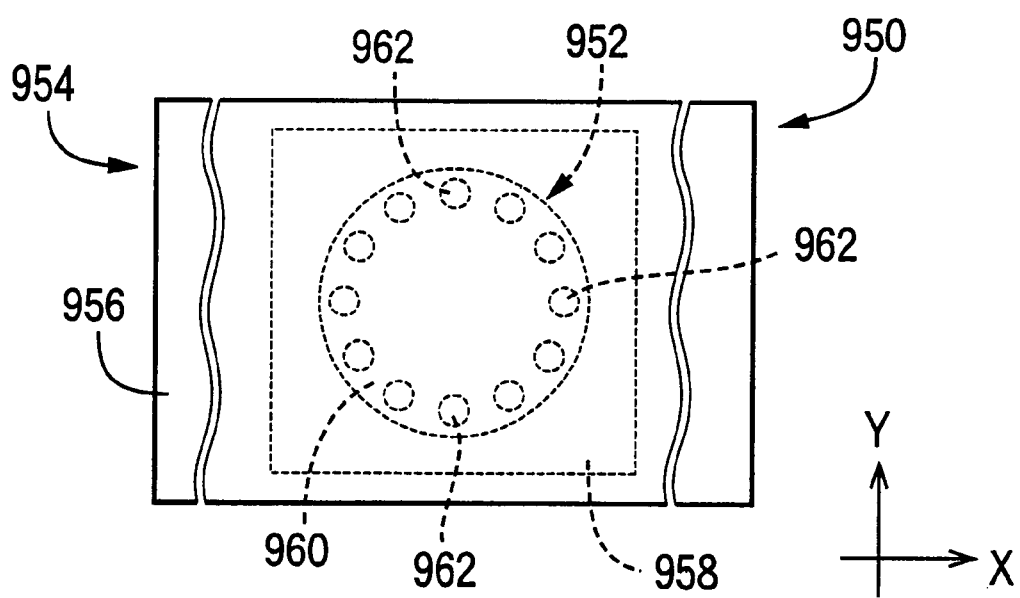
FIG. 27 is a schematic plan of another EC mounting apparatus as another embodiment of the present invention.

In the embodiment shown in FIG. 27, the EC mounting units 962 may not be revolved, but may be linearly moved, or pivoted, relative to the BC-mounting-unit elevating and lowering device, so that each of the EC mounting units is selected to suck and mount an EC. For example, a movable member is provided on the X table 958 such that the movable member is movable in the X-axis direction, and a plurality of EC mounting units are arranged, on the movable member, in the X-axis direction; and an EC-mounting-unit elevating and lowering device is also provided on the X table. In the latter case, the movement of the movable member causes each of the EC mounting units to be selected and moved to an EC-suck-and-mount position where the EC-mounting-unit elevating and lowering device is provided, so that the each unit sucks and mounts an EC. Alternatively, a single suction nozzle may be provided on the X table 958, and may be lowered and elevated by an elevating and lowering device. In those cases, the elevating and lowering device may share a drive source with an X-table moving device which moves the X table 958, or may include an exclusive drive source. In the embodiment shown in FIG. 27, the EC-mounting-unit elevating and lowering device may be one which includes an exclusive drive source.

The index table 960 may be one which is rotatable about an axis line which is inclined with respect to a plane perpendicular to the support surface of the circuit substrate that supports the ECs mounted thereon.

In each of the illustrated embodiments, the surface-image taking device 310 is used to take the image of each suction nozzle 90 and the EC 94 held thereby, as seen in the direction perpendicular to the axial direction of the each nozzle 90. However, the surface-image taking device 310 may be replaced with a line-image sensor as an image-taking device. A two-dimensional image can be obtained by iteratively taking respective linear images while moving at least one of the line-image sensor and each suction nozzle relative to each other in a direction having a component perpendicular to the axial direction of the each nozzle. This two-dimensional image may be one which includes the entirety of the lower end portion of the each nozzle, or the entirety of the EC held by the each nozzle. However, the two-dimensional image may be one which includes only a portion of the lower end portion of the each nozzle or a portion of the EC, or otherwise may even be replaced with a single linear image.

In each of the illustrated embodiments, respective axial-direction positions of the sucking end surface 92, 876 of each suction nozzle 90, 700, 866 and the mounted surface 98 of each EC 94, 714 are determined, and a thickness of the each EC is determined based on the thus determined axial-direction positions. Since the each EC is taken by the each nozzle from the EC supplying device 122, 710, 712, this thickness can be used to estimate a thickness of each of the ECs held by the EC supplying device. More specifically described, in many cases, if one of the ECs 94 of one EC carrier tape 130 has a thickness error, all the other ECs 94 also have the thickness error. Therefore, an average of respective thickness values of ECs 94 of each EC carrier tape 130 held by each feeder 123 can be regarded as an actual thickness value of each of the ECs 94, and accordingly an error of the average thickness value from a nominal thickness value can be regarded as a thickness error of the each EC 94. As described previously, the thickness of every EC 94 is determined based on the image taken at the mounted-surface-detect position. An average of the respective thickness values of the ECs 94 belonging to each EC carrier tape 130 is calculated each time each one of those ECs 94 is sucked and held by a suction nozzle 90, and is stored, in the RAM 556 of the computer 560, in association with a set of data identifying the feeder 123 which feeds the each carrier tape 130.

The above average may be obtained as an average of respective thickness values of a plurality of successive ECs 94 of each EC carrier tape 130 that are successively determined and stored in the RAM 556. Alternatively, the above average may be obtained using a digital filter. The digital filter outputs the average as a value obtained as the sum of the first product of a last obtained thickness and a first coefficient and the second product of a past thickness and a second coefficient. The thus obtained value will be used as a past thickness when another thickness is determined. The first and second coefficients are positive values the sum of which is equal to one. One of the two coefficients that is taken more important is made greater than the other coefficient. For each of a plurality of EC carrier tapes 130, an average of respective thickness values of ECs 94 of the each tape 130 is calculated and stored each time one of the ECs 94 is taken out from the each tape 130. This is true with each bulk-type feeder 123.

In the embodiment shown in FIGS. 1 to 25, when an EC 94 is mounted on a PWB 350, the PWB 350 can be elevated or lowered and the height position of the support surface 364 thereof can be adjusted, so that the EC 94 can be mounted on the PWB 350 with an appropriate pressing force even if a prescribed pressing force to be applied to the EC 94 may be changed or the axial-direction position of the mounted surface 98 thereof may have an error. However, to this end, the target downward-movement-end position of each suction nozzle 90 may be changed in the same manner as that employed for sucking and holding each EC 94. In the latter case, for example, the EC-mounting-unit elevating and lowering device 120 may be so modified as to have the same construction as that of the EC-mounting-unit elevating and lowering device 118, a reference driving amount of the second-slide-drive servomotor 208 is determined using a standard suction nozzle and a standard PWB, and a correct driving amount of the servomotor 208 is determined based on the thus determined reference driving amount, the thickness of the EC 94, and the pressing force to be applied to the EC 94 (i.e., the compression amount of the spring 100). The thus determined correcting driving amount is changed based on the axial-direction-positional error of the mounted surface 98, so that the target downward-movement-end position of the each nozzle 90 is automatically changed.

In the embodiment shown in FIGS. 1 to 25, the respective lengths of the different sorts of suction nozzles 90 are equal to each other. However, those lengths may differ from each other. If each of the EC-mounting-unit elevating and lowering devices 118, 120, i.e., each nozzle elevating and lowering device has the function of changing the target downward-movement-end position of each nozzle 90, then it can change the target position of the each nozzle 90, depending upon the length thereof, so that the each nozzle 90 may contact an EC 94 at a downward-movement speed equal to zero and with a pressing force equal to zero, or that the each nozzle 90 may mount the EC 94 on a PWB with an appropriate pressing force. Alternatively, the EC supplying device 122 or the wiring-board supporting device 404 may be elevated or lowered depending upon the length of the each nozzle 90.

In the embodiment shown in FIGS. 1 to 25, the nozzle elevating and lowering device 118 includes the cam device 178, and changes the same motion of the cam follower 168 into an arbitrary one of different strokes of upward and downward movements. The nozzle elevating and lowering device 118 may be so modified as to have the function of changing the upward-movement-end position of each suction nozzle 90.

However, it is not essentially required to change the downward-movement-end position of each suction nozzle 90. That is, it is possible to change only the position where the deceleration of downward movement of the each nozzle is started. In the latter case, even if an EC 94 may have an excessive thickness and accordingly an actual distance between the each nozzle and the sucked surface 96 of the EC may be shorter than a correct distance, the downward-movement-deceleration-start position can be changed to a higher position, so that the each nozzle may contact the EC at a downward-movement speed substantially equal to zero, like when the each nozzle contacts an EC having a correct thickness.

The EC supplying device 122 may be elevated and lowered by an elevating and lowering device so that even if there may be an error with the axial-direction position of the sucking end surface 92 of a suction nozzle 90 or the height position of the sucked surface 96 of an EC 94, the suction nozzle 90 may contact the EC 94 at a downward-movement speed equal to zero and with a pressing force equal to zero, and suck and hold it. For example, the table 125 to which the feeders 123 are attached may be elevated and lowered by an elevating and lowering device so that the position of the upper surface of an EC 94 may be changed according to the axial-direction-positional error or the like.

In each of the illustrated embodiments, the wearing and bending of the sucking end surface 92 of each suction nozzle 90 are detected each time the each nozzle has mounted a prescribed number of ECs 94. However, they may be detected each time a prescribed time has elapsed. Respective times may be prescribed for respective suction nozzles, or alternatively a single prescribed time may be used for a plurality of suction nozzles. In the second case, a single time may be used for the plurality of suction nozzles 90 of each EC mounting unit 30, or for all the suction nozzles 90 of the EC mounting apparatus 8.

In each of the illustrated embodiments, each tape-type feeder 123 feeds the emboss-type EC carrier tape 130. However, each tape-type feeder may feed an EC carrier tape which includes (a) an EC accommodating tape having a constant thickness in its widthwise direction, having a plurality of EC accommodating pockets at regular intervals of distance, and carrying a plurality of ECs respectively accommodated in the pockets, and (b) a cover tape closing respective openings of the EC accommodating pockets. In this case, in a state in which a main frame of the feeder supports a widthwise entirety of a lower surface of the EC accommodating tape, the feeder feeds the EC carrier tape. Each bulk-type feeder 123 may employ an EC conveying device which conveys each EC by utilizing air flow, or inclination of an EC-support surface, other than the conveying belt, or combination of two or all of the air flow, the inclination and the belt.

In each of the illustrated embodiments, the respective height positions of the respective sucked surfaces 96 of the ECs 94 fed by the feeders 123 are equal to one another, among the different sorts of the ECs 94 and the different types of the feeders 123 (i.e., the tape-type feeders 123 and the bulk-type feeders 123). However, those height positions may differ from one another. In the latter case, for example, in the case where a plurality of tape-type feeders feed respective EC carrier tapes each including an EC accommodating tape having a constant thickness in its widthwise direction, in a state in which a main frame of each of the feeders supports a widthwise entirety of a lower surface of the EC accommodating tape, respective height positions of respective lower surfaces of a plurality of ECs 94 are equal to each another, if respective height positions of respective tape-support surfaces of the feeders are equal to each other; but the height positions of the lower surfaces of the ECs 94 are not equal to each other if respective thickness values of the ECs 94 are not equal to each other. In the last case, the height position of one or more tape-support surfaces may be defined as a reference height position, a height position of an upper surface of each EC may be determined based on the reference height position, and a nominal dimension (i.e., a thickness) of the each EC 94 pre-stored in the RAM 556, and the upward and downward movements of each suction nozzle 90 may be controlled based on the thus determined height position. The reference height position of tape-support surface may be determined using a standard feeder, or may be determined as an average of respective detected height positions of the respective tape-support surfaces of two or more feeders. The height position of the upper surface of each EC 94 may be determined based on the reference height position of tape-support surface and a thickness of the each EC 94 that is determined based on a taken image thereof. Otherwise, a standard feeder whose upper surface has a height position equal to an average of different height positions of respective upper surfaces of a plurality of sorts of ECs may be employed so that a reference height position as the height position of the upper surface of the standard feeder and an actual height position of an upper surface of each EC 94 that is detected by the EC-height-position detecting device 284 may be used to determine a difference between the two height positions and control, based on the thus determined difference, the upward and downward movements of each suction nozzle 90.

In each of the illustrated embodiments, a dimensional error which may cause a failure to hold an EC 94 or a failure to mount an EC 94 is detected. More specifically described, during, or before, an EC mounting operation of the EC mounting apparatus 8, a height position of the sucked surface 96 of each EC 94 is detected by the EC-height-position detecting device 284 and, during the EC mounting operation, an axial-direction position of the sucking end surface 92 of each suction nozzle 90 is automatically detected. However, the dimensional error which may cause the failure to hold or mount EC 94 may be detected using a detecting device by an operator, and stored in the RAM 556 in advance. For example, a length of each suction nozzle 90, a thickness of each EC 94, a depth of each EC accommodating pocket 136 of each EC carrier tape 130, or a height position of an upper surface of each feeder 123 may be measured and stored in the RAM 556, and additionally respective standard values are stored in the same 556, so that the measured values and the standard values may be used to change the target downward-movement-end position of each suction nozzle 90. In the case where a difference between different nominal dimensions causes a failure to hold or mount an EC 94, it is preferred that those nominal dimensions be stored in the RAM 556 in advance. For example, if the EC supplying device 122 supplies ECs 94 such that respective height positions of respective lower surfaces of the ECs 94 are equal to one another, different thickness values of different sorts of ECs 94 produces a difference between respective height positions of respective upper surfaces of the ECs 94. In this case, therefore, respective nominal thickness values of the different sorts of ECs 94 are stored in the RAM 556 in advance.

In addition, a height position of the support surface 364 of the PWB 350 being moved to, and positioned at, the EC-mount height position my be detected, and the thus detected height position and a standard height position may be stored with each other in the RAM 556, so that when each EC 94 is mounted on the PWB 350, the target downward-movement-end position of each suction nozzle 90 may be changed based on an error of the height position of the support surface 364 and an error of the axial-direction position of the mounted surface 98 of the EC 94 held by the each nozzle 90. For each PWB 350, a height position of a predetermined portion of the support surface 364 of the PWB 350 may be detected, or a height position of each of all EC-mount places on the support surface 364 of the PWB 350 may be detected.

In the embodiment shown in FIGS. 1 to 25, the height-position adjusting device 360 adjusts the height position of the PWB 350 by moving the rollers 416 relative to the inclined surfaces 442 of the wedge blocks 440 in the X-axis direction and thereby elevating or lowering the wiring-board supporting device 404. However, the height-position adjusting device 360 may be replaced with a circuit-substrate elevating and lowering device including at least one feed screw, at least one nut, and at least one drive motor which is provided by, e.g., a servomotor. In this case, on a Y table of an X-Y table that is movable in a Y-axis direction on an X table of the X-Y table, three or four feed screws are provided such that the feed screws are parallel to one another in a vertical direction (i.e., a Z-axis direction), each of the feed screws is rotatable relative to the Y table, and is not movable in an axial direction of the each screw. Three or four nuts which are fixed to a substrate-support member are threadedly engaged with the three or four feed screws, respectively. When the feed screws are rotated by the drive motor, the substrate-support member is elevated and lowered. Two or more, or all, of the feed screws may be driven by a common drive motor, or the feed screws may be driven by respective exclusive drive motors. In the case where a plurality of drive motors are employed, those motors are operated in synchronism with each other. The circuit-substrate elevating and lowering device elevates and lowers a circuit-substrate supporting device including the substrate-support member, thereby not only moving a circuit substrate to a substrate-transfer height position and an EC-mount height position, but also adjusting a height position of a support surface of the circuit substrate when an EC is mounted on the support surface. A height-position adjusting device may be employed to only adjust a height position of a support surface of a circuit substrate when an EC is mounted on the support surface.

In each of the illustrated embodiments, the EC supplying device 122 may be replaced with one which stores ECs on palettes and supplies the ECs from the palettes. Each of the palettes has a plurality of EC accommodating pockets which open upward, and stores a single EC in each of the pockets. In this case, the target downward-movement-end position of each suction nozzle 90 may be changed by first defining an upper surface of an appropriate one of the palettes as a reference surface, or preparing a reference palette, then determining a reference target downward-movement-end position of the each nozzle using the reference surface or palette, and changing the thus determined reference target downward-movement-end position based on a wearing amount of a sucking end surface 92 of the each nozzle, a height-position error of a sucked surface of an EC 94, and so on.

In each of the illustrated embodiments, the target downward-movement-end position of each suction nozzle 90 for sucking and holding an EC 94 is so determined that when the nozzle holder 74 reaches, and stops at, its downward-movement-end position, the each nozzle just contacts the EC at a downward-movement speed equal to zero and with a pressing force equal to zero, and thereby sucks and holds the EC. However, the each nozzle may be so controlled as to suck and hold an EC while applying a substantial pressing force thereto, or may suck and hold an EC by applying suction to the EC from a position away from the EC. In the first case, the target downward-movement-end position of the each nozzle is so determined as to be lower than a position where the each nozzle will contact the EC, so that after the nozzle contacts the EC, the nozzle holder is further lowered while the nozzle is retracted into the holder and a spring associated with the nozzle is compressed, and accordingly a pressing force is applied to the EC. A constant pressing force may be applied to each of different sorts of ECs, or different pressing forces may be applied to different sorts of ECs, respectively. The compression amount of the spring is determined based on a pressing force to be applied to the EC, and the target downward-movement-end position of the each nozzle is determined based on the thus determined compression amount. In the second case, the target downward-movement-end position of the each nozzle is so determined as to be a position where the each nozzle will not contact the EC but the distance between the nozzle and the EC allows the nozzle to apply suction to the EC and thereby holds the same. In view of a need to reliably suck and hold an EC, it is preferred that each suction nozzle suck and hold the EC while applying a pressing force thereto. Even in the case where it is intended that when the nozzle holder reaches, and stops at, its downward-movement-end position, each suction nozzle just contacts an EC and thereby holds the same, the target downward-movement-end position of the each nozzle may be so biased, in view of various errors, toward a side on which the each nozzle sucks and holds the EC while applying some pressing force thereto.

In each of the illustrated embodiments, it is assumed for easier understanding purposes only that each suction nozzle 90 is accurately produced and the manufacturing errors of the each nozzle are negligible. On this assumption, the wearing amount of the sucking end surface of the each nozzle is determined based on a determined axial-direction position of the sucking end surface, and the target downward-movement-end position of the each nozzle is changed based on the thus determined wearing amount. However, the manufacturing errors of the each nozzle may be determined based on the axial-direction position of the sucking end surface, other than the wearing amount, and the target downward-movement-end position of the each nozzle may be changed based on the thus determined manufacturing errors.

The nozzle holder 74 may be so modified as to hold a single suction nozzle 90 only.

The EC mounting apparatus 8 employs the elevating and lowering device 118 including the downward-movement control device which includes the lever 160, the first movable member 190, and the movable-member moving device 560, 208, 2, 204, 198, 200, 202 and which changes, during the EC mounting operation, at least one of the downward-movement-end position and the downward-movement-deceleration-start position of each suction nozzle 90. This arrangement is also applicable to the EC mounting apparatus, disclosed in the previously-identified Japanese Patent Document No. 7-9381, in which an elevator member which elevates and lowers a nozzle holder is separated from the nozzle holder at a certain timing during the upward and downward movements of the elevator member and accordingly the nozzle holder does not receive all of the motion of the elevator member.

The present invention is applicable to an apparatus and a method for mounting, or treating, heterogeneous ECs including transistors and resistors.

It is to be understood that the present invention may be embodied with various other changes, modifications, and improvements, such as those described in SUMMARY OF THE INVENTION, which may occur to a person skilled in the art without departing from the spirit and scope of the invention defined in the appended claims.

What is claimed is:

1. An apparatus for mounting at least one electric component supplied by an electric-component supplying device, on a circuit substrate supported by a circuit-substrate supporting device, the apparatus comprising:
    a nozzle moving device which moves a suction nozzle having an end surface that applies a suction to the electric component and thereby holds the component, in a direction intersecting an axis line of the suction nozzle;
    an elevating and lowering device which elevates and lowers the suction nozzle so that the suction nozzle performs at least one of receiving the electric component from the electric-component supplying device and mounting the component on the circuit substrate on the circuit-substrate supporting device;
    the elevating and lowering device comprising a movable member, and a connecting device which connects the movable member to the suction nozzle such that the suction nozzle continues moving while the movable member continues moving; and
    the connecting device comprising a downward-movement control device which changes, while the apparatus performs an electric-component mounting operation, at least one of a position of an end of a downward movement of the suction nozzle caused by the elevating and lowering device and a position where a deceleration of the downward movement of the nozzle is started.

2. The apparatus according to claim 1, wherein the nozzle moving device stops the suction nozzle at a prescribed position, and wherein the elevating and lowering device is provided in a vicinity of the prescribed position and lowers, at at least the prescribed position, the suction nozzle to the position of the end of the downward movement thereof.

3. The apparatus according to claim 2, wherein the nozzle moving device comprises a nozzle revolving device which revolves the suction nozzle about an axis line of revolution and stops the nozzle at a prescribed stop position on a locus of revolution thereof.

4. The apparatus according to claim 1, further comprising a common drive source which commonly drives the nozzle moving device and the elevating and lowering device.

5. The apparatus according to claim 1, wherein the downward-movement control device comprises a stroke changing device which changes the movement of the movable member into an arbitrary one of a plurality of different strokes of the downward movement of the suction nozzle.

6. The apparatus according to claim 5, wherein the stroke changing device changes the position of the end of the downward movement of the suction nozzle, while not changing a position of an end of an upward movement of the nozzle.

7. The apparatus according to claim 1, wherein the elevating and lowering device comprises a cam device which includes a rotary cam which is rotated by a drive source, and a cam follower which is engaged with the rotary cam.

8. The apparatus according to claim 7, wherein the movable member comprises the cam follower, and wherein the downward-movement control device comprises a stroke changing device which changes the movement of the cam follower into an arbitrary one of a plurality of different strokes of the downward movement of the suction nozzle.

9. The apparatus according to claim 1, wherein
    the nozzle moving device comprises a nozzle revolving device which revolves, about an axis line of revolution, the suction nozzle transfers the component in said direction intersecting the axis line of the suction nozzle; and
    the apparatus further comprises a common drive source which commonly drives the nozzle revolving device and the elevating and lowering device.

10. The apparatus according to claim 1, further comprising an elevator member which is connected to the suction nozzle, and wherein the downward-movement control device comprises:
    a lever which is pivotable about an axis line and has an arm;
    a first movable member which is supported by the arm of the lever such that the first movable member is movable relative to the arm in a lengthwise direction of the arm, the first movable member being connected to the elevator member; and
    a first-movable-member moving device which moves the first movable member in the lengthwise direction of the arm.

11. The apparatus according to claim 10, wherein the first-movable-member moving device comprises:
    a second-movable-member guide which is substantially parallel to the lengthwise direction of the arm of the lever;
    a second movable member which is movable along the second-movable-member guide;
    a second-movable-member drive device which moves the second movable member along the second-movable-member guide; and
    an engaging device which includes a first engaging portion which is provided by at least a portion of the first movable member, and a second engaging portion which is provided by at least a portion of the second movable member, the first and second engaging portions having respective shapes which transmit a movement of the second movable member along the second-movable-member guide to the first movable member and allow a movement of the first movable member caused by a pivotal motion of the lever.

12. The apparatus according to claim 11, further comprising a connecting rod which is pivotally connected, at one of opposite end portions thereof, to the first movable member and is pivotally connected, at the other end portion thereof, to the elevator member, and thereby connects the first movable member and the elevator member to each other.

13. The apparatus according to claim 12, wherein the downward-movement control device further comprises a first-movable-member guide which is curved along an arc whose center is located on an axis line about which the other end portion of the connecting rod is pivoted relative to the elevator member being positioned at a position of an end of an upward movement thereof caused by the elevating and lowering device.

14. The apparatus according to claim 13, wherein the second-movable-member guide extends along a straight line, and wherein the second-movable-member drive device comprises a position determining means for determining, based on a target downward-movement-end position of the suction nozzle, a position of the second movable member.

15. The apparatus according to claim 1, wherein the downward-movement control device comprises:

a memory which stores control data; and a control-data-depending determining means for determining, based on the control data stored in the memory, said at least one of the position of the end of the downward movement of the suction nozzle and the position where the deceleration of the downward movement of the nozzle is started.

16. The apparatus according to claim 1, wherein the downward-movement control device comprises:

an error detecting device which detects at least one of (a) an error of a position of an end surface of the suction nozzle that applies the suction, (b) an error of a position of an upper surface of the electric component supported by a component-supply portion of the electric-component supplying device, (c) an error of a position of a mounted surface of the electric component held by the suction nozzle that is to be mounted on the circuit substrate supported by the circuit-substrate supporting device, and (d) an error of a position of a support surface of the circuit substrate that is to support the electric component mounted thereon; and a detected-error-depending determining means for determining, based on the error detected by the error detecting device, said at least one of the position of the end of the downward movement of the suction nozzle and the position where the deceleration of the downward movement of the nozzle is started.

17. The apparatus according to claim 1, wherein the elevating and lowering device performs each one downward movement and each one upward movement of the suction nozzle, in a predetermined time duration, irrespective of whether the downward movement control device changes said at least one of the portion of the end downward movement of the suction nozzle and the position where the deceleration of the downward movement of the nozzle is started.

18. The apparatus according to claim 17, wherein the elevating and lowering device comprises a cam device which includes a rotary cam which is rotated by a drive source, and a cam follower which is engaged with the rotary cam, the movable member comprises the cam follower, and the elevating and lowering device performs said each one downward movement and said each one upward movement of the suction nozzle in said predetermined time duration corresponding to each one full rotation of the rotary cam.

19. An apparatus for mounting at least one electric component supplied by an electric-component supplying device, on a circuit substrate supported by a circuit-substrate supporting device, the apparatus comprising:

a nozzle moving device which moves a suction nozzle having an end surface that applies a suction to the electric component and thereby holds the component, in a direction intersecting an axis line of the suction nozzle;

an elevating and lowering device which elevates and lowers the suction nozzle so that the suction nozzle performs at least one of receiving the electric component from the electric-component supplying device and mounting the component on the circuit substrate on the circuit-substrate supporting device;

an elevator member which is connected to the suction nozzle;

a downward-movement control device which changes, while the apparatus performs an electric-component mounting operation, at least one of a position of an end of a downward movement of the suction nozzle caused by the elevating and lowering device and a position where a deceleration of the downward movement of the nozzle is started; and the downward-movement control device comprising a lever which is pivotable about an axis line and has an arm;

a first movable member which is supported by the arm of the lever such that the first movable member is movable relative to the arm in a lengthwise direction of the arm, the first movable member being connected to the elevator member; and a first-movable-member moving device which moves the first movable member in the lengthwise direction of the arm.

* * * * *